(12) United States Patent
Yoneda et al.

(10) Patent No.: US 9,755,119 B2
(45) Date of Patent: Sep. 5, 2017

(54) LIGHT EMITTING DEVICE AND METHOD OF MANUFACTURING LIGHT EMITTING DEVICE

(71) Applicant: NICHIA CORPORATION, Anan-shi (JP)

(72) Inventors: Akinori Yoneda, Anan (JP); Shinji Nakamura, Tokushima (JP); Yoshiyuki Aihara, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/599,068

(22) Filed: Jan. 16, 2015

(65) Prior Publication Data
US 2015/0207042 A1 Jul. 23, 2015

(30) Foreign Application Priority Data

Jan. 17, 2014 (JP) ................................. 2014-006877

(51) Int. Cl.
*H01L 33/50* (2010.01)
*H01L 33/52* (2010.01)
(Continued)

(52) U.S. Cl.
CPC ............. *H01L 33/52* (2013.01); *H01L 33/38* (2013.01); *H01L 33/505* (2013.01); *H01L 33/507* (2013.01); *H01L 33/54* (2013.01); *H01L 24/45* (2013.01); *H01L 33/0095* (2013.01); *H01L 33/62* (2013.01); *H01L 2224/45015* (2013.01);
(Continued)

(58) Field of Classification Search
CPC ............. H01L 33/50; H01L 2933/0033; H01L 2933/0041; H01L 33/52; H01L 33/38; H01L 33/507; H01L 33/505; H01L 33/54; H01L 33/62
See application file for complete search history.

(56) References Cited

U.S. PATENT DOCUMENTS

2003/0214233 A1* 11/2003 Takahashi ............. H01L 33/508
313/512
2007/0158669 A1 7/2007 Lee et al.
(Continued)

FOREIGN PATENT DOCUMENTS

JP 3589187 B2 8/2004
JP 2008-198807 A 8/2008
(Continued)

*Primary Examiner* — Ermias Woldegeorgis
(74) *Attorney, Agent, or Firm* — Foley & Lardner LLP

(57) ABSTRACT

A method of manufacturing a light emitting device includes preparing wafer with a plurality of light emitting elements arrayed on a growth substrate, on a first side of a semiconductor stacked layer body, forming a resin layer which includes metal wires respectively connected to a p-side electrode and an n-side electrode, forming a groove by removing at least portion of the resin layer from an upper surface side in a boundary region between the light emitting elements and exposing end surfaces of metal wires which are internal conductive members on an inner side surface defining a groove, forming electrodes for external connection respectively connecting to exposed end surfaces of metal wires, and singulating the wafer into a plurality of singulated light emitting elements.

20 Claims, 40 Drawing Sheets

(51) Int. Cl.
  *H01L 33/54*   (2010.01)
  *H01L 33/38*   (2010.01)
  *H01L 33/00*   (2010.01)
  *H01L 33/62*   (2010.01)
  *H01L 23/00*   (2006.01)

(52) U.S. Cl.
  CPC ............ *H01L 2224/45124* (2013.01); *H01L 2224/45139* (2013.01); *H01L 2224/45144* (2013.01); *H01L 2224/45147* (2013.01); *H01L 2224/4903* (2013.01); *H01L 2224/49107* (2013.01); *H01L 2924/181* (2013.01); *H01L 2933/005* (2013.01); *H01L 2933/0033* (2013.01); *H01L 2933/0066* (2013.01)

(56) References Cited

U.S. PATENT DOCUMENTS

| | | |
|---|---|---|
| 2008/0191327 A1 | 8/2008 | Asakawa et al. |
| 2010/0109040 A1 | 5/2010 | Lee et al. |
| 2010/0112735 A1 | 5/2010 | Lee et al. |
| 2010/0140640 A1 | 6/2010 | Shimokawa et al. |
| 2010/0148198 A1 | 6/2010 | Sugizaki et al. |
| 2010/0289051 A1 | 11/2010 | Lee et al. |
| 2012/0068208 A1* | 3/2012 | Tseng .................. H01L 33/505 257/98 |
| 2012/0097972 A1 | 4/2012 | Sugizaki et al. |
| 2013/0299864 A1 | 11/2013 | Sugizaki et al. |
| 2013/0313589 A1 | 11/2013 | Tomizawa et al. |
| 2014/0008688 A1 | 1/2014 | Shimokawa et al. |
| 2015/0001571 A1 | 1/2015 | Shimokawa et al. |

FOREIGN PATENT DOCUMENTS

| | | |
|---|---|---|
| JP | 4214704 B2 | 11/2008 |
| JP | 2010-135693 A | 6/2010 |
| JP | 2010-141176 A | 6/2010 |
| JP | 4791381 B2 | 7/2011 |
| JP | 4926787 B2 | 2/2012 |
| JP | 2012-146898 A | 8/2012 |
| JP | 2014-003283 A | 1/2014 |
| JP | 5462078 B2 | 1/2014 |

* cited by examiner

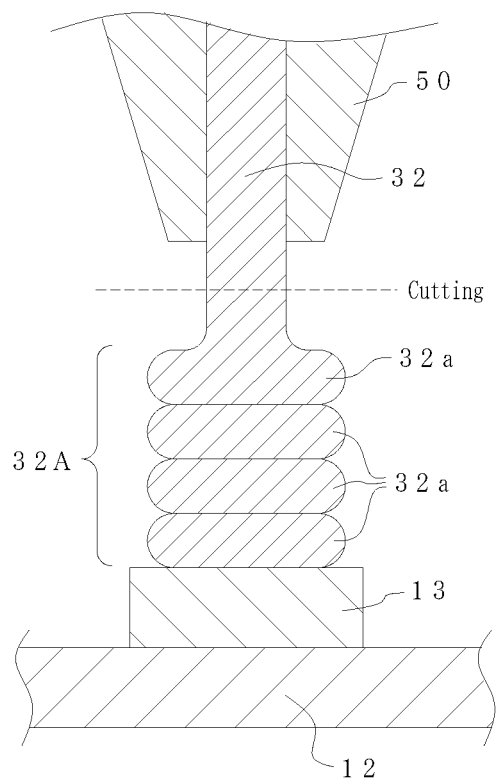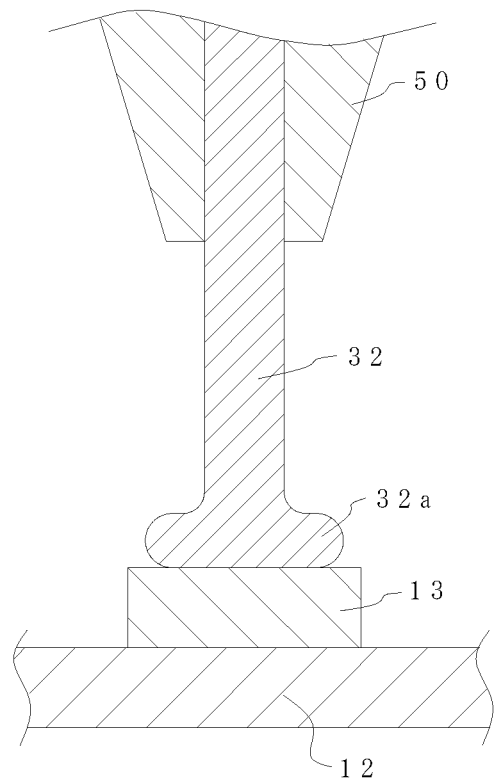

LIGHT EMITTING DEVICE AND METHOD OF MANUFACTURING LIGHT EMITTING DEVICE

CROSS-REFERENCE TO RELATED APPLICATION

This application claims priority to Japanese Patent Application No. 2014-006877 filed on Jan. 17, 2014, the entire disclosure of which is hereby incorporated herein by reference.

BACKGROUND

Technical Field

The present invention relates to a light emitting device having a semiconductor light emitting element and a resin layer having an internal conductive member.

Description of Related Art

Light emitting devices having semiconductor chips (light emitting elements) such as light emitting diodes can facilitate miniaturization and obtain high luminous efficiency, which allows for their use in wide range of applications. For example, a light emitting device suitable for the backlight of a liquid crystal display such as a mobile phone is described in JP 2008-198807A. The light emitting device described in JP 2008-198807A is constituted with a light emitting element, lead frames to which the light emitting element is electrically connected, and a package made of a resin. An opening is defined in the front surface and exposing portions of the lead frames on its lower surface. The package is joined with a mounting substrate via the portions of the lead frames.

As described in JP2008-198807A, in a configuration where a face-up type light emitting element is mounted on a lead frame or the like and the light emitting element and the lead frame are connected with a bonding wire or the like, as seen perpendicularly to the upper surface, a part of the bonding wire is needed to be outside of the outer periphery of the light emitting element, which limits the downsizing. Also, packaging with the use of a lead frame itself imposes a limitation on downsizing of the light emitting device.

On the other hand, in the face-down type (which typically employs a flip-chip configuration), the pad electrode disposed on the light emitting element and the wiring disposed on the mounting substrate can be electrically connected with the use of a connecting means such as a bump or a metal pillar which is located inside the outer periphery of the light emitting element in a plan view seen from a vertical direction to the surface of the mounting substrate. With this configuration, CSP (Chip Size Package or Chip Scale Package) can be realized, in which the light emitting device (particularly the dimensions in a plan view seen from a vertical direction to the mounting surface of the mounting substrate) can be downsized to a degree that is close to the size of the light emitting element chip. Recently, in order to facilitate further downsizing or to obtain a further increase in the luminous efficiency, the light emitting devices of face-down type have been used, in which the growth substrate such as a light-transmissive substrate, an example being a sapphire substrate, has been removed, or the thickness of the growth substrate has been reduced.

The growth substrate is used to allow growing of an n-type semiconductor layer and a p-type semiconductor layer, which are constituent components of a light emitting element on its surface, and the growth substrate also has a function of improving the strength of the light emitting device by supporting the light emitting element, which has a small thickness and low mechanical strength. Thus, in a light emitting device in which after forming the light emitting element, the growth substrate is removed or the thickness of the growth substrate is reduced, for example, as shown in JP 2010-141176A, a resin layer is provided at the electrode side (a side facing the mounting substrate) to support the light emitting element, and a metal pillar which penetrates the resin layer is formed, and through the metal pillar, the electrode of the light emitting element and the wiring (wiring layer) disposed on the mounting substrate are electrically connected. With such a resin layer which contains such a metal pillar, the light emitting device can be secured with sufficient strength. Also, CSP is suitable for manufacturing on a wafer level (WCSP) where a plurality of packages are produced collectively on a wafer, which thus facilitates downsizing and enhances productivity.

There are two types of configurations for the light emitting devices used for backlight light source of liquid crystal displays or the like: a top-view type in which the mounting surface of the light emitting device is substantially in parallel to the incident surface of the light guide plate, and a side-view type in which the mounting surface is substantially perpendicular to the incident surface of the light guide plate.

In the case where CSPs are fabricated in a wafer level as in the light emitting device described in JP 2010-141176A, electrodes for external connection are disposed via a resin layer on the back-surface side of the light emitting element, which produce a top-view type of light emitting devices. On the other hand, a side-view type light emitting device can be produced, for example, as described in JP 2008-198807A, by packaging with lead frames formed to allow side-view type mounting. However, as described above, packaging with the use of lead frames imposes a limitation on downsizing of the light emitting device. Also, in the case where the light emitting devices are fabricated as CSPs as in JP 2010-141176A, the electrodes for external connection are needed to be formed on the side surfaces of the CSPs which are created as cleavage surfaces at the time of singulating the CSPs that are fabricated in a wafer level. For this reason, operations after singulation cannot be performed on a wafer-level, so that side-view-type mounting in wafer-level CSP has been difficult to be realized. Accordingly, an object of the present embodiment is to provide a CSP light emitting device which can be mounted in a side-view configuration and which can be manufactured on a wafer-level, and to provide a method of manufacturing the same.

SUMMARY OF THE INVENTION

According to an embodiment of the present invention, a method of manufacturing a light emitting device which includes a semiconductor light emitting element which has a semiconductor stacked layer body in which a p-type semiconductor layer and an n-type semiconductor layer are stacked, a p-side electrode electrically connected to the p-type semiconductor layer and an n-side electrode electrically connected to the n-type semiconductor layer disposed on one side of the semiconductor stacked layer body. The method includes preparing light emitting element, forming resin layer, exposing internal conductive member, forming electrode for external connection, and singulating. The preparing light emitting element includes preparing a wafer having a plurality of the semiconductor light emitting elements arranged on a growth substrate. The forming resin layer includes, on the one side of the semiconductor stacked layer body, forming the resin layer which includes a p-side internal conductive member connected to the p-side electrode and an n-side internal conductive member connected to the n-side electrode. The exposing internal conductive member includes, in a boundary region between the plurality of semiconductor light emitting elements, removing at least a part of the resin layer with the p-side internal conductive member and the n-side internal conductive member respectively present in a range of the resin layer to be removed, in a thickness direction from an upper surface of the resin layer to expose the p-side internal conductive member and the n-side internal conductive member. The forming electrode for external connection includes forming an electrode for p-side external connection electrically connected to the exposed portion of the p-side internal conductive member and an electrode for n-side external connection electrically connected to the exposed portion of the n-side internal conductive member. The singulating includes dividing the wafer into a plurality of single semiconductor light emitting elements.

A light emitting device according to an embodiment of the present invention includes a semiconductor light emitting element having a semiconductor stacked layer body including a stack of a p-type semiconductor layer and an n-type semiconductor layer, and a p-side electrode electrically connected to the p-type semiconductor layer and an n-side electrode electrically connected to the n-type semiconductor layer, disposed on one side of the semiconductor stacked layer body, and a support member having a resin layer disposed at the one side of the semiconductor stacked layer body. The support body has an electrode for p-side external connection and an electrode for n-side external connection disposed on one of its side surfaces, and a p-side internal conductive member electrically connecting the p-side electrode and the electrode for p-side external connection and an n-side internal conductive member electrically connecting the n-side electrode and the electrode for n-side external connection in the resin layer, and at the side surface on which the electrode for p-side external connection and the electrode for n-side external connection are disposed, a surface which includes an end portion of a side where the semiconductor light emitting element is disposed and a surface formed with the electrode for p-side external connection or the electrode for n-side external connection are not co-planar with each other.

According to a method of manufacturing a light emitting device according to the embodiments of the present invention, the side surfaces of the light emitting device are formed by removing the resin layer and the internal conductive path of the border regions between adjacent light emitting elements, and the external electrodes are disposed on respective side surfaces so as to be electrically connected to corresponding inner conductive paths. Thus, CSP-type light emitting devices which can be mounted in a side-view configuration can be fabricated in a wafer level. The light emitting devices according to an embodiment of the present invention have the electrodes for external connection on the respective side surfaces, which allows for mounting in a side view configuration.

BRIEF DESCRIPTION OF THE DRAWINGS

FIG. 1A is a plan view, and FIG. 1B is a cross-sectional view taken along line A-A in FIG. 1A.

FIG. 3A is a plan view, and FIG. 3B is a schematic cross-sectional view taken along line A-A in FIG. 3A.

FIGS. 4A and 4B are schematic diagrams showing an example of a configuration of a light emitting element according to a first embodiment of the present invention, in which FIG. 4A is a plan view, and FIG. 4B is a schematic cross-sectional view taken along line A-A in FIG. 4A.

FIG. 7A is a plan view, FIG. 7B is a schematic cross-sectional view taken along line A-A in FIG. 7A, FIG. 7C is a schematic cross-sectional view taken along line B-B of FIG. 7A, and FIG. 7D is a schematic cross-sectional view taken along line C-C of FIG. 7A.

FIG. 8A is a plan view, FIG. 8B is a schematic cross-sectional view taken along line B-B of FIG. 8A, and FIG. 8C is a schematic cross-sectional view taken along line C-C of FIG. 8A.

FIG. 9A illustrates forming a resin layer, FIG. 9B illustrates removing the growth substrate, and FIG. 9C illustrates forming a fluorescent material layer.

FIG. 10A is a plan view, FIG. 10B is a schematic cross-sectional view taken along line D-D of FIG. 10A, and FIG. 10C is a schematic cross-sectional view taken along line B-B of FIG. 10A.

FIG. 11A illustrates forming electrode for external connection, and FIG. 11B illustrates singulation.

FIG. 13A is a plan view and FIG. 13B is a cross sectional view taken along line B-B of FIG. 13A.

FIG. 14A is a plan view, and FIG. 14B is a schematic cross-sectional view taken along line A-A in FIG. 14A.

FIGS. 17A to 17C are schematic cross sectional views corresponding to a portion taken along line A-A of FIG. 14A, each illustrating a part of operations in fabricating light emitting devices according to a second embodiment. In which, FIG. 17A illustrates disposing a first plated layer, FIG. 17B illustrates forming a first resin layer, and FIG. 17C illustrates cutting the first resin layer.

FIG. 18A is a plan view, FIG. 18B is a schematic cross-sectional view taken along line A-A of FIG. 18A, and FIG. 18C is a schematic cross-sectional view taken along line B-B of FIG. 18C.

FIG. 19A is a schematic cross-sectional view corresponding to a portion taken along line A-A of FIG. 18A, and FIG. 18C is a schematic cross-sectional view corresponding to a portion taken along line B-B of FIG. 18C.

FIG. 20A is a plan view, FIG. 20B is a schematic cross-sectional view taken along line A-A of FIG. 20A, and FIG. 20C is a schematic cross-sectional view taken along line B-B of FIG. 20A.

FIG. 21A is a plan view, FIG. 21B is a schematic cross-sectional view taken along line A-A of FIG. 21A, and FIG. 21C is a schematic cross-sectional view taken along line E-E of FIG. 21A.

FIG. 22A is a schematic cross-sectional view corresponding to a portion taken along line A-A of FIG. 21A, and FIG. 22B is a schematic cross-sectional view corresponding to a portion taken along line B-B of FIG. 21B.

FIG. 23A illustrates removing the growth substrate, and FIG. 23B illustrates forming a fluorescent material layer.

FIG. 24A is a schematic cross-sectional view corresponding to a portion taken along line A-A of FIG. 21A, and FIG. 24B is a schematic cross-sectional view corresponding to a portion taken along line B-B of FIG. 21A.

FIG. 25A illustrates forming a first resist pattern, FIG. 25B illustrates forming a first resin layer, FIG. 25C illustrates cutting a first resin layer, and FIG. 25D illustrates removing a first resist pattern.

FIG. 25A illustrates forming plated layer, FIG. 26B illustrates forming a second resist pattern, FIG. 26C illustrates etching, and FIG. 26D illustrates removing a second resist pattern.

FIG. 27A is a plan view, and FIG. 27B is a schematic cross-sectional view taken along line A-A of FIG. 27A.

FIG. 30A is a plan view, and FIG. 30B is a schematic cross-sectional view taken along line A-A of FIG. 30A.

FIG. 31A and FIG. 30B are schematic cross-sectional views corresponding to a portion taken along line A-A of FIG. 30A, each illustrating a part of the operations in fabricating light emitting devices according to a third embodiment of the present invention, where FIG. 31A illustrates forming a first resin layer.

FIG. 32A is a cross-sectional view corresponding to a portion taken along line A-A of FIG. 30A, and FIG. 32B is a cross-sectional view corresponding to a portion taken along line B-B of FIG. 30A.

FIG. 34A is a cross-sectional view corresponding to a portion taken along line A-A of FIG. 30A, and FIG. 34B is a cross-sectional view corresponding to a portion taken along line B-B of FIG. 30A.

FIG. 35A is a cross-sectional view corresponding to a portion taken along line A-A of FIG. 30A, and FIG. 35B is a cross-sectional view corresponding to a portion taken along line B-B of FIG. 30A.

FIG. 36A is a cross-sectional view corresponding to a portion taken along line A-A of FIG. 30A, and FIG. 36B is a cross-sectional view corresponding to a portion taken along line B-B of FIG. 30A.

FIG. 37A illustrates removing growth substrate, and FIG. 37B illustrates forming a fluorescent material layer.

FIG. 38A is a cross-sectional view corresponding to a portion taken along line A-A of FIG. 30A, and FIG. 38B is a cross-sectional view corresponding to a portion taken along line B-B of FIG. 30A.

FIG. 39A is a schematic cross sectional view illustrating formation of a bump stacked body, and FIG. 39B is a schematic cross sectional view illustrating bonding of a metal wire.

FIG. 40A and FIG. 40B are each a schematic cross sectional view illustrating mounting a light emitting device in a side-view configuration according to a third embodiment of the present invention, in which FIG. 40A is a cross-sectional view corresponding to a portion taken along line F-F in FIG. 27A, and FIG. 40B is a cross-sectional view corresponding to a portion taken along line B-B in FIG. 27A.

FIG. 41A and FIG. 41B are each a schematic cross-sectional view illustrating mounting a light emitting device in a top-view configuration according to a third embodiment of the present invention, in which FIG. 41A is a cross-sectional view corresponding to a portion taken along line A-A in FIG. 27A, and FIG. 41B is a cross-sectional view corresponding to a portion taken along line B-B in FIG. 27A.

DETAILED DESCRIPTION OF REPRESENTATIVE EMBODIMENTS

Figure 1A:
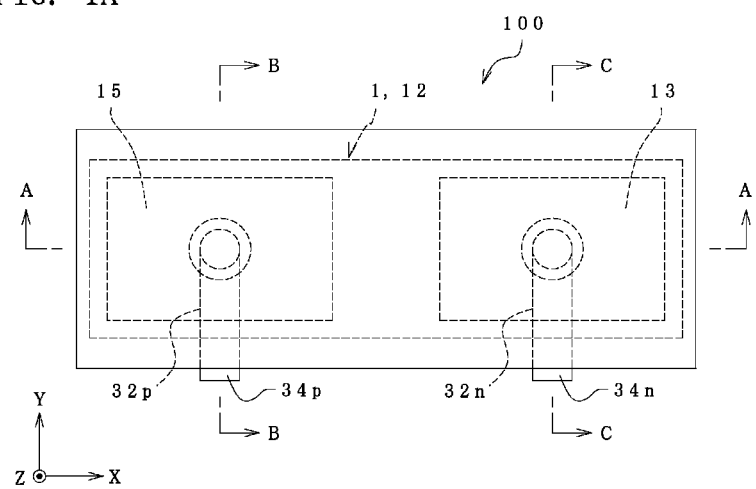
FIGS. 1A and 1B are schematic diagram showing a configuration of a light emitting device according to a first embodiment of the present invention, where

Representative embodiments of a light emitting device and of a method of manufacturing the light emitting device will be described below. The drawings referred to in the description below are to schematically illustrate the embodiments, and the size, a space or interval, locational relationship of the components may be exaggerated or a portion of a component may not be shown. Also, the size and/or space or interval of components may not be the same between a plan view and a cross-sectional view. In the description below, the same designations or the same reference numerals denote the same or like members and duplicative descriptions will be appropriately omitted.

In the light emitting devices according to each embodiment of the present invention, a relative location expressed as "upper" and "lower", "left" and "right" or so forth may be vice versa, depending on the situation. In the present specification, the terms such as "upper" and "lower" are used to illustrate a relative locational relationship between the components in a drawing which is referred to, and unless specifically indicated, are not intended to show absolute positional relationship.

First Representative Embodiment

Configuration of a Light Emitting Device

With reference to FIG. 1A to FIG. 2B, a structure of a light emitting device according to a first embodiment of the present invention will be described. A light emitting device 100 according to the first embodiment is a CSP, constituted with, as shown in FIG. 1A to FIG. 2B, a semiconductor light emitting element 1 (hereinafter may be referred to as "light emitting element") having an LED (light emitting diode) structure in which a growth substrate is removed, a support member 3 disposed on one side of the light emitting element 1, and a fluorescent material layer (wavelength converting layer) 2 disposed on other side of the light emitting element 2. On the one side of the light emitting element 1, an n-side electrode 13 and a p-side electrode 15 are disposed, and through metal wires 32n, 32p which are internal conductive members provided in a resin layer 31 which is a base body of the support member 3, respectively electrically connected to an electrode for n-side external connection 34n and an electrode for p-side external connection 34p disposed on one longitudinal side surface which is in the longitudinal direction (side surface substantially in parallel to an X-Z plane) of the resin layer 3.

Figure 2A:
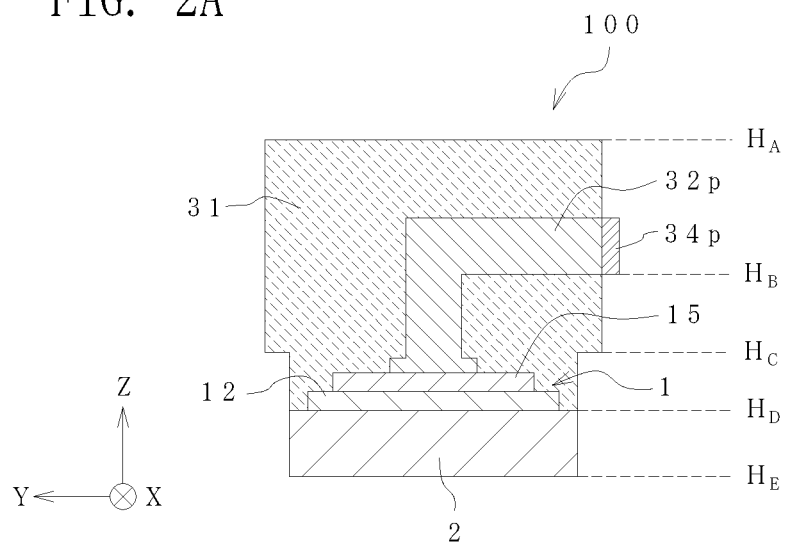
FIG. 2A is a schematic cross-sectional view taken along line B-B of FIG. 1A.
Figure 2B:
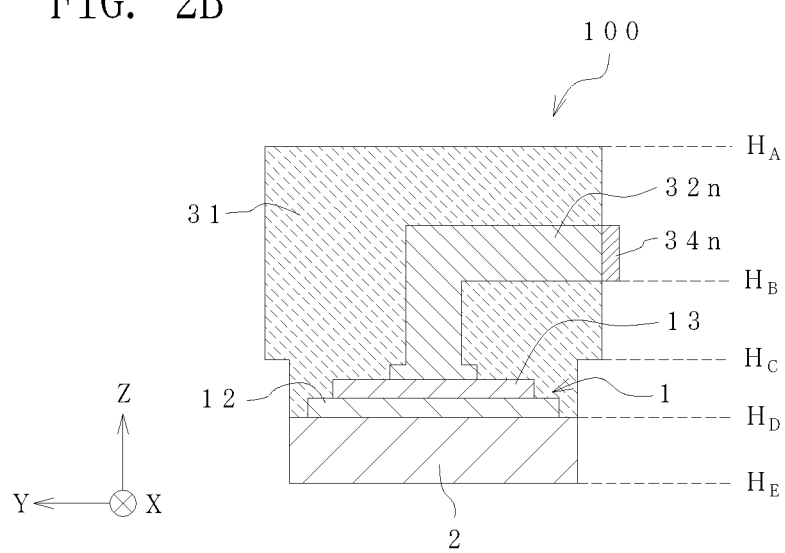
FIG. 2B is a schematic cross-sectional view taken along line C-C of FIG. 1A.

Accordingly, the light emitting device 100 is configured to allow side-view type mounting in which the mounting surface is one longitudinal side surface which is in the longitudinal direction where the electrode for n-side external connection 34n and the electrode for p-side external connection 34p are disposed. As shown in FIG. 2A and FIG. 2B, on the longitudinal side surfaces of the light emitting device 100, a step difference is formed at the location HC in the height direction (the Z-axis direction) as a boundary so that the portion lower than the position HC is at an inner side than the upper portion in a plan view. The light emitting device 100 is a WCSP (CSP assembled in wafer processing) assembled in a wafer-level, the detail thereof will be described below.

Also, the light emitting device 100 of the present embodiment is configured to emit light whose wavelength has been converted by a fluorescent material layer 2 which converts a portion of or the entire of the light emitted from the light emitting element 1 into light of a different wavelength, and emit the wavelength-converted light and light emitted from the light emitting element 1. For example, with the configuration of a light emitting element 1 to emit blue light and a fluorescent material layer 2 to absorb a portion of the blue light to convert it in a yellow light, the light emitting device 100 can be a white light source to emit white light made by mixing the blue light and the yellow light. In the present embodiment and other representative embodiment to be described below, the light emitting device 100 etc., has a fluorescent material layer 2, but such a fluorescent material layer 2 is not indispensable to configure a CSP, and thus may not be employed.

Figure 40A:
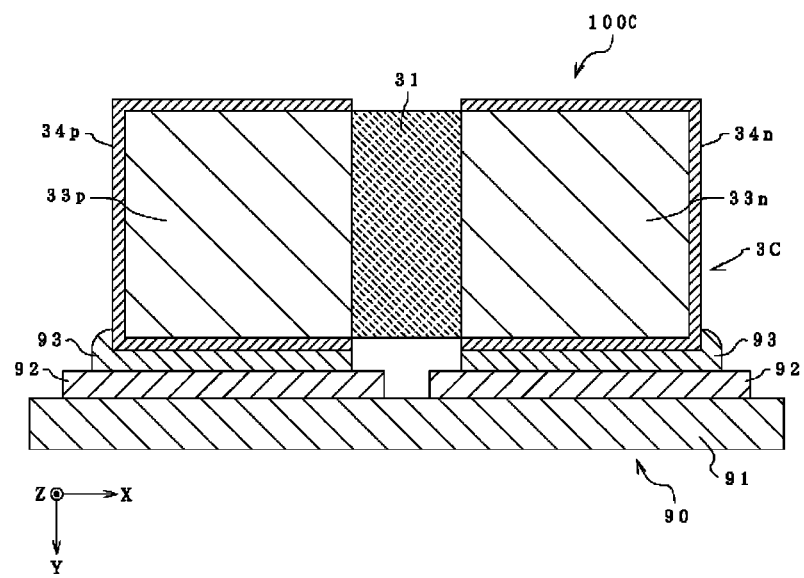

In the present specification, as indicated with the coordinate axes shown in the appropriate drawings, for convenience of illustration, a normal direction of the surface provided with the n-side electrode 13 and the p-side electrode 15 of the light emitting element 1 is indicated as "+Z-axis direction" and "a plan view" is indicated as looking in the direction from +Z-axis to −Z-axis. In the light emitting element 1 which has a rectangular shape in a plan view, the longitudinal direction is indicated as an X-axis direction and the lateral direction is indicated as a Y-axis direction. Also, the figures indicated as "cross-sectional view" each shows a cross section at a plane substantially perpendicular to an X-Y plane (a plane substantially in parallel to an X-Z plane or a Y-Z plane). FIG. 40A shows a cross section at a plane in parallel to the X-Y plane.

Next, the configuration of each constituent component of the light emitting device 100 will be sequentially described below. The light emitting element 1 has a planar shape which is approximately rectangular in a plan view, and is an LED chip of a face-down type with the n-side electrode 13 and the p-side electrode 15 disposed on one surface side.

Example of Light Emitting Element

Figure 3A:
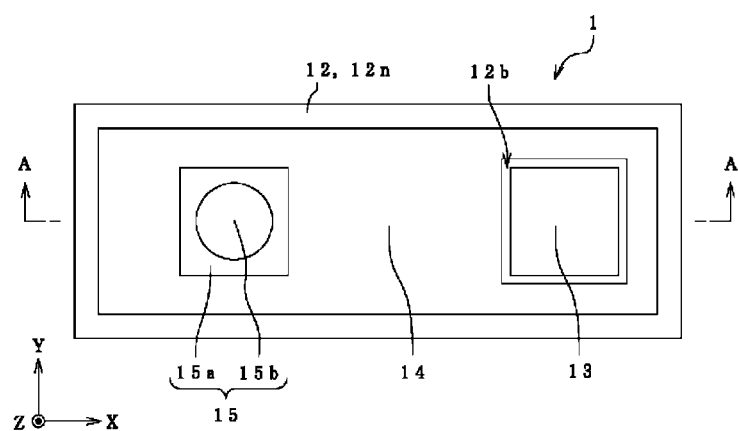
FIGS. 3A and 3B are schematic diagrams showing an example of a configuration of a light emitting element according to a first embodiment of the present invention, where
Figure 3B:
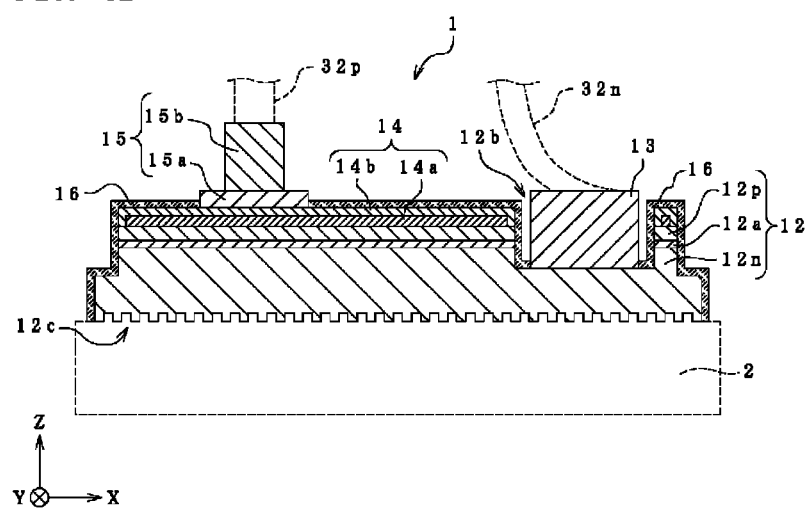

With reference to FIG. 3A and FIG. 3B, an example of light emitting element 1 will be described in detail below. The light emitting element 1 shown in FIG. 3A and FIG. 3B has a semiconductor stacked layer body 12 in which an n-type semiconductor layer 12n and a p-type semiconductor layer 12p are stacked. The semiconductor stacked layer body 12 is configured to emit light upon applying electric current between an n-side electrode 13 and a p-side electrode 15, and a light emitting layer 12a is preferably disposed between the n-type semiconductor layer 12n and the p-type semiconductor layer 12p.

In the semiconductor stacked layer body 12, a region in which the p-type semiconductor layer 12p and the light emitting layer 12a are absent, that is a region recessed from the surface of the p-type semiconductor layer 12p (hereinafter may be referred to as "step difference portion 12b" is formed. The floor of the step difference portion 12b is an exposed surface of the n-type semiconductor layer 12n and the n-side electrode 13 is disposed on the step difference portion 12b. Also, a whole surface electrode 14 is disposed on an approximately entire surface of the upper surface of the p-type semiconductor layer 12p. The whole surface electrode 14 may be constituted with a reflecting electrode 14a which has a good reflecting property and a cover electrode 14b which covers entire of the upper surface and side surfaces of the reflecting electrode 14a. In addition, the p-side electrode 15 is disposed on a portion of the upper surface of the cover electrode 14b. Also, the surfaces of the semiconductor stacked layer body 12 and the whole surface electrode 14 are covered with an insulating protective layer 16 except the surfaces of the n-side electrode 13 and the p-side electrode 15 which are the pad electrodes of the light emitting element 1.

Also, the semiconductor stacked layer body 12 can be made of a material which is suitable to a semiconductor light emitting element, such as GaN, GaAs, AlGaN, InGaN, AlInGaO, GaP, SiC, or ZnO. In the present embodiment, a portion of light emitted from the light emitting element 1 is converted to light having a different wavelength by the fluorescent material layer 2, so that a semiconductor stacked layer body 12 which is configured to emit light of a shorter wavelength such as blue light or green light is suitable.

For the n-type semiconductor layer 12n, the light emitting layer 12a, and the p-type semiconductor layer 12p, a GaN-based compound semiconductor such as $In_XAl_YGa_{1-X-Y}N$ ($0 \leq X$, $0 \leq Y$, $X+Y \leq 1$) can be suitably used. Those semiconductor layers may respectively have a single-layer structure, but have a stacked-layer structure, a superlattice structure, or the like, which are made of layers of different compositions and thickness. Particularly, the light emitting layer 12a preferably has a single quantum well structure or a multi-quantum well structure which is made of stacked layer of thin layers that each can produce a quantum effect.

Figure 7A:
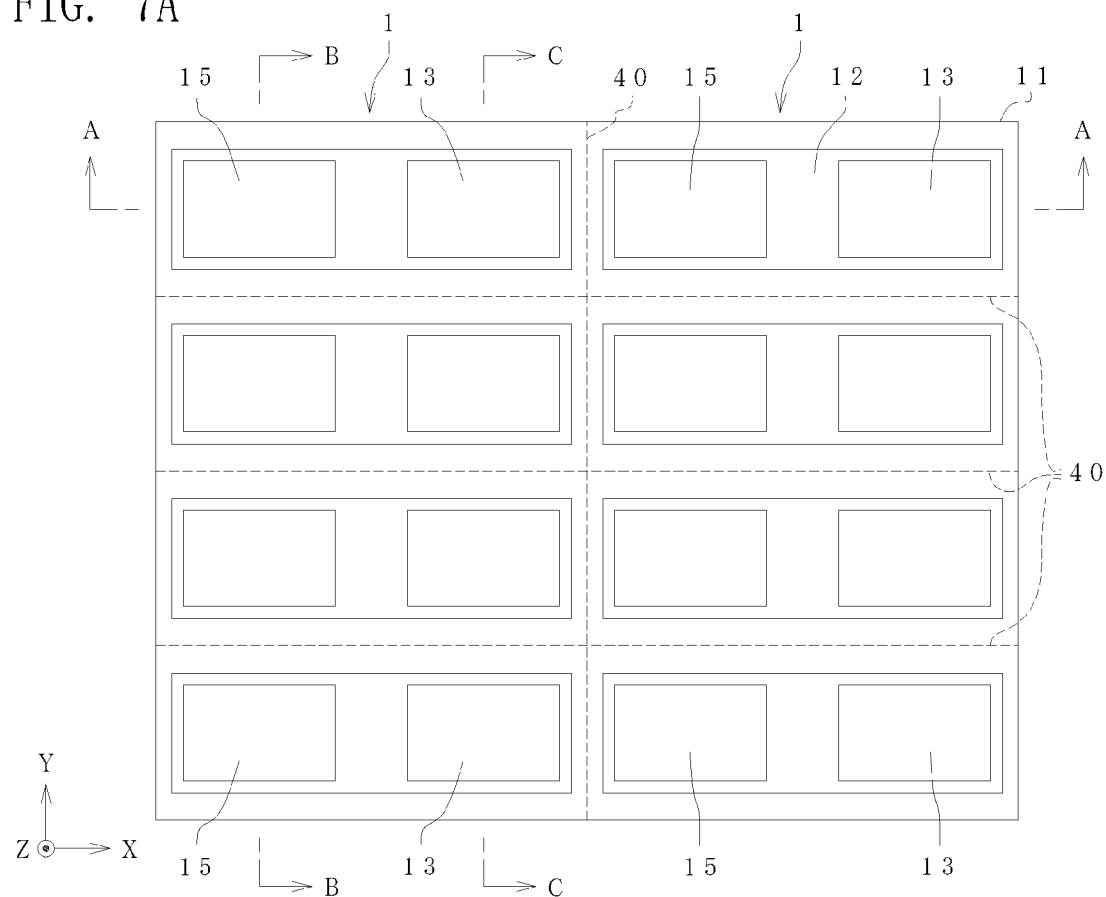
FIG. 7A to FIG. 7D are each a schematic diagram illustrating preparing light emitting element in a manufacturing operations of a light emitting device according to a first embodiment of the present invention, where
Figure 7B:
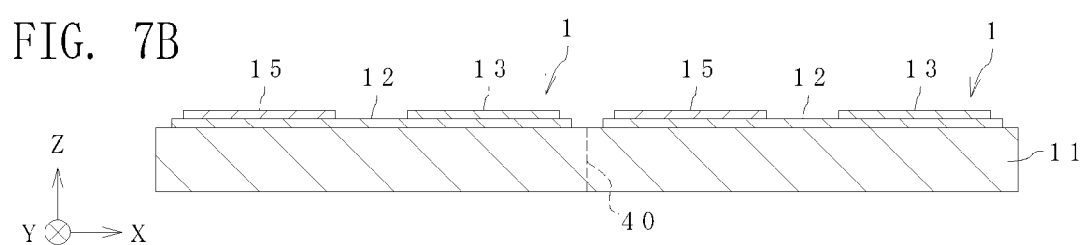
Figure 7C:
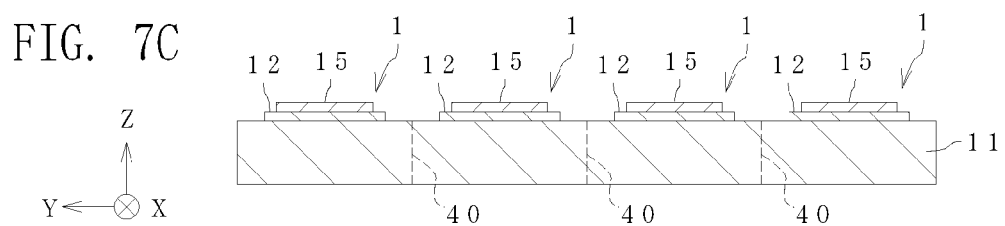
Figure 7D:
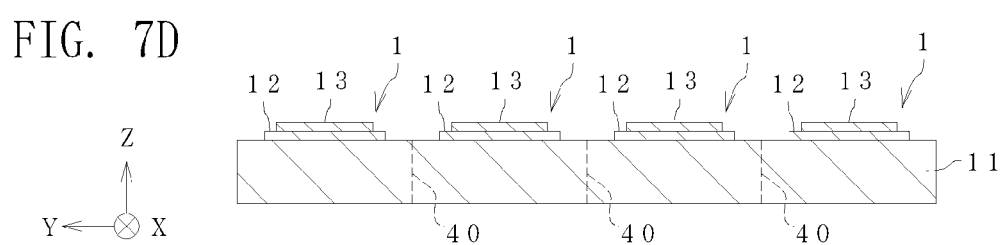

In the case where a GaN-based compound semiconductor is used for the semiconductor stacked layer body 12, the semiconductor layer can be formed on a growth substrate 11 (FIGS. 7A to 7B) which is suitable for growing a crystal of a semiconductor layer, by using a known technique such as a MOCVD method (metal organic vapor phase epitaxy method), an HVPE method (hydride vapor phase epitaxy method), a MBE method (molecular beam epitaxy method). The thickness of the semiconductor layers are not specifically limited and various thicknesses can be applied.

For the growth substrate for epitaxially growing the semiconductor stacked layer body 12, in the case where a semiconductor stacked layer body 12 is formed by using nitride semiconductors such as GaN (gallium nitride) for example, an insulating substrate such as a sapphire with a principal plane being C-plane, R-plane, or A-plane, and a spinel ($MgAl_2O_4$); and silicon carbide (SiC), silicon, ZnS, ZnO, GaAs, and diamond, and an oxide substrate such as lithium niobate and neodymium gallate can be used.

In the present embodiment, during the manufacturing of the light emitting device 100, the growth substrate is peeled off from the semiconductor stacked layer body 12 to be removed. Thus, the light emitting element 1 in a completed light emitting device 100 does not include a growth substrate. The lower surface of the semiconductor stacked layer body 12 from which the growth substrate has been removed, that is, the lower surface of the n-type semiconductor layer 12n preferably has a recess-projection shape 12c formed by roughening the lower surface. With the recess-projection shape 12c, the light extraction efficiency of the surface can be improved. Such a recess-projection shape 12c can be formed by performing wet etching on the lower surface of the n-type semiconductor layer 12n.

The whole surface electrode 14 serves as a current diffusion layer and a reflecting layer and may be constituted with stacking a reflecting electrode 14a and a cover electrode 14b. The reflecting electrode 14a is disposed to cover approximately an entire surface of the upper surface of the p-type semiconductor layer 12p. Also, the cover layer 14b is disposed to cover approximately an entirety of the upper surface and side surfaces of the reflecting electrode 14a. The reflecting electrode 14a is a conductive layer for dispersing electric current supplied through the cover electrode 14b and the p-side electrode 15 disposed on a portion of the cover electrode 14b to the entire surface of the p-type semiconductor layer 12p. Also, the reflecting electrode 14a has a good reflecting property and serves as a reflecting layer so that the light emitted from the light emitting element 1 is reflected downward toward the light extracting surface. In the specification, the expression "having reflecting property" refers to satisfactory reflecting light of the wavelength of emission of the light emitting element 1. Further, the reflecting electrode 14a preferably has a reflecting property to light of the wavelength which is converted by the fluorescent material layer 2.

For the reflecting electrode 14a, a metal material which has good electrical conductivity and good reflecting property can be used. The metal material which has good reflecting property particularly in a visible region can include Ag, Al or an alloy whose main component is one or more of those metals can be suitably used. For the reflecting electrode 14a, a single layer or stacked layer of those metal materials can be employed.

The cover electrode 14b serves as a barrier layer for preventing migration of the metal material which is a constituent of the reflecting electrode 14a. Particularly, in the case where Ag which easily migrates is used for the reflecting electrode 14a, the cover electrode 14b is preferably provided. For the cover electrode 14b, a metal material which has good electrical conductivity and good barrier property can be used, and examples of such a metal material include Al, Ti, W, and Au. For the cover electrode 14b, a single layer or stacked layer of those metal material can be employed.

The n-side electrode 13 is disposed on the floor of the step difference portion 12b of the semiconductor stacked layer body 12 where the n-type semiconductor layer 12n is exposed. In addition, the p-side electrode 15 is disposed on a portion of the upper surface of the cover electrode 14b. The n-side electrode 13 and the p-side electrode 15 are pad electrodes. The n-side electrode 13 is electrically connected to the n-type nitride semiconductor layer 12n, and the p-side electrode 15 is electrically connected to the p-type nitride semiconductor layer 12 via a whole surface electrode 14, to supply external electric current to the nitride semiconductor element 1. To the n-side electrode 13 and the p-side electrode 15, a metal wire 32n and a metal wire 32p which are inner conductive members in the supporting body 3 (FIG. 1A to FIG. 2B) are respectively connected.

Also, in the example shown in FIGS. 3A and 3B, the p-side electrode 15 is constituted with a stack of the pad electrode layer 15a which is originally a pad electrode and an impact absorbing layer 15b. The impact absorbing layer 15b is not an essential component, but is employed to reduce the impact at the time of wire bonding the metal wire 32p to reduce damage of the semiconductor stacked layer body 12. In the example shown in FIGS. 2A and 2B, in the case where ball bonding is employed for wire bonding as in the p-side electrode 15, the impact imposed on the bonding portion is relatively large. Therefore, the impact absorbing layer 15b is preferably provided. The n-side electrode 13 may also be provided with an impact absorbing layer as in the p-side electrode 15. Also, without providing the p-side electrode 15, a portion of the whole surface electrode 14 may be used as a pad electrode and the metal wire 32p may be directly connected to the whole surface electrode 14.

A metal material can be used for the n-side electrode 13 and the pad electrode layer 15a, and for example, a single metal member such as Ag, Al, Ni, Rh, Au, Cu, Ti, Pt, Pd, Mo, Cr or W, or an alloy whose main component is one or more of those metals can be suitably used. In the case where an alloy is used, for example as in an AlSiCu alloy, a nonmetallic element such as Si may be contained as a composition element. For the n-side electrode 13 and the pad electrode 15a, a single layer or stacked layer of those metal material can be employed. For the impact absorbing layer 15b, a similar material as used for the pad electrode layer 15a can be used, but it is suitable to employ a material which can establish good connection with the metal wire 32p to be connected on the upper surface of the impact absorbing layer 15b. For example, in the case where the metal wire 32p is made of Cu, it is preferable that the impact absorbing layer 15b also employs Cu.

The protective layer 16 has an insulating property and covers the entire of the upper surface and the side surfaces of the light emitting element 1 except for the connection parts of the n-side electrode 13 and the p-side electrode 15 on the outside. The protective layer 16 serves as a protective layer and an antistatic layer for the light emitting element 1. In the case where a reflecting layer is disposed on the outside of the protective layer 16 which is disposed on the side surface portion of the semiconductor stacked layer structure body 12, the protective layer 16 preferably has good light transmissive property to the light emitted from the light emitting element 1. Further, it is also preferable that the protective layer 16 has good light-transmissive property to light of the wavelength which is converted by the fluorescent material layer 2. For the protective layer 16, a metal oxide or a metal nitride can be used, for example, an oxide or a nitride of at least one element selected from the group consisting of Si, Ti, Zr, Nb, Ta, and Al can be suitably used.

Also, for the protective layer 16, two or more types of light-transmissive dielectric members with different refractive indices may be stacked to constitute a DBR (Distributed Bragg Reflector) layer. With the DBR layer, leaking light from the upper surface and the side surfaces of the light emitting element 1 can be reflected and returned into the light emitting element 1, so that the light extraction efficiency of the lower surface which is the light extracting surface of the light emitting element 1 can be improved. Examples of the DBR layer includes a multilayer in which a $SiO_2$ layer and a $Nb_2O_5$ layer are alternately stacked, in which, good reflectance can be obtained with a multilayer of at least three pairs or more, preferably seven pairs or more.

Other Examples of Light Emitting Element

Next, with reference to FIG. 4A to FIG. 5B, other examples of light emitting element will be described in detail. The same reference numerals will be applied to the components which have the same or similar structure as those shown in FIG. 3A and FIG. 3B and descriptions thereof will be appropriately omitted.

The light emitting element 1A of another example shown in FIGS. 4A to 5B has a configuration in which the p-side electrode 15 which is the p-side pad electrode is disposed extending on a portion of the upper surface of the whole surface electrode 14, and the n-side electrode 13 which is the n-side pad electrode is disposed, except for the region where the p-side electrode is disposed and a portion close thereto, on approximately entire of the upper surface and the side surfaces of the semiconductor stacked layer body 12 via the protective layer 16. Thus, providing the n-side electrode 13 or the p-side electrode 15 on a wide area of the upper surface and the side surfaces of the light emitting element 1A allows for conducting heat efficiently to the resin layer 31 of the support member 3 to be described below, so that heat dissipation performance can be improved. In the example shown in FIG. 4A to FIG. 5B, the n-side electrode 13 is disposed extending on a wide area of the upper surface and the side surfaces of the semiconductor stacked layer body 12, but alternatively, the p-side electrode 15 may be provided on a wide area. Also, both the n-side electrode 13 and the p-side electrode 15 may be disposed complementarily on a wide area. For example, in FIG. 4A, the p-side electrode 15 may be disposed on a wide area of a left half of the light emitting element 1A and the n-side electrode 13 may be disposed on a wide area of a right half of the light emitting element 1A.

The n-side electrode 13 and/or the p-side electrode 15 may be disposed extending to the side surfaces of the semiconductor stacked layer body 12 where the reflecting electrode 14a is not provided, so as to function as a reflecting layer. With this arrangement, light emitted from the side surfaces of the semiconductor stacked layer body 12 can be reflected into the semiconductor stacked layer body 12, so that the light extraction efficiency of the lower surface which is the light extracting surface of the light emitting element 1 can be improved. In the case where the n-side electrode 13 and/or the p-side electrode 15 is used as a reflecting layer, a material having good reflectivity is preferably used for at least a lower layer side (protective layer 16 side) of the electrode. Examples of the material which have good reflecting property to visible light include Ag, Al or an alloy whose main component is one or more of those metals.

In the light emitting element 1A, the step difference portion 12b where the n-type semiconductor layer 12n is exposed is formed on the entire periphery of the semiconductor stacked layer body 12. Also, a whole surface electrode 14 which is a stacked layer of the reflecting electrode 14a and the cover electrode 14b is disposed on an approximately entire surface of the upper surface of the p-type semiconductor layer 12p of the semiconductor stacked layer body 12. Also, the surfaces of the semiconductor stacked layer body 12 and the whole surface electrode 14 are covered with an insulating protective layer 16 except for the entirety of the lower surface of the semiconductor stacked layer 12, a portion of the floor of the step difference portion 12b, and a portion of the upper surface of the whole surface electrode 14. Also, in the light emitting element 1A, in a similar manner as in the light emitting element 1, a recess-projection shape 12c is formed on the entire surface of the lower surface of the n-type semiconductor layer 12n.

Figure 4A:
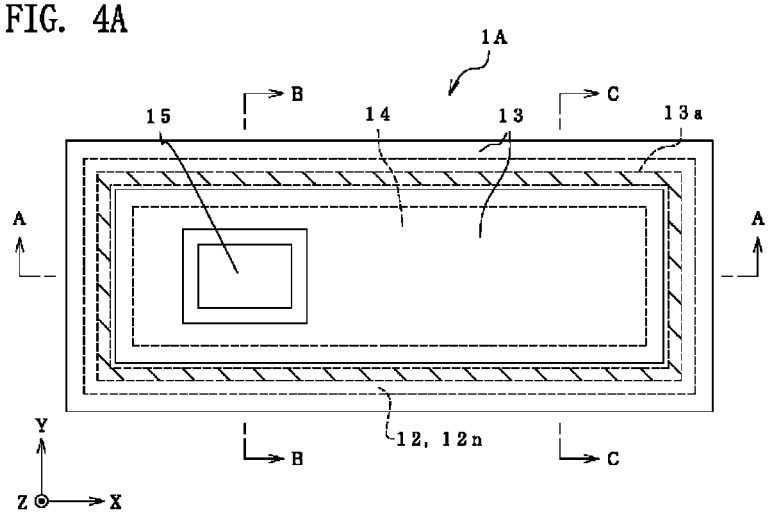
Figure 4B:
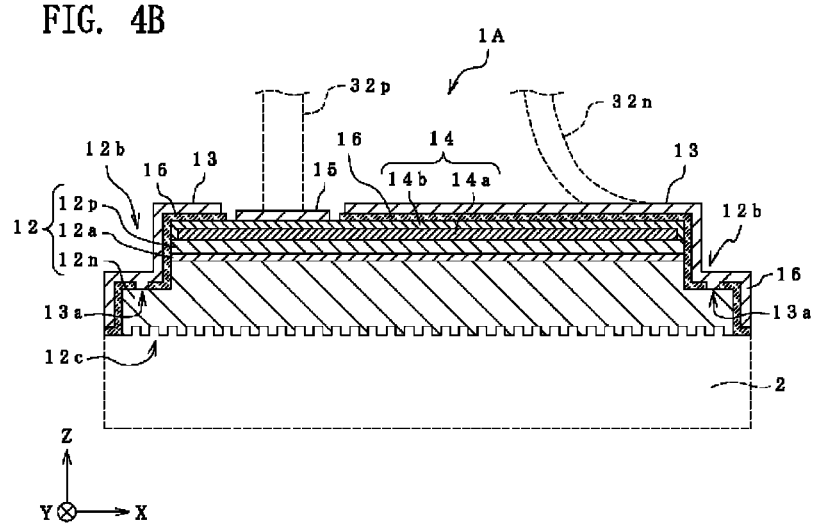
Figure 5A:
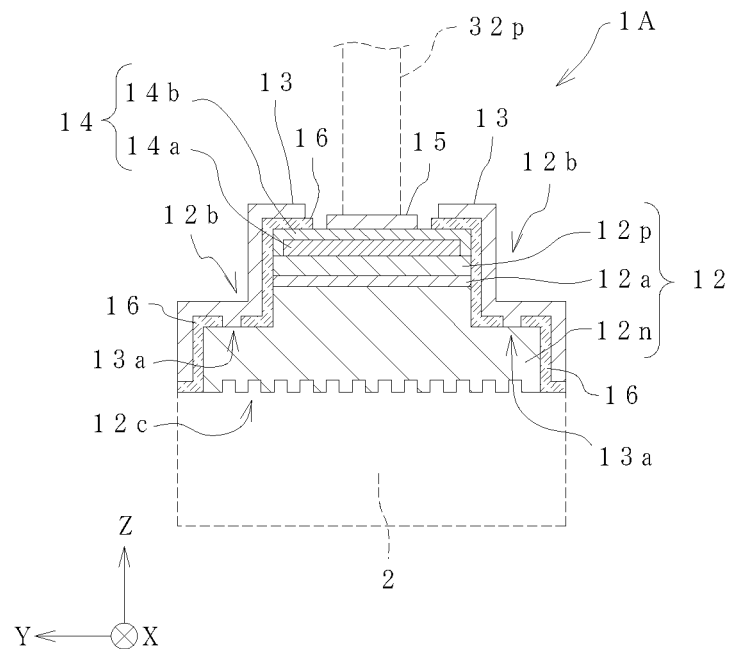
FIG. 5A is a schematic cross-sectional view taken along line B-B of FIG. 4A.
Figure 5B:
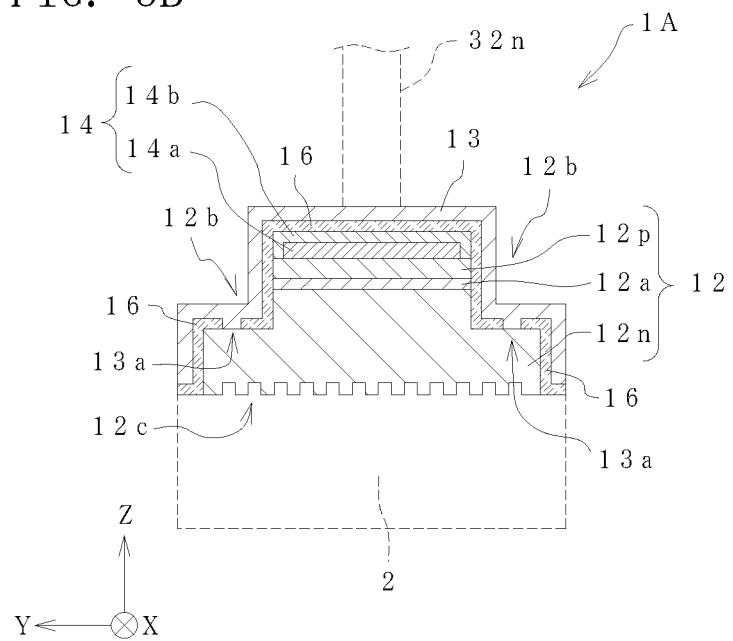
FIG. 5B is a schematic cross-sectional view taken along line C-C of FIG. 4A.

Also, at the floor of the step difference portion 12b, as shown in FIG. 4B and FIGS. 5A and 5B, the protective layer 16 has opening portions. That is, the opening portions are the regions where the n-type semiconductor layer 12n is not covered with the protective layer 16, and the opening portions serves the joining portions 13a of the n-type semiconductor layer 12n and the n-side electrode 13. In the present example, as shown in FIG. 4A, the joining portion 13a is disposed along the whole circumference of the semiconductor stacked layer body 12. As described above, providing the joining portion 13a in a wide area allows for uniform dispersion of the electric current which is supplied through the n-side electrode into n-type semiconductor layer 12n, so that the luminous efficiency can be improved.

Instead of forming the step difference portion 12b around the entire periphery of the semiconductor stacked layer body 12, the step difference portion 12b may be formed at a portion of the periphery. Reduction of the region to form the step difference portion 12b allows for increase of the area for the p-type semiconductor layer 12p and the light emitting layer 12a, so that the light emission quantity can be increased. Alternative to or in addition to the periphery, the step difference portion 12b may be formed inner side of the semiconductor stacked layer body 12 in a plan view. Forming the step difference portion 12b intermittently in a wide area rather than forming the step difference portion in a part of the semiconductor stacked layer structure body 12 allows for uniform dispersion of the electric current in the n-type semiconductor layer as described above, without excessive increase of the step difference portion 12b area. For example, the step difference portion 12b may be formed intermittently along the periphery, instead of forming the step difference portion 12b substantially continuously along the entire outer periphery of the semiconductor stacked layer body 12 shown in FIG. 4A to FIG. 5B.

Also, in the light emitting device 100 (see FIG. 1A to FIG. 2B) of the present embodiment, for convenience of illustration, description is made with reference to the use of a light emitting element 1 as the light emitting element, but any of the light emitting element 1 shown in FIGS. 3A and 3B, and the light emitting element 1A shown in FIG. 4A to FIG. 5B can also be employed. In other embodiments to be described below, either the light emitting element 1 or the light emitting element 1A can be used similarly.

Now returning to FIG. 1A to FIG. 2B, a configuration of the light emitting device 100 will be described. The fluorescent material layer (wavelength converting layer) 2 is to absorb a portion of or the entire portion of light emitted from the light emitting element 1 and to convert it to light of a different wavelength. The fluorescent material layer 2 can be formed of a resin layer containing particles of a fluorescent material as a wavelength converting material. The fluorescent material layer 2 is disposed at a lower surface side of the n-type semiconductor layer 12n which is the light extracting surface of the light emitting element 1 and which is provided with a recess-projection shape 12c (see FIG. 3B).

The thickness of the fluorescent material layer 2 can be determined according to the content of the fluorescent material, a desired color tone of mixed light of the light emitted from the light emitting element 1 and the wavelength-converted light, and so forth. For example, the thickness of the fluorescent material layer 2 may be 1 to 500 µm, more preferably 5 to 200 µm, and further preferably 10 to 100 µm.

The content of the fluorescent material in the fluorescent material layer 2, as a weight per unit area, is preferably adjusted to 0.1 to 50 mg/cm2. With the content of the fluorescent material in this range, sufficient color conversion can be obtained.

A resin material having good light-transmissive property to light emitted from the light emitting element 1 and the light whose wavelength has been converted by the fluorescent material layer 2 is preferably used. Examples of such a resin material include a silicone resin, a modified silicone resin, an epoxy resin, a modified epoxy resin, a urea resin, a phenol resin, an acrylate resin, a urethane resin, a fluororesin, or a hybrid resin containing one or more of those resins.

The fluorescent material (wavelength converting material) is not specifically limited as long as it can be excited by the wavelength of the light emitted from the light emitting element 1 and emits light of a different wavelength than the wavelength of the exciting light, and a granular fluorescent material can be suitably employed. A granular fluorescent material has light scattering property and light reflecting property, so that it can serve as a light scattering member and thus light diffusing effect can also be obtained. It is preferable that the fluorescent material is approximately uniformly mixed in the fluorescent layer 2 which is also a resin layer. Also, two or more fluorescent materials may be uniformly mixed in the fluorescent material layer 2 or may be distributed in a multilayer manner.

For the fluorescent material, a known material in the art can be used. Specific examples of the fluorescent materials include a YAG (yttrium aluminum garnet)-based fluorescent material activated with cerium, a LAG (lutetium aluminum garnet)-based fluorescent material activated with cerium, a nitrogen-containing calcium aluminosilicate ($CaO$—$Al_2O_3$—$SiO_2$)-based fluorescent material activated with europium and/or chromium, a silicate $((Sr,Ba)_2SiO_4)$-based fluorescent material activated with europium, β-sialon-based fluorescent material, a KSF ($K_2SiF_6$:Mn)-based fluorescent material. Also, a quantum dot phosphor can be used.

Also, in order to add a light diffusing property to the fluorescent material layer 2, an inorganic filler made of particles of a light transmissive inorganic compound, for example, an oxide, a carbonate, a sulphate, or a nitride of a rare earth element such as Si, Al, Zn, Ca, Mg, and Y, or an element such as Zr, Ti, or a complex salt such as bentonite and potassium titanate may be added. The average particle size of such an inorganic filler may be similar to the average particle size of the fluorescent material described above.

The fluorescent material layer 2 can be formed by preparing a slurry in which a resin described above, particles of a fluorescent material, and other material such as an inorganic filler are contained in a solvent, applying the slurry on a lower surface of a semiconductor stacked layer body 12 with the use of a spray method, a cast method, a potting method or the like, then hardening the slurry applied. Also, the fluorescent material layer 2 can be formed by separately preparing a resin plate which contains particles of a fluorescent material and adhering the resin plate to a lower surface of the semiconductor stacked layer body 12.

Also, the light emitting device 100 may be configured such that, without forming the fluorescent material layer 2, the lower surface of the semiconductor stacked layer body 12 is used as the light extracting surface to directly discharge the light emitted from the light emitting element 1. Also, in place of the fluorescent material layer 2, without containing a fluorescent material, a light transmissive resin layer may be disposed, or a light transmissive resin layer which contains a light diffusing filler may be disposed.

The support member 3 has an approximately rectangular parallel piped shape which in a plan view can contain the external shape of the light emitting element 1, and is disposed to join the light emitting element 1 at the surface side where the n-side electrode 13 and the p-side electrode 15 are disposed, and thus mechanically holds the light emitting element 1 from which the growth substrate is removed. In a plan view, the support member 3 has a shape approximately similar to the shape of the fluorescent material layer 2. The support member 3 includes a resin layer 31, electrodes for external connection (electrode for n-side external connection 34n and electrode for p-side external connection 34p) for mounting on a mounting substrate, and internal conductive members (metal wires 32n, 32p) for electrically connecting an n-side electrode 13 and a p-side electrode 15 to external connection electrodes having corresponding polarities.

Figure 1B:
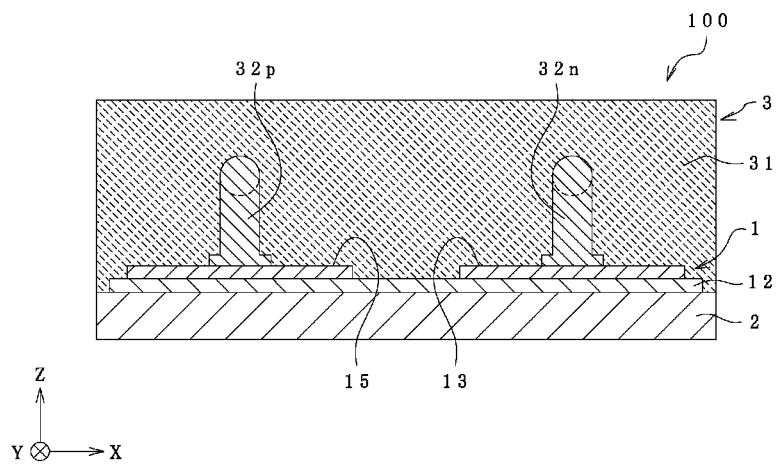

The resin layer 31 a base material of a reinforcing member of the light emitting element 1. The resin layer 31 has an external shape, as shown in FIG. 1B and FIGS. 2A, 2B, approximately similar to the external shape of the support member 3, and in a plan view, has an external shape which can contain the external shape of the light emitting element 1 and is approximately similar to the external shape of the fluorescent material layer 2. Also, the resin layer 31 serves as a sealing resin layer which seals the upper surface and the side surfaces of the light emitting element 1. Thus, all the surfaces of the light emitting element 1 are sealed with the resin layer 31 and the fluorescent material layer 2 which is a resin layer disposed on the lower surface side of the light emitting element. Also, on the longitudinal side surfaces of the resin layer 31, a step difference portion is formed with the position HC in the height direction as a boundary so that in a plan view, the lower portion is located at an inner side than the upper portion.

The resin layer 31 contains metal wires 32n, 32p, which are respectively extended in approximately perpendicular direction with respect to the electrode surfaces of the n-side electrode 13 and the p-side electrode 15, then bent in an L-shape (right angle), reaching the one longitudinal side surface (surface in parallel to the X-Y plane) of the resin layer 31. The end surfaces of the metal wires 32n, 32p are in a same plane with the side surface of the resin layer 31.

For the resin material of the resin layer 31, the resin material similar to those used for the fluorescent material layer 2 can be used. In the case of forming the resin layer 31 by compression molding, a raw material such as EMC (epoxy mold compound) which is a powdery epoxy-based resin or SMC (silicone mold compound) which is a powdery silicone-based resin can be suitably used.

In order to enhance thermal conductivity, a heat conducting member may be contained in the resin layer 31. With enhancing the thermal conductivity of the resin layer 31, heat generated from the light emitting element 1 can be quickly conducted and released to the outside. For the thermally conducting member, for example, granular carbon black or AlN (aluminum nitride) can be used. In the case where the thermally conducting member has electrically conducting property, the thermally conducting member can be contained with a particle density in a range so that the resin layer 31 does not exhibit electrical conductivity.

For the resin layer 31, a white resin made of a light transmissive resin material contained with a reflecting filler may be used. With the use of a white resin at least at the lower portion of the resin layer 31 which is joined to the upper surface of the light emitting element 1, the resin layer 31 adjacent to the light emitting element can be used as a light reflecting layer. Accordingly, light leaking from the upper surface and the side surfaces of the light emitting element 1 can be reflected and returned into the light emitting element 1. Thus, the light extraction efficiency of the lower surface which is the light extracting surface of the light emitting element 1 can be improved. In the case where the resin layer 31 can serves as a light reflecting layer, the whole surface electrode 14 of the light emitting element 1 may be formed with a light-transmissive conductive material such as ITO (indium tin oxide) or IZO (indium zinc oxide).

The minimum thickness of the resin layer 31 can be determined in view of distances between the electrodes for n-side external connection 34n and p-side external connection 34p and the fluorescent material layer 2 so that sufficient mechanical strength can be obtained as a reinforcing member of the light emitting element whose growth substrate has been removed, and also at the time of mounting in a side-view configuration, creeping of the adhesive material such as a solder from the electrode joining portion to the fluorescent material layer 2 can be restrained.

For example, as the reinforcing member, the resin layer 31 preferably has a thickness of 50 µm or greater. More preferably, forming the resin layer 31 with a thickness of 100 µm or greater allows for more stable mounting of the light emitting device 100 at the time of mounting on a mounting substrate in a side-view configuration using a side surface portion of the resin layer 31 as the mounting surface. In view of restraining creeping of the adhesion material to the fluorescent material layer 2, the fluorescent material layer 2 is preferably spaced apart from the electrodes for n-side external connection 34n and p-side external connection 34p by about 100 µm or greater. In the present embodiment, the metal wires 32n, 32p are connected to the electrode for n-side external connection 34n and the electrode for p-side external connection 34p respectively at a side surface of the resin layer 31, so that the upper limit in thickness of the resin layer 31 is not specifically required.

Each of the metal wires 32n is disposed to penetrate the resin layer 31 from the bottom surface to one of the longitudinal side surfaces while bending in a substantially L-shape, so as to serve as an internal conductive member electrically connecting the n-side electrode 13 and the electrode for n-side external connection 34n. The metal wires 32n also serve as a thermal conduction path for dissipating the heat generated from the light emitting element 1. In the example shown in FIGS. 1A to 2B, the metal wire 32n is disposed so as to bent in an L-shape, but it is not limited thereto, the metal wire 32n can be arranged along an appropriate route such as in an arc shape.

Each of the metal wires 32p is disposed to penetrate the resin layer 31 from the bottom surface to one of the longitudinal side surfaces while bending in a substantially L-shape, so as to serve as an internal conductive member electrically connecting the p-side electrode 15 and the electrode for p-side external connection 34p. The metal wires 32p also serve as a thermal conduction path for dissipating the heat generated from the light emitting element 1. In order to reduce heat resistance of the metal wires 32n, 32p which serve as thermal conduction paths, wiring with a shortest possible length is preferable.

For the metal wires 32n, 33p, a material having good electric conductivity and good thermal conductivity is preferably used, and for example, Au, Cu, Al, or Ag, or an alloy whose main component is one or more of those metals can be suitably used. Also, a metal wire provided with a surface coating may be employed. In order to efficiently conduct heat generated from the light emitting element 1, the diameter of the wire is preferably about 20 µm or greater, more preferably about 30 µm or greater, thus, the larger the diameter of the wire the more efficiently the wire conducts the heat. The upper limit for the diameter of the wires is not specifically limited as long as the wire can be attached to the n-side electrode 13 and the p-side electrode 15 of the light emitting element 1, but preferably not to cause damage due to impact from the wire bonder experienced on the semiconductor stacked layer body 12 at the time of wire bonding. Thus, for example, the diameter of the wire may be preferably about 3 mm or less, and more preferably about 1 mm or less. In order to use a thicker wire at a lower price, a wire made of Cu or Al, or an alloy whose main component is one or more of those metals can be suitably used. The shape of the wire is not specifically limited, and in addition to the wires having a circular cross sectional shape, ribbon shaped wires with, for example, an elliptical or a rectangular cross sectional shape may be used.

The wiring paths of the metal wires 32n, 32p are not specifically limited, but in view of the thermal resistance of the metal wires 32n, 32p and the calorific value of the light emitting element 1, the diameter and the length and of the metal wires 32n, 32p can be determined to prevent an excessive temperature rise of the light emitting element 1.

Moreover, as in the present embodiment, with the use of the metal wires 32n, 32p as the internal conductive member, the wiring paths can be set by choice, so that regardless of the positions of the n-side electrode 13 and the p-side electrode 15 of the light emitting element 1, connections between the n-side electrode 13 and the electrode for n-side external connection 34n, and between the p-side electrode 15 and the electrode for p-side external connection 34p can be easily established.

The joining of the metal wire 32n and the n-side electrode 13, and the joining of the metal wire 32p and the p-side electrode 15 can be obtained by using a wire bonder, but alternatively, ball bonding or wedge bonding may also be used. For example, in an example shown in FIGS. 3A and 3B, the metal wire 32p is joined with the p-side electrode 15 by ball bonding. In the case of ball bonding, an impact absorbing layer 15b is preferably provided as an upper surface to absorb impact at the time of wire bonding and reduce damage of the semiconductor stacked layer body 12.

In the example shown in FIGS. 3A, and 3B, the metal wire 32n is connected to the n-side electrode 13 by wedge bonding in a manner where a side surface of the end portion of the wire is connected to the n-side electrode. The example shown in FIGS. 3A and 3B illustrate an example of connecting method of wire and the method is not limited thereto. For example, at any electrodes, connection can be made by ball bonding, or made by wedge bonding. Particularly, with the use of wedge bonding, the metal wire 32 can be arranged in a curved state, so that the volume of metal present in the resin layer 31 can be increased. Accordingly, heat generated from the light emitting element 1 can be further efficiently conducted.

The electrode for n-side external connection 34n and the electrode for p-side external connection 34p are pad electrodes for joining the light emitting device 100 to an external mounting substrate, and disposed to be respectively electrically connected to the end surfaces of the metal wires 32n, 32p which are the internal conductive members. The electrode for n-side external connection 34n and the electrode for p-side external connection 34p are formed protruding from the side surface of the resin layer 31. Accordingly, even in the case where the end surfaces of the metal wires 32n, 32p exposed from the resin layer 31 have small planar dimensions, with providing the electrode for n-side external connection 34n and the electrode for p-side external connection 34p, the joining surface area at the time of mounting via a joining material can be increased. As a result, the joining property between the light emitting device 100 and the mounting substrate can be improved.

For the electrode for n-side external connection 34n and the electrode for p-side external connection 34p, in order to enhance joining with a mounting substrate, for example, with the use of an Au alloy-based joining material such as Au—Sn eutectic solder, at least the uppermost layers are preferably made of Au. For example, in the case where the metal wires 32n, 32p are made of a metal such as Cu or Al which is other than Au, in order to improve adhesion with Au, it is preferable that thin layer of Ni is formed by using an electroless plating method and an Au layer is formed stacked on the Ni layer. The electrode for n-side external connection 24n and the electrode for p-side external connection 34p may have a total thickness of about 0.1 µm to about 5 µm, and more preferably about 0.5 µm to about 4 µm.

Operation of Light Emitting Device

Next, with reference to FIG. 1A to FIG. 3B, the operation of the light emitting device 100 will be described. For convenience of illustration, the light emitting element 1 is assumed to emit blue light and the fluorescent material layer 2 is assumed to emit yellow light below.

In the light emitting device 100, upon connecting an external power source between the electrode for n-side external connection 34n and the electrode for p-side external connection 34p via a mounting substrate, through the metal wires 32n, 32p, electric current is supplied between the n-side electrode 13 and the p-side electrode 15 of the light emitting element 1. With the supply of electric current between the n-side electrode 13 and the p-side electrode 15, the light emitting layer 12a of the light emitting element 1 emits blue light.

The blue light emitted from the light emitting layer 12a of the light emitting element 1 propagates in the semiconductor stacked layer structure body 12 and discharged from the lower surface of the light emitting element 1. A portion of the discharged light is absorbed by the fluorescent material contained in the fluorescent material layer 2 and converted into a yellow light, then extracted to outside. Also, a portion of the blue light is transmitted through the fluorescent material layer 2 without absorbed by the fluorescent material, and then extracted to outside. The light propagating upward in the light emitting element 1 is reflected downward at the reflecting electrode 14a and is emitted from the lower surface of the light emitting element 1. Then, the yellow light and the blue light extracted to outside of the light emitting device 100 are mixed to produce a white light.

Method of Manufacturing Light Emitting Device

Figure 6:
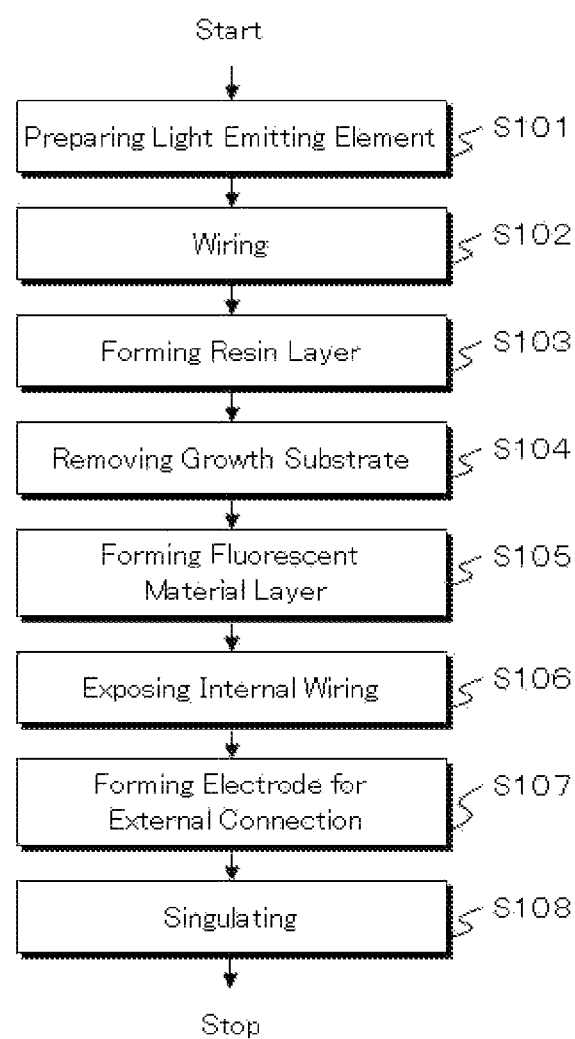
FIG. 6 is a flowchart showing the flow of operations of manufacturing a light emitting device according to a first embodiment of the present invention.

Next, with reference to FIG. 6, a method of manufacturing the light emitting device 1A will be described. As shown in FIG. 6, a method of manufacturing a light emitting device 100 includes, preparing light emitting element: S101, providing wiring: S102, forming resin layer: S103, removing growth substrate: S104, forming fluorescent material layer (forming wavelength converting layer: S105, exposing internal conductive member: S106, forming electrode for external connection: S107, and singulating: S108, and singulating: S111, which are performed in this order.

Now, with reference to FIG. 7A through FIG. 11B, (also, appropriately referring to FIG. 1A to FIG. 3B and FIG. 6), each operation will be described in detail below. In each drawing of FIG. 7A to FIG. 11B, a detailed configuration of the light emitting element 1 (for example, a protective layer 16 and a stacking structure of a semiconductor stacked layer structure body 12) are omitted for ease of visualization. Also, the sizes and the arrangement relationships of other members may be appropriately simplified or exaggerated. The above will be applied in a similar manner to the explanatory drawings of a method of manufacturing according to other embodiments to be described below.

The preparing light emitting element (preparing wafer): S101 includes, for example, preparing a light emitting element 1 having a configuration shown in FIGS. 3A and 3B. In the preparing light emitting element S101 of the present embodiment, a plurality of the light emitting elements 1 are fabricated on a growth substrate 11 in a state of wafer where they are disposed in arrays. In FIG. 7A through FIG. 11B, fabrication of two light emitting elements in the longitudinal direction (the X-axis direction) and four light emitting elements in the lateral direction are illustrated. In FIG. 7A through FIG. 11B, diagrams in a plan view and cross sectional views with plurality of diagrams are included, and the directions are indicated by coordinate axes in each drawing.

More specifically, with the use of the materials described above, a semiconductor stacked layer body 12 is formed by stacking an n-type semiconductor layer 12n, a light emitting layer 12a, and a p-type semiconductor layer 12p in this order on an upper surface of a growth substrate 11 made of sapphire or the like. Upon forming the semiconductor stacked layer body 12, etching is carried out on a portion of the upper surface of the semiconductor stacked layer body 12 to remove the p-type semiconductor layer 12p, the active layer, and a portion of the n-type semiconductor layer 12n so as to create a step difference portion 12b in which the n-type semiconductor layer 12n is exposed at the floor.

At the same time of forming the step difference portion 12b, etching may be carried out on the border regions of adjacent light emitting elements 1 to expose the n-type semiconductor layer 12n. Thus, in a later operation in the preparing light emitting element: S101, at least a side surface which includes the light emitting layer 12a can be covered with a protective layer 16. Further, at the border regions, the semiconductor stacked layer body 12 may be entirely removed to expose the growth substrate 11. Thus, in the singulating: S108, dicing of the semiconductor stacked layer body 12 becomes unnecessary, so that singulating can be performed easily by dicing only a layer made of the resin. In the example shown in FIG. 7A to FIG. 7D, the semiconductor stacked layer body 12 of the border regions (in FIG. 7A to FIG. 7D, regions in the vicinity of the virtual border lines 40 shown by thick broken lines) are completely removed.

Next, an n-side electrode 13 which serves as a pad electrode is disposed on the floor of the step difference portion 12b. Also, on the region to serve as the light emitting region which includes the p-type semiconductor layer 12p and the light emitting layer 12a, a whole surface electrode 14 constituted with a reflecting electrode 14a covering approximately entire upper surface of the p-type semiconductor layer 12p and a cover electrode 14b entirely covering the upper surface and the side surfaces of the reflecting electrode 14a is disposed. In addition, the p-side electrode 15 which is a pad electrode is disposed on a portion of the upper surface of the cover electrode 14b. Further, on the entire back surface of the wafer except for the surfaces of the n-side electrode 13 and the p-side electrode 15, for example, by way of sputtering and with the use of an insulating material such as SiO2, a protective layer 16 is formed. As described above, as shown in FIG. 7A to FIG. 7D, light emitting elements 1 in a wafer state are fabricated.

Figure 8A:
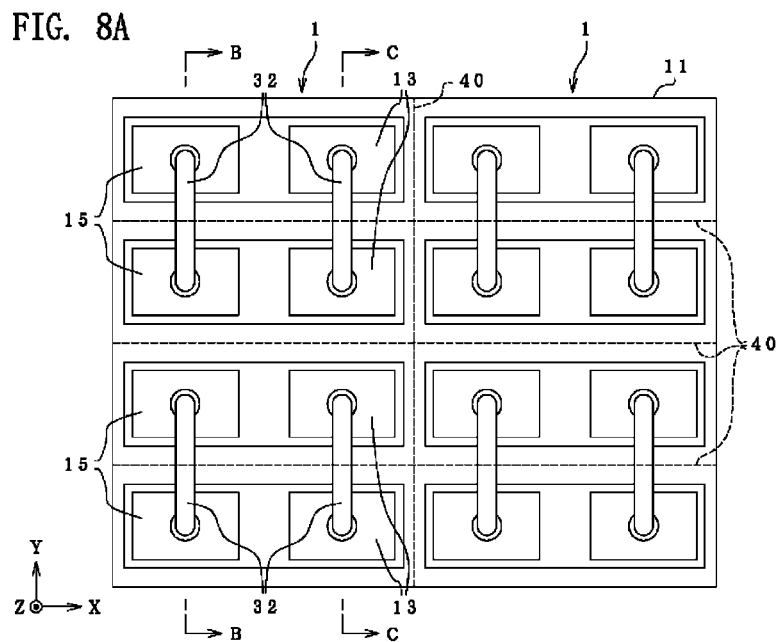
FIG. 8A to FIG. 8C are each a schematic diagram illustrating wiring in a manufacturing operations of a light emitting device according to a first embodiment of the present invention, where
Figure 8B:
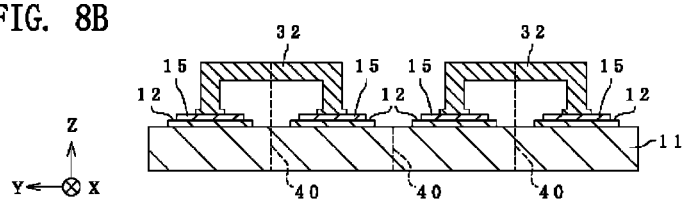
Figure 8C:
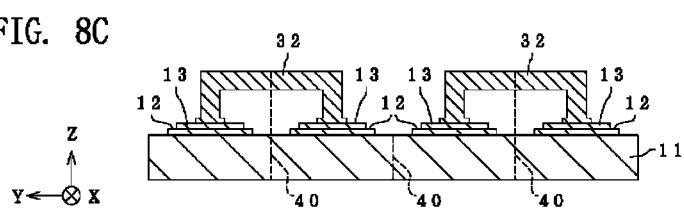

Next, in the providing wiring: S102, as shown in FIG. 8B to FIG. 8C, with respect to the light emitting elements on the growth substrate 11, along a direction in which the longitudinal side surfaces of the adjacent ones of the light emitting elements face with each other (that is, in the Y-axis direction), a metal wire 32 is provided using a wire bonder to connect between the n-side electrodes 13b and between the p-side electrodes 15 respectively. As shown in FIG. 8A and FIG. 8B, the metal wires 32 are arranged in an approximately rectangular bridge shape or an inverted U-shape (e.g. an approximately arch bridge shape) in a side view (observed from the X-axis direction). At this time, the maximum height (i.e. distance in the Z-axis direction) of the metal wires 32 of the n-side electrode 13 and the p-side electrode 15 from the joining surface is adjusted within a predetermined range.

Figure 9A:
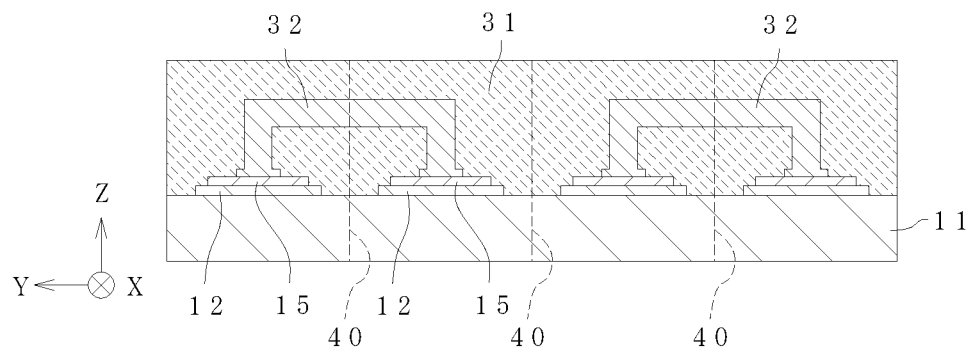
FIG. 9A to FIG. 9C are each a schematic cross sectional view illustrating a part of a manufacturing operations of a light emitting device according to a first embodiment of the present invention, where

In the embodiment, the upper limit of the height in the predetermined region is the height of the upper surface of the resin layer 31 shown in FIG. 1B to FIG. 2B. That is, as shown in FIG. 9A, the height is sufficient to enclose the metal wire 32 in the resin layer 31. The minimum height in the predetermined region is a height corresponding to a distance with which the lower end of the metal wires 32 and the lower surface of the semiconductor stacked body 12 to be separated from each other. The distance to be separated substantially corresponds to the distance between the fluorescent material layer 2 and the electrode for n-side external connection 34n or the distance between the fluorescent material layer 2 and the electrode for p-side external connection 34p, and for example, may be about 100 μm.

Next, in the forming resin layer: S103, as shown in FIG. 9A, by way of compression molding using a mold for example, the resin layer 31 is formed so as to completely enclose the light emitting elements 1 and the metal wires 32.

Figure 9B:
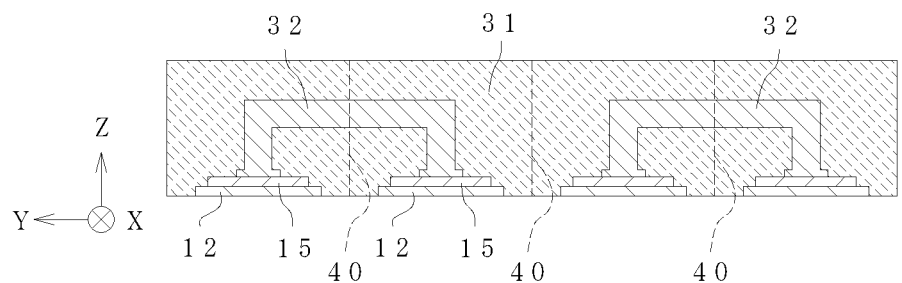

Next, in the removing growth substrate: S104, as shown in FIG. 9B, for example, using an LLO (laser lift off) method, a chemical lift off method, or the like, the growth substrate 11 can be separated and removed. At this time, the semiconductor stacked layer structure body 12 is reinforced by the support member 3 which has the resin layer 31 as its base material, so that damage such as cracks and splits can be avoided. The reduction in the thickness may be obtained by polishing the back surface without removing the growth substrate 11.

After the growth substrate 11 is removed, the exposed lower surface of the semiconductor stacked layer body 12 may be polished, and then roughened, for example, by using a wet etching method, so that a recess-projection shape 12c (FIG. 3B, FIG. 4B) may be formed. By polishing the surface, the growth substrate 11 which is peeled off can be reused as a growth substrate 11 for growing a crystal of a semiconductor stacked layer body 12.

Figure 9C:
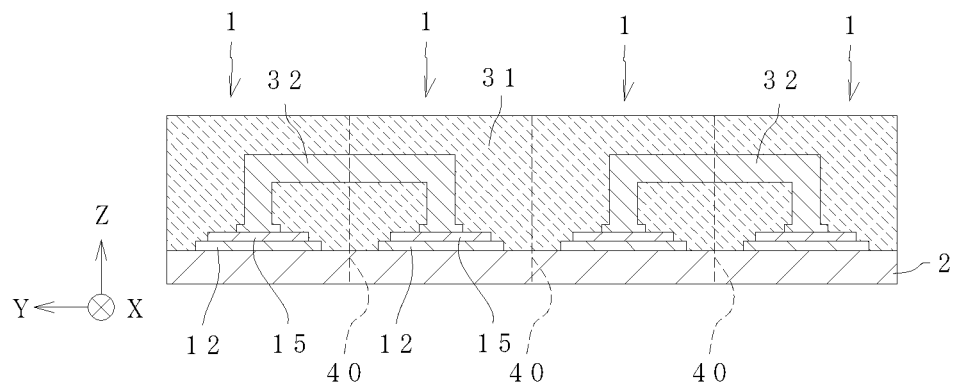

Next, in the forming fluorescent material layer (forming wavelength converting layer): S105, as shown in FIG. 9C, a fluorescent material layer 2 is formed on the lower surface side of the semiconductor stacked layer body 12. The fluorescent material layer 2 can be formed, for example as described above, by spray coating of a slurry which contains a resin and fluorescent material particles in a solvent. In the preparing light emitting element: S101, in the case where the semiconductor stacked layer body 12 in the border region of adjacent light emitting elements 1 is completely removed, the whole surfaces of the semiconductor stacked layer body 12 are resin-sealed with the fluorescent material layer 2 which is made of a resin and the first resin layer 31.

Figure 10A:
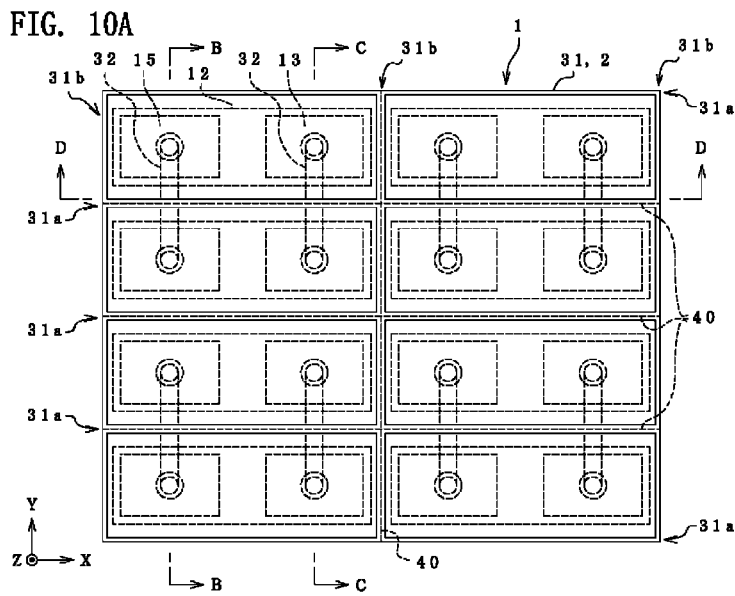
FIG. 10A to FIG. 10C are each a schematic diagram illustrating exposing internal conductive member in a manufacturing operations of a light emitting device according to a first embodiment of the present invention, where
Figure 10B:
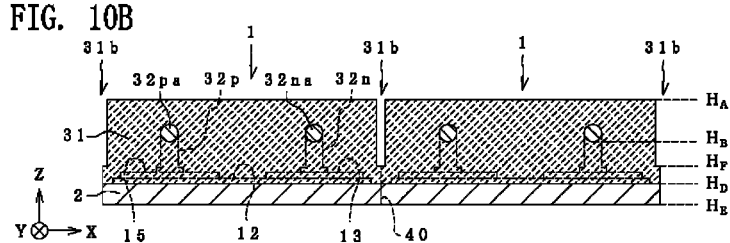
Figure 10C:
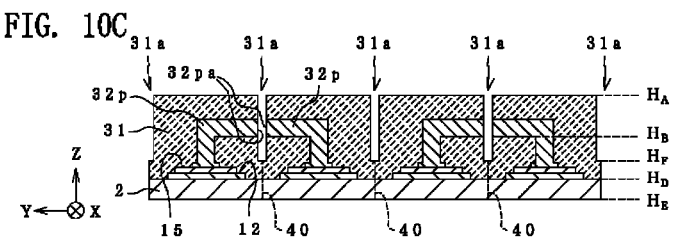

Next, in the exposing inner conductive member: S106, as shown in FIG. 10A to FIG. 10C, the grooves 31a and the grooves 31b are formed from the upper surface side along the virtual border lines 40. With this arrangement, the metal wires 32, which are the inner conductive members applied between adjacent two light emitting elements, are cut at the positions of the virtual border lines 40 to be separated in the metal wires 32n, 32p. The end surfaces 32na, 32pa of the cut metal wires 32n, 32p are exposed at the longitudinal side surfaces of the resin layers 31. The inner surface defining the grooves 31a become the longitudinal upper side surfaces, and the inner surface defining the grooves 31b become the lateral side surfaces of the light emitting devices 100.

As described above, in order to expose the cut surface of the metal wire 32 on a side surface of the resin layer 31, the grooves 31a are formed by removing at least a portion of resin layer made of the resin layer 31 and the fluorescent material layer 2 to a predetermined depth from the upper surface side of the resin layer 31, by dicing (half dicing). At this time, the grooves 31a are formed with a width which allows sufficient distribution of a plating solution to the exposed end surfaces of the 32na and 32pa of the metal wires 32n, 32p during electroless plating performed in the disposing electrode for external connection: S107 in a later operation. In the present operation, the grooves 31b which do not involve cutting or exposing of the metal wires 32 may be formed by half-dicing with a depth different from the grooves 31a, or it may be such that, without forming the grooves 31b in the present operation, full-dicing may be performed, in which the entire thickness direction is cut along the Y-axis in the singulating: S108.

As described herein and as shown in FIG. 10B and FIG. 10C, in the height direction (Z-axis direction), the position of the upper surface of the resin layer 31 is denoted by HA, the positions of the lower end of the exposed surfaces of the metal wires 32n, 32p are denoted by HB, the positions of the lower end of the grooves 31a (and the grooves 31b) formed by half-dicing are denoted by HF, the positions of the lower end of the light emitting elements 1 are denoted by HD, and the position of the lower end of the fluorescent material layer 2 is denoted by HE. The depth of the grooves 31a, that is, the lower limit (the shallow limit) of the position HF corresponds to the position HB. Thus, arranging the position HF lower than the position HB allows for complete cutting of the metal wire 32 so that the cut surface of the metal wire 32 can be exposed from the corresponding side surface of the resin layer 31. The upper limit (the deep limit) of the position HF allows for an adequate strength to maintain the wafer state through the later operations. The upper limit of the position HF can be appropriately determined by the rigidity of the resin, the joining strength of the resin layer 31 and the fluorescent material layer 2. For example, the position HE may be determined at ⅓ or more with respect to the total thickness of a sum of the thicknesses of the resin layer 31 and the fluorescent material layer 2. In the case where the semiconductor stacked layer body 12 is provided in the boundary region between the light emitting elements 1 or in the case where the growth substrate 11 is not removed and left in situ or with a reduced thickness, the grooves 31a and the grooves 31b may be formed by entirely removing the resin layer 31 in the thickness direction.

Figure 11A:
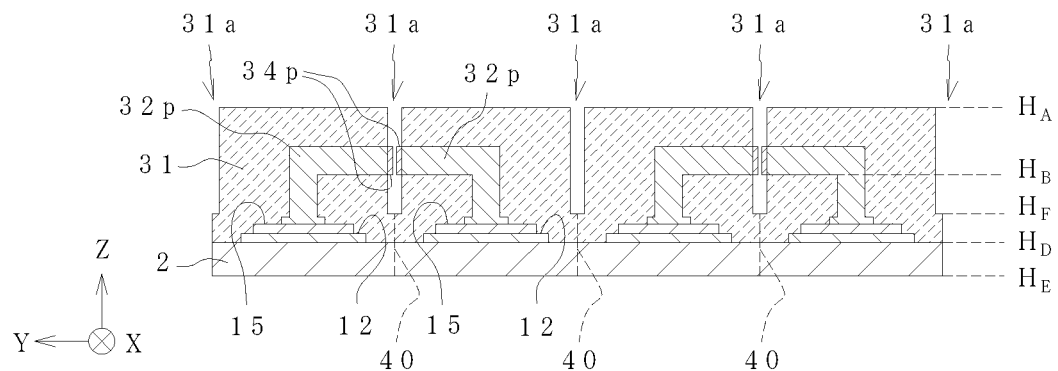
FIG. 11A and FIG. 11B are each a schematic cross sectional view corresponding to a portion taken along line B-B of FIG. 10A, showing a part of a manufacturing operations of a light emitting device according to a first embodiment of the present invention, where
Figure 11B:
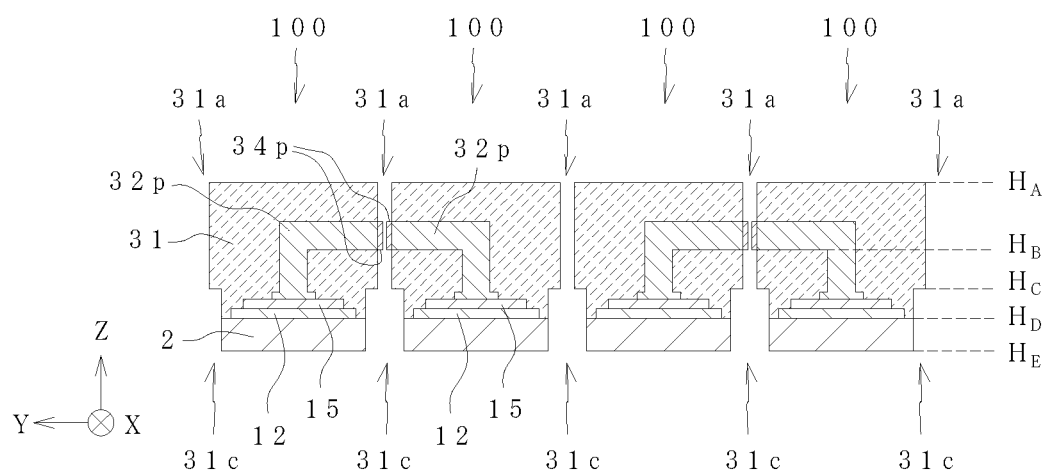

Next, in the disposing electrode for external connection: S107, as shown in FIG. 11A, the electrode for n-side external connection 34n and the electrode for p-side external connection 34p which are made of an Au layer are disposed on the end surfaces of the metal wires 32n, 32p (see FIGS. 10A to 10C). In the case where the metal wires 32n, 32p are made of Cu or Al, which is other than Au, in order to improve adhesion, a Ni layer is preferably disposed as the lower layer side, before disposing the Au layer. As described above, in the case where the electrode for n-side external connection 34n and the electrode for p-side external connection 34p are provided only on the end surfaces 32na, 32pa of the metal wires 32n, 32p, the electrode for n-side external connection 34n and the electrode for p-side external connection 34p can be disposed easily by using an electroless plating technique. The cross-section taken along line C-C in FIG. 10A is omitted for ease of illustration, but the inner conductive structures of the n-side can be formed in a similar manner as in the inner conductive structures of the p-side as shown in FIG. 11A.

At last, in the singulating: S108, dicing is carried out along the virtual border lines 40 (see FIG. 11A) from the lower surface side of the fluorescent material layer 2 to form the grooves 31c with a depth reaching to the lower end of each of the grooves 31a. In a similar manner, dicing is carried out from the lower surface side of the fluorescent material layer 2 to form the grooves reaching to the plane of the lower end of each of the grooves 31b. Accordingly, the light emitting devices 100 are singulated. In the case where the growth substrate 11 is left without being removed, or in the case where the semiconductor stacked layer body 12 is located in a region close to the virtual border lines 40, the growth substrate 11 and the semiconductor stacked layer structure 12 are also subjected to dicing.

At this operational stage, the expression "the grooves 31c with a depth reaching to the plane of lower end of each of the grooves 31a" refers that the position HC of the upper surface of the groove 31c is located higher or the same with respect to the position HF (see FIG. 11A) of the lower surface of the groove 31a. With this arrangement, the grooves 31a and the corresponding grooves 31c are connected and thus the light emitting devices 100 are separated.

The width of the grooves 31c is preferably wider than the width of the corresponding grooves 31a so that, in a plan view, the groove 31a is located at an inner side of the groove 31c. With this arrangement, even in the case where the center line of the groove 31a and the center line of the groove 31c are not in alignment with each other, reliable singulation can be achieved, and further, a step difference is formed with which the lower portion of a side surface of the light emitting device 100 which corresponds to the inner surface of the groove 31c is located at an inner side than the upper portion of the side surface of the light emitting device 100 which corresponds to the inner surface of the groove 31a. With this arrangement, in a longitudinal side surface which serves as the mounting surface of the light emitting device 100, the lower portion of the side surface is not located at an outer side than the upper portion of the side surface where the electrode for n-side external connection 34n and the electrode for p-side external connection 34p are provided. Accordingly, at the time of mounting, adhesion of the electrode for n-side external connection 34n and the electrode for p-side external connection 34p with the conductive pattern of the mounting substrate or the like is not decreased by the lower surface, so that the light emitting device 100 can be mounted with high reliability. Also, with the formation of the step difference, a space is created between the mounting surface of the mounting substrate and the lower portion of the side surface of the light emitting device 100, so that creeping of the adhesive material onto the fluorescent material layer 2 can be prevented at the time of mounting. According to the operations described above, the light emitting device 100 shown in FIGS. 1A, 1B and FIGS. 2A, 2B can be completed.

The width of the grooves 31c may be narrower than the width of the corresponding grooves 31a so that, in a plan view, the groove 31c is located at an inner side of the groove 31a. With this arrangement, a step difference is formed so that the upper portion of the side surface of the light emitting device 100 is located at an inner side than the lower portion of the side surface in a plan view. Forming the side surface, which serves as the mounting surface of the light emitting device 100 as described above, the spread of adhesive material can be held by the step difference, so that the adhesive material can be suppressed from creeping onto the fluorescent material layer 2.

That is, the side surface of the resin layer 31 on which the electrode for n-side external connection 34n and the electrode for p-side external connection 34p are disposed is configured so that the lower portion of the side surface, which includes the end portion of the side (lower surface side) where the light emitting element 1 is disposed, and the upper portion of the side surface on which the electrode for p-side external connection 34n and the electrode for p-side external connection 34p are disposed are arranged in different planes, which allows for, at the time of mounting, suppressing of the adhesive material from creeping onto the fluorescent material layer 2 which serves as the light extracting surface.

Variant Example
Configuration of Light Emitting Device

Figure 12:
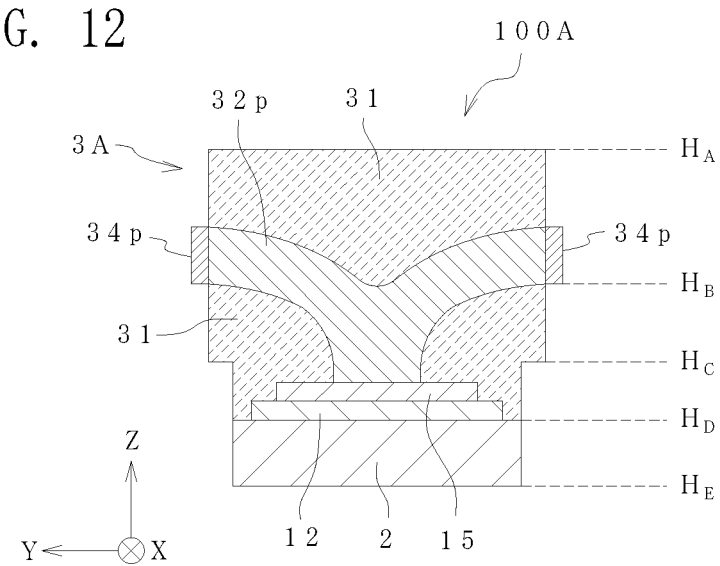
FIG. 12 is a cross-sectional view schematically showing a configuration of a light emitting device according to a first embodiment of the present invention.

Next, with reference to FIG. 12, a light emitting device according to a variant example of the first embodiment will be described. As shown in FIG. 12, the light emitting device 100A has a structure in which, compared to the light emitting device 100 shown in FIGS. 1A, 1B, and FIGS. 2A, 2B, where the electrode for n-side external connection 34n and the electrode for p-side external connection 34p are provided on one longitudinal side surface, the electrode for n-side external connection 34n and the electrode for p-side external connection 34p are provided on different longitudinal side surfaces. The cross-section showing the n-side inner conductive structure is omitted for ease of illustration, but it is formed in a similar structure as in the p-side inner conductive structure as shown in FIG. 12.

Accordingly, the light emitting device 100A has a support member 3A in place of the support member 3 in the light emitting device 100. In the support member 3A, the metal wire 32p, which is an inner conductive member is arranged in a T-shape where the lower end corresponds to a stem portion of a T-shape is joined to the p-side electrode 15 and the both ends of the portion corresponds to a lateral portion of the T-shape, are respectively reaching the longitudinal side surfaces of the resin layer 31. Each of the end surfaces of the metal wire 32p is provided with an electrode for p-side external connection 34p. In a similar manner as in the metal wire 32p, the metal wire 32n is also arranged in a T-shape and each of the lateral end surfaces is provided with an electrode for n-side external connection 34n. Except those described above, the light emitting device 100A has a similar configurations as those in the light emitting device 100, so that description will be omitted.

Operation of Light Emitting Device

The light emitting device 100A according to the present variant example has the electrode for n-side external connection 34n and the electrode for p-side external connection 34p disposed on different longitudinal side surfaces and the corresponding metal wires 32n, 32p are provided respectively. Accordingly, the light emitting device 100A can be mounted on the mounting substrate with either longitudinal side surface being a possible mounting surface. Upon being supplied with electric power through the electrode for n-side external connection 34n and the electrode for p-side external connection 34p, which are used in the mounting, the operation of the light emitting device 100A will be similar to that of the light emitting device 100, so that detailed description on the operation will be appropriately omitted.

Method of Manufacturing Light Emitting Device

Next, a method of manufacturing a light emitting device 100A according to the present variant example will be described below. The light emitting device 100A according to the present variant example can be manufactured by changing the arrangement of the wires 32 in the providing wiring: S102 according to the method of manufacturing a light emitting device 100 of the first embodiment as shown in FIG. 6.

Figure 13A:
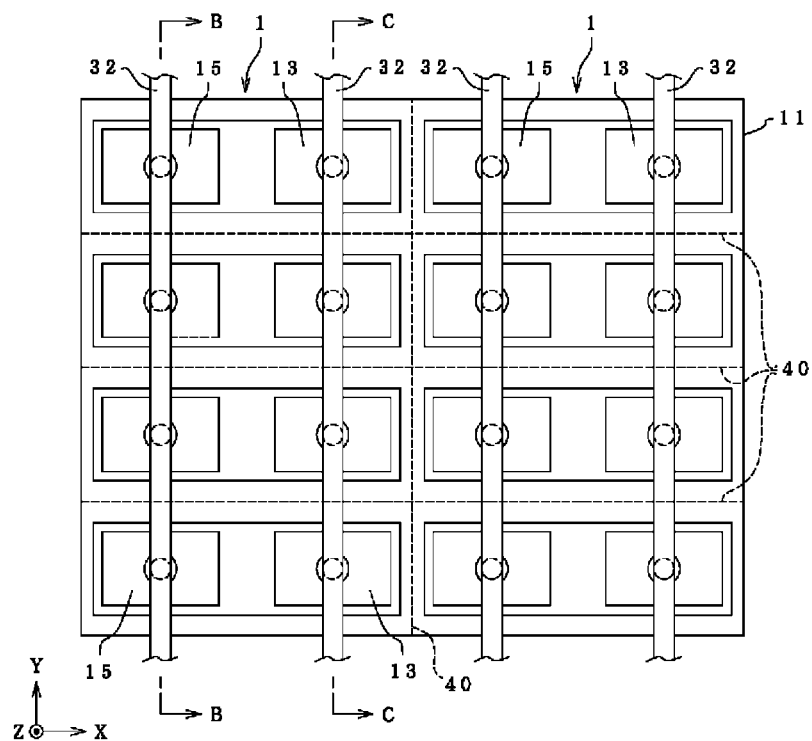
FIG. 13A and FIG. 13B are each a schematic diagram illustrating wiring in a manufacturing operations of a light emitting device according to a variant example of a first embodiment, where
Figure 13B:
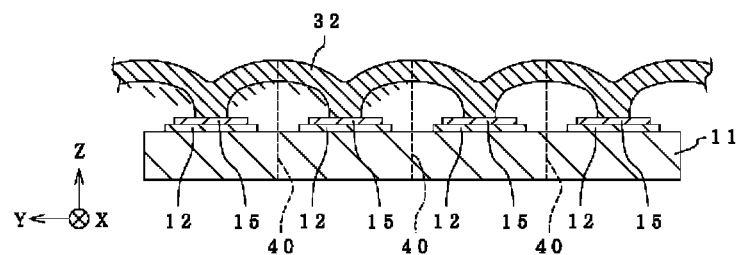

Next, with reference to FIGS. 13A, 13B, providing wiring: S102 according to the present variant example will be described. As shown in FIGS. 13A, 13B, using a single metal wire 32, adjacent ones of the p-side electrodes of the plurality of light emitting elements 1 aligned in the Y-axis direction are joined in order by wedge bonding using a side surface of the metal wire 32 At this time, as shown in FIG. 13B, the metal wire 32 is arranged in the shape of an arch across each of the virtual border lines 40 in the lateral direction (the X-axis direction) of the light emitting elements 1. In a similar manner, the metal wire 32 is arranged between the n-side electrodes 13. Other operations can be performed in a similar manner as in the light emitting device 100 according to the first embodiment to manufacture the light emitting device 100A shown in FIG. 12, so that the description will be omitted.

Alternatively, arrangement of the wire may be such that the corresponding electrodes of adjacent two light emitting elements 1 are joined by the metal wire 32 successively. The method for arranging the wire in this manner will be described below. In the example shown in FIGS. 8A to 8C, the metal wire 32 is arranged between the n-side electrodes 13 and between the p-side electrodes 15 of adjacent two light emitting elements 1. For example, focusing on the light emitting elements 1 disposed in the second row, the metal wires 32 are arranged only with the respective adjacent light emitting elements 1 disposed in the first row. In addition, the metal wire 32 are arranged between adjacent ones of the light emitting elements 1 disposed in the second row and the light emitting elements 1 disposed in the third row. With such a wiring arrangement, the end surfaces of the metal wires 32 can be arranged reaching to the respective sides of the longitudinal side surfaces of the resin layer 31 of the light emitting device 100A.

Second Representative Embodiment

Configuration of Light Emitting Device

Next, with reference to FIGS. 14A, 14B and FIGS. 15A, 15B, a light emitting device according to the second embodiment will be described. As shown in FIG. 14A to FIG. 15B, the light emitting device 100B according to a second embodiment includes a light emitting element 1, a fluorescent material layer 2, and a support member 3B. The light emitting device 100B according to the second embodiment differs from the light emitting device 100 according to the first embodiment shown in FIG. 1A to FIG. 2B in which the light emitting device 100B has a support member 3B in place of the support member 3.

The light emitting element 1 and the fluorescent material layer 2 can be similar as that used in the light emitting device 100 according to the first embodiment, so that detailed description thereof will be omitted.

The support member 3B according to the present embodiment includes, a resin layer 31 which is constituted with stacking of, in order from the light emitting element 1 side, a first resin layer 311 which includes an internal conductive members of first metal plated layers 331n, 331p therein, and a second resin layer 312 which includes an internal conductive members of second metal plated layers 332n, 332p. Also, on the side surface of the support member 3B, a step difference is formed with the position HC in the height direction (the Z-axis direction) as a boundary so that the portion lower than the position HC is at an inner side than the upper portion in a plan view. The fluorescent material layer 2 disposed connecting to the lower surface side of the support member 3B is in a plan view, formed in a similar shape as in the bottom surface of the support member 3B.

Further, at regions above the position HC of the support member 3B, the electrode for n-side external connection 34n and the electrode for p-side external connection 34p, which are respectively electrically connected to the second metal plated layers 332n, 332p which serve as internal conductive members, are disposed so as to cover the respective side surfaces and the upper surface of the support member 3B, except for a region between the electrodes. With this configuration, the light emitting device 100B allows for a side-view type mounting with its either longitudinal side surface as the mounting surface, and moreover, also allows for a top-view type mounting with its upper surface as the mounting surface.

The resin layer 31 is constituted by stacking a first resin layer 311 and a second resin layer 312 as described above. The first resin layer 311 includes first metal plated layers 331n, 331p which are internal conductive members respectively disposed penetrating in the thickness direction (the Z-axis direction). The position HC which is the border of the step difference at the side surfaces as described above, is arranged between the upper end position HB and the lower end position HD. The second resin layer 312 includes second metal plated layers 332n, 332p which are internal conductive members respectively disposed to be exposed at the lower surface, longitudinal side surface, and short-side side surfaces of the second resin layer 312. The first layer 311 and the second resin layer 312 are well adhered to each other and integrated to form the resin layer 31.

The resin material used for the first resin layer 311 and the second resin layer 312 may be different, but it is preferable to use the same material to obtain better adhesiveness. For the resin materials of the first resin layer 311 and the second resin layer 312, the resin materials similar to those described in the first embodiment can be used.

In order to enhance thermal conductivity, a heat conducting member may be contained in the first resin layer 311 and/or the second resin layer 312. For the first resin layer 311 and/or the second resin layer 312, a white resin made of a light transmissive resin material contained with a reflecting filler may be used.

With the use of a white resin at least for the first resin layer 311 which is joined to the upper surface of the light emitting element 1 so that the first resin layer 311 can serve as a light reflecting layer, leaking light from the upper surface and the side surfaces of the light emitting element 1 can be reflected and returned into the light emitting element 1, so that the light extraction efficiency of the lower surface which is the light extracting surface of the light emitting element 1 can be improved. In this case, for thermally-conducting member to be contained in the second resin layer 312, a material which does not have light-reflecting properties such as carbon black can also be suitably used.

In the present embodiment, the internal conductive members for electrically connecting the n-side electrode 13, the p-side electrode 15 and the electrode for n-side external connection 34n, the electrode for p-side external connection 34p are constituted by stacking a first metal plated layer 331n, 331p and a second metal plated layer 332n, 332p, respectively.

The first metal plated layers 331n, 331p are disposed penetrating the first resin layer 311 in the thickness direction and respectively electrically connected to the upper surfaces of the n-side electrode 13 and the p-side electrode 15. In a plan view, the first metal plated layer 331n, 331p are smaller than the corresponding second metal plated layers 332n, 332p so as to be located inner side of the outline of the second metal plated layers 332n, 332p. Also, at the side surfaces of the first resin member 311, the first metal plated layer is disposed with a size so as not to be exposed from the first resin layer 311 at portions lower than the position HC in the height direction. In an example shown in FIGS. 14A, 14B, the first metal plated layers 331n, 331p respectively has a quadrangular prism-shape with a rectangular shape in a plan view, but it is not limited thereto, a cylindrical shape, a polygonal columnar shape, or the like, may be employed.

Figure 14A:
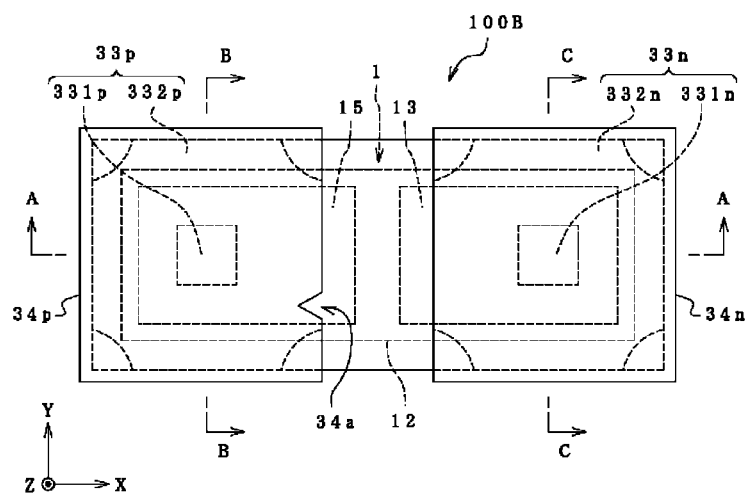
FIGS. 14A and 14B are schematic diagram showing an example of a configuration of a light emitting element according to a second embodiment of the present invention, where
Figure 14B:
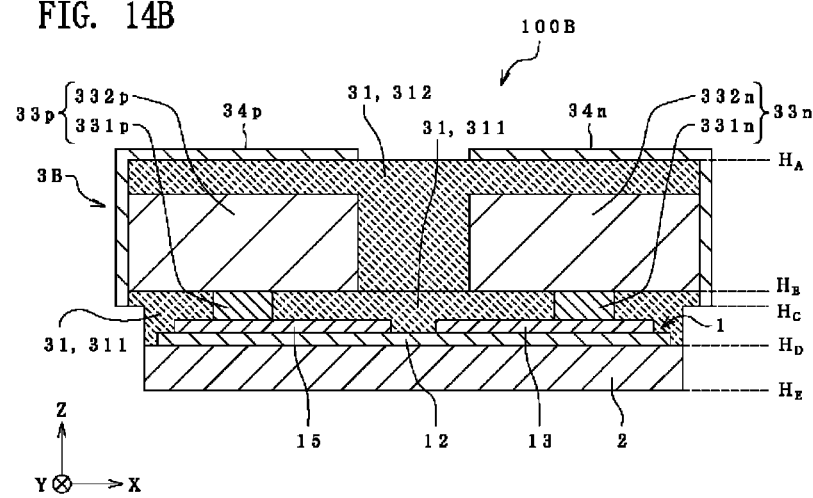

The second metal plated layers 332n, 332p are disposed in the second resin layer 312, with their lower surfaces being electrically connected to the first metal plated layers 331n, 331p of corresponding polarity. The second metal plated layers 332n, 332p have a columnar structure which has a shape in a plan view, as shown in FIG. 14A, an approximately square shape with each corner edge removed to achieve a concave arc shape. Except for the four corner portions with the concave arc shape and the surfaces of the second metal plated layer 332n and the second metal plated layer 332p facing each other, the side surfaces of the second metal plated layers 332n, 332p are not covered with the second resin layer 312 and respectively formed co-planar with corresponding ones of the three side surfaces of the second resin layer 312. Also, the upper surfaces of the metal plated layers 332n 332p are covered with the second resin layer 312. Removing the four corners as described above allows for an improvement of the adhesion between the second metal plated layers 332n, 332p and the second resin layer 312, and also for an increase in the joining area between the first resin layer 311 and the second resin layer 312. Thus, the resin layer 31 can be firmly integrated.

The first metal plated layers 331n, 331p and the second metal plated layers 332n, 332p can be formed by using an electrolytic plating method, in which, a metal material having good electrical conductivity and good thermal conductivity is preferably used. Examples of such a metal material include Cu, Au, Ni, and Pd. Of those, Cu, which is an inexpensive and has relatively high electrical conductivity and thermal conductivity, can be suitably used.

The electrode for n-side external connection 34n and the electrode for p-side external connection 34p are disposed to cover the portions of the side surfaces of the second metal plated layers 332n, 332p which are not covered with the second resin layer 312, except for the region between the electrode for n-side external connection 34n and the electrode for p-side external connection 34p, to be extended on the side surfaces to a portion above the position HC and to the upper surfaces. The distance between the electrode for n-side external connection 34n and the electrode for p-side external connection 34p is preferably 200 µm or greater. With this arrangement, occurrence of short circuits due to the conductive adhesive material at the time of mounting can be prevented. Further, as shown in FIG. 14A, a notch 34a for indicating a polarity is formed in a portion of the electrode for p-side external connection 34p at the upper surface side.

The electrode for n-side external connection 34n and the electrode for p-side external connection 34p can be formed by using a sputtering method or an electroless plating method. In the case of forming the electrode for n-side external connection 34n and the electrode for p-side external connection 34p by sputtering, for example, with the use of Au, in the case where the second metal plated layers 332n, 332p are made of a metal other than Au, for example, made of Cu, in order to improve the adhesion with the second metal plated layers 332n, 332p, it is preferable that a Ni layer is formed as an under layer and an Au layer is stacked on the Ni layer. Also, after forming the layer by sputtering, an Au layer may further be disposed by using electroless plating. Accordingly, the electrode for n-side external connection 34n and the electrode for p-side external connection 34p which hardly developing detachment can be formed. In the case where the electrode for n-side external connection 34n and the electrode for p-side external connection 34p are formed only on the side surfaces of the second metal plated layers 332n, 332p, an Au layer may be formed by using an electroless plating method.

Figure 15A:
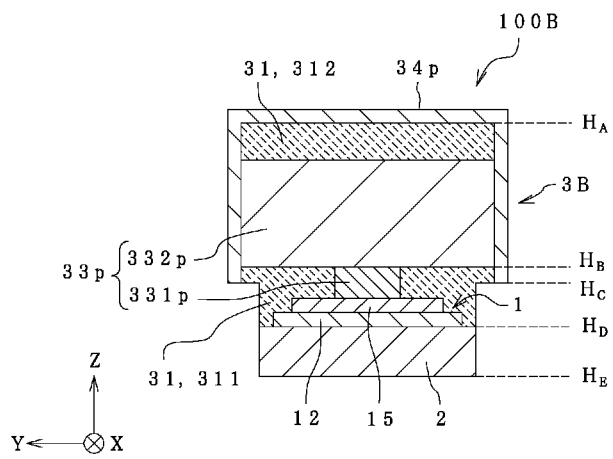
FIG. 15A is a schematic cross sectional view taken along line B-B of FIG. 14A.
Figure 15B:
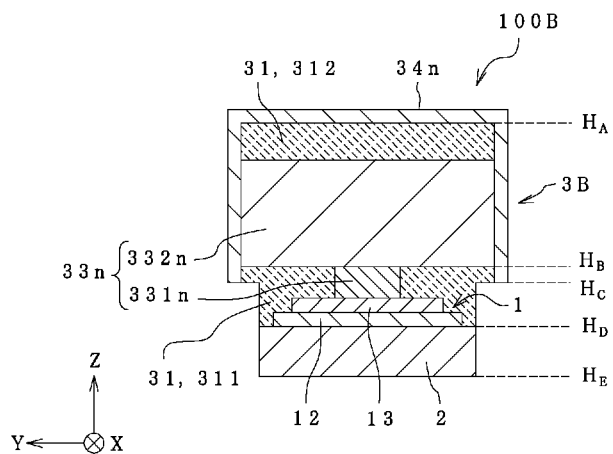
FIG. 15B is a schematic cross-sectional view taken along line C-C of FIG. 14A.
Figure 16:
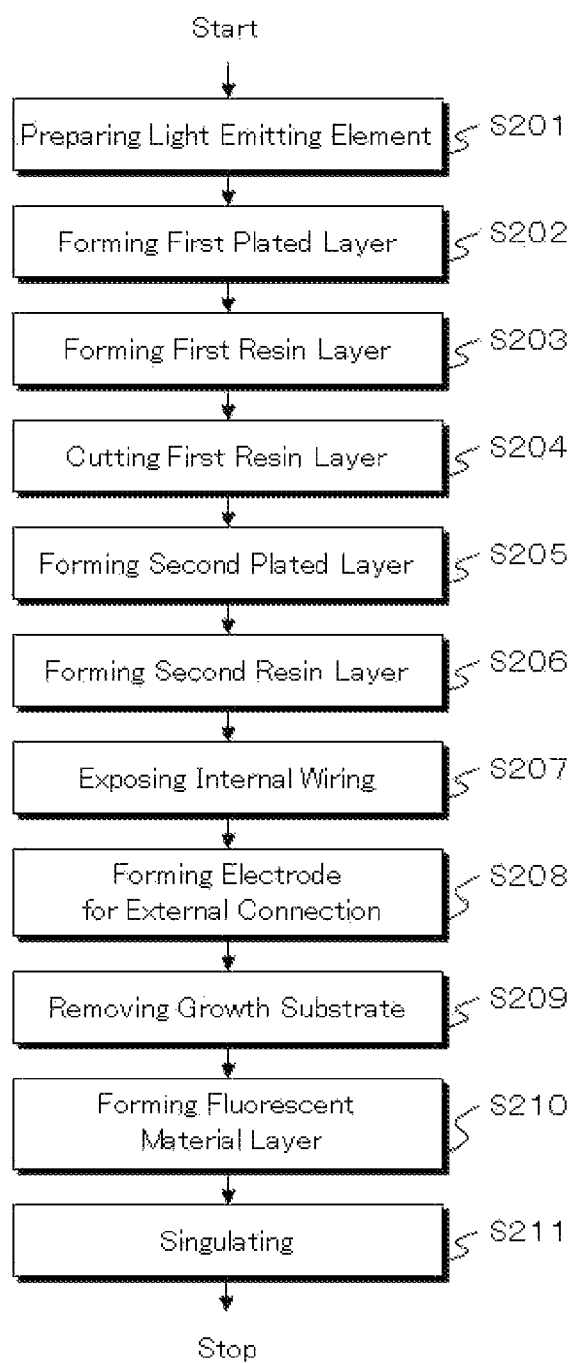
FIG. 16 is a flowchart showing the flow of operations of manufacturing a light emitting device according to a second embodiment of the present invention.

As in an example shown in FIGS. 15A, 15B and FIG. 16, disposing the electrode for n-side external connection 34n and the electrode for p-side external connection 34p respectively in a wider area, not only on the exposed portions of the second metal plated layers 332n, 332p which are the internal conductive members but also extended on the side surfaces and the upper surface of the resin layer 31, reliable joining at the time of mounting and heat dissipation performance can be improved.

The electrode for n-side external connection 34n and the electrode for p-side external connection 34p are not limited to be formed extending on the side surfaces and the upper surface of the resin layer 31. For example, the electrode for n-side external connection 34n and the electrode for p-side external connection 34p may not be provided on the upper surface of the resin layer 31, but provided only on the longitudinal side surface which is designated to the mounting surface, or alternatively, those can be disposed only on the side surfaces which are not covered with the second resin layer 312 of the second metal plated layers 332n, 332p. It may be such that, a part or the entirety of the upper surfaces of the second metal plated layers 332n, 332p are not covered with the second resin layer 312 so that directly connected to the electrode for n-side external connection 34n and the electrode for p-side external connection 34p respectively.

Operation of Light Emitting Device

The light emitting device 100B according to the second embodiment is mounted on the mounting substrate with one of the longitudinal side surfaces or with the upper surface as the mounting surface. At this time, the electric power is supplied through the electrode for n-side external connection 34n and the electrode for p-side external connection 34p which are disposed on the mounting surface. In the light emitting device 100B, upon being supplied with electric power through the electrode for n-side external connection 34n and the electrode for p-side external connection 34p, through the second metal plated layers 332n, 332p and the first metal plated layers 331n, 331p, the electric power is supplied between the n-side electrode 13 and the p-side electrode 15. The operation of the light emitting device 100B thereafter is similar to that of the light emitting device 100 according to the first embodiment, so that description thereof will be omitted.

Method of Manufacturing Light Emitting Device

Next, a method of manufacturing the light emitting device 100B shown in FIGS. 14A, 14B and FIGS. 15A, 15B will be described with reference to FIG. 16. As shown in FIG. 16, a method of manufacturing a light emitting device 100B includes, preparing light emitting element: S201, forming first plated layer S202, forming first resin layer: S203, cutting first resin layer: S204, forming second plated layer: S205, forming second resin layer: S206, exposing internal conductive member: S207, disposing electrode for external connection: S208, removing growth substrate: S209, forming fluorescent material layer (forming wavelength converting layer: S210, and singulating: S211, which are performed in this order.

Now, with reference to FIGS. 17A to 17C, FIGS. 18A to 18C, FIGS. 19A, 19B, FIGS. 20A to 20C, FIGS. 21A to 20C, FIGS. 22A, 22B, FIGS. 23A, 23B, and FIGS. 24A, 24B (also, appropriately referring to FIGS. 14A, 14B, FIG. 15A, 15B, and FIG. 16), each operation will be described in detail below. The preparing light emitting element: S201, which may be performed first, can be similar to the preparing light emitting element: S101 in the first embodiment, so that description thereof will be omitted.

Figure 17A:
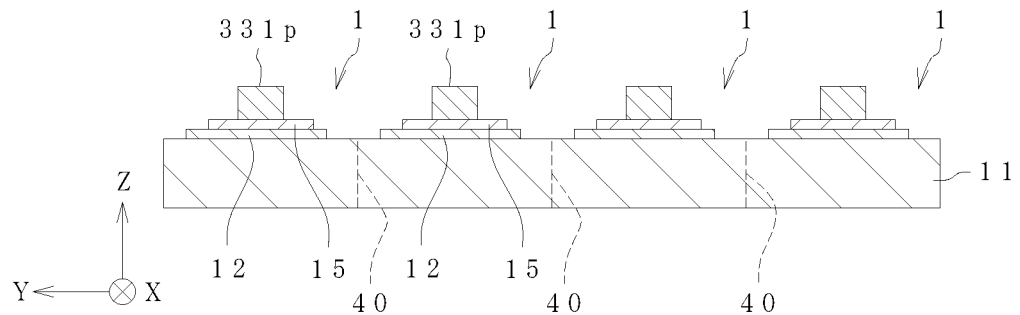

Next, in the forming first plated layer: S202, as shown in FIG. 17A, a first metal plated layer 331p is disposed on the predetermined region of each of the p-side electrodes 15 using electrolytic plating. At this time, the first metal plated layers 331p are respectively formed higher than a predetermined height. The term "predetermined height" used herein refers to a height of the first resin layer 311 in completion, which is a height of a virtual cutting line 41 shown by the broken line in FIG. 17B. The first metal plated layers 331n is disposed on the predetermined region of each of the n-side electrodes 13 by using electrolytic plating.

This forming first plated layer: S202 includes six sub-processes. In a first sub-process (forming first resist pattern), using a photolithography method, a first resist pattern having openings in conformity to the upper surfaces of the n-side electrodes 13 and the upper surfaces of the p-side electrodes 15 is formed on the upper surface of the wafer. The term "predetermined region" used herein refers to a region on each of the n-side electrodes 13 and the p-side electrodes 15, which is the same region where the first metal plated layer 331n or 332p to be disposed, or a region which includes the region where the first metal plated layer 331n or 332p to be disposed. The photolithography method is a technique of disposing a resist pattern using a photoresist which is a photosensitive resin, and the method may include applying photoresist, exposing, and developing.

Next, in a second sub-process (forming seed layer), a seed layer is formed on the entire upper surface of the wafer, that is, on the resist mask, the n-side electrode 13, and the p-side electrode 15, which are formed in the first sub-process, thin layers of Ni and Au are formed in this order by using a sputtering method. Next, in a third sub-process (forming plated layer), using an electrolytic plating method and using the seed layer which is formed in the second sub-process, as a plating current path, a plated layer is formed on the seed layer. At this time, the plated layer is formed so that the height of the upper surface of the plated layer is at least higher than the intended cutting lines 41 shown by broken line 41 in FIG. 17B.

Next, in a fourth sub-process (forming second resist pattern), using a photolithography method, a second resist pattern is formed on the upper surface of the plated layer which is formed in the third sub-process, to cover the regions designated for the first metal plated layers 331n, 331p. Next, in a fifth sub-process (etching), using the second resist pattern as a mask, the plated layer 33b and the sheet layer 33a are removed by, for example, wet etching. Accordingly, the first metal plated layer 331n, 331p are patterned.

Further, in a sixth sub-process (removing resist pattern), by ashing and a chemical treatment, the first resist pattern and the second resist pattern are removed to complete the patterned first metal plated layers 331n, 331p, as shown in FIG. 17A.

Since the seed layer is a sufficiently thin layer compared to the plated layer, in the specification, for convenience of explanation, the seed layer and the plated layer may be collectively referred to as "first metal plated layers 331n, 331p". The second metal plated layers 332n, 332p and other metal plated layers 33n, 33p in other embodiments can be formed in a similar manner.

The patterning of the first metal plated layers 331n, 332p can also be performed as described below, without using etching. That is, after forming the seed layer in the second sub-process, by using a photolithography method, a resist pattern having openings corresponding to the regions designated to form the first metal plated layers 331n, 331p is formed. Next, using the seed layer as a current path, a plated layer if formed using an electrolytic plating method. The metal layers disposed in the respective openings of the resist pattern have predetermined shapes of the first metal plated layers 331n, 331p. Then, the resist pattern is removed to complete the first metal plated layers 331n, 331p.

Figure 17B:
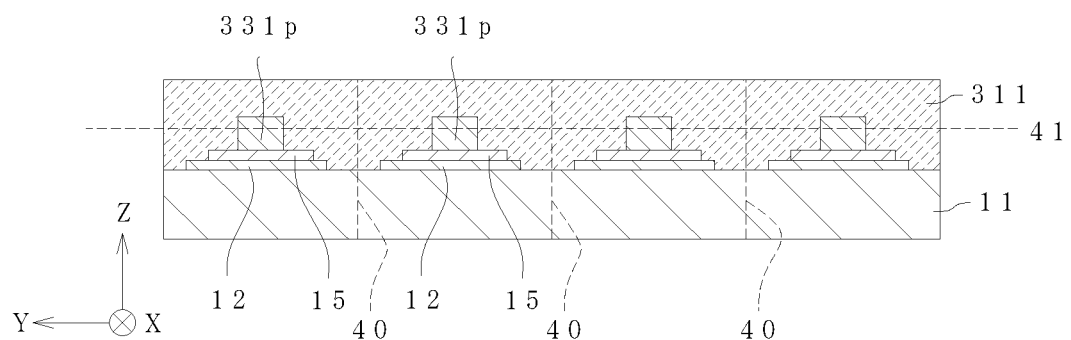

Next, in the forming first resin layer: S203, as shown in FIG. 17B, the first resin layer 311 is formed so as to cover the upper surfaces of the first metal plated layer 331n, 331p (to at last higher than the virtual cutting line 41). The first resin layer 311 can be formed in a similar manner as in the forming resin layer: S103 in the first embodiment, so that the detailed description will be omitted. The cross-section showing the n-side inner conductive structure which includes the n-side electrode 13 and the first metal plated layer 331n is omitted for ease of illustration, but it is formed in a similar structure as in the p-side inner conductive structure as shown in FIG. 17B.

Figure 17C:
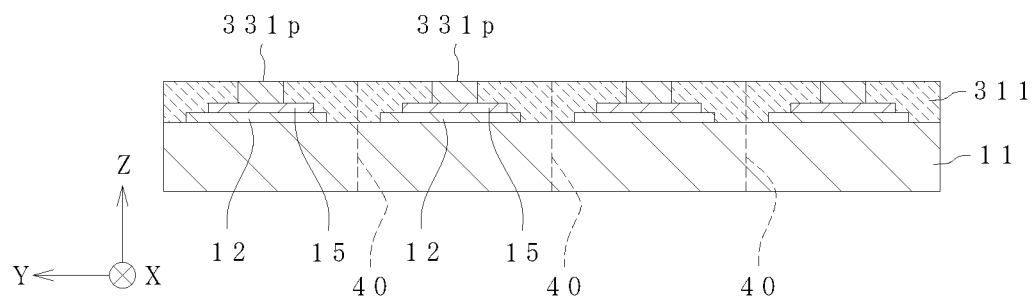

Next, in the cutting first resin layer: S204, using a cutting machine, together with the first metal plated layers 331n, 331p which are contained therein, the first resin layer 311 is cut from the upper surface side to the thickness indicated by the virtual cutting line 41. Accordingly, as shown in FIG. 17C, the upper surfaces of the first metal plated layers 331n 331p are exposed substantially in a same plane with the upper surface of the first resin layer 311. The cross-section showing the n-side conductive structure which includes the n-side electrode 13 and the first metal plated layer 331n is omitted for ease of illustration, but it is similar as in the p-side conductive structure shown in FIG. 17C.

Figure 18A:
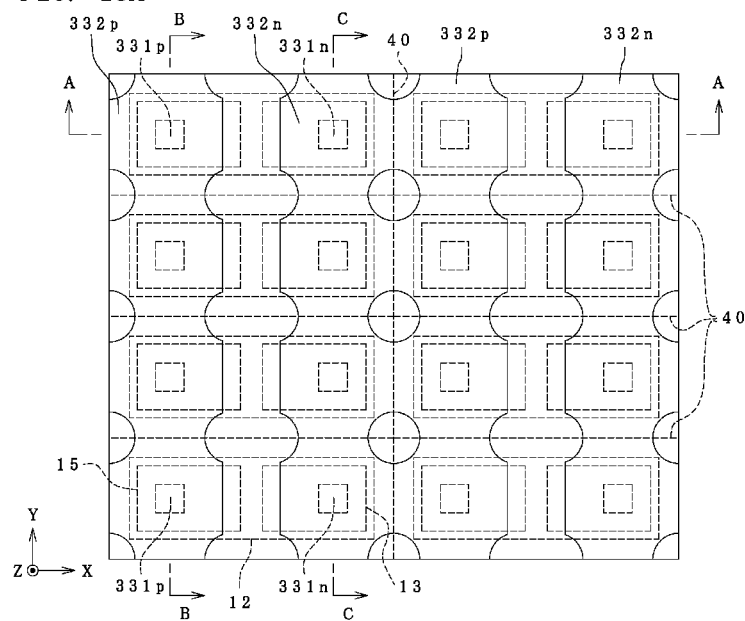
FIG. 18A to FIG. 18C are each a schematic diagram illustrating forming a second plated layer in a manufacturing operations of a light emitting device according to a second embodiment of the present invention, where
Figure 18B:
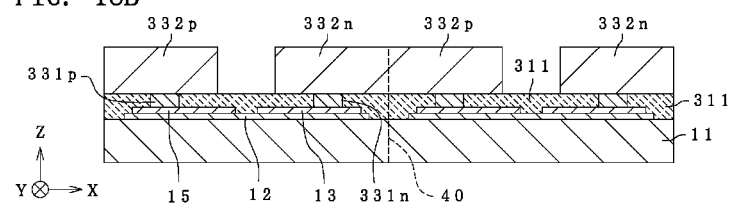
Figure 18C:
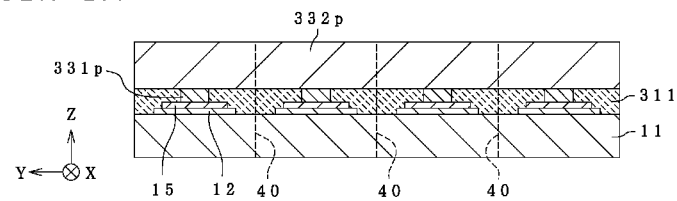

Next, in the forming second plated layer: S205, as shown in FIGS. 18A to 18C, a second metal plated layers 332n, 332p are formed on the first resin layer 311. The forming second plated layer: S205 can be performed in a similar manner as in the forming first plated layer: S202. First, a seed layer is formed on the upper surface of the first resin layer 311 and the entire of the upper surfaces of the first metal plated layers 331n, 331p, in a similar manner as in the second sub-operation in the forming first plated layer: S202. Next, on an upper surface of the seed layer, a second resist pattern having openings corresponding to the regions designated to form the metal plated layers 332n, 332p is formed. Then, performing manufacturing processes similar to the third sub-process to the sixth sub-process in the forming first plated layer: S202, the second metal plated layers 332n, 332p can be formed. Alternatively, the patterning of the second metal plated layers 332n, 332p can also be performed by using a photolithography method, disposing a resist pattern having openings in conformity to the shapes of the second metal plated layers 332n, 332p, and using an electrolytic plating method, disposing a metal layer in the openings of the rests pattern.

Figure 19A:
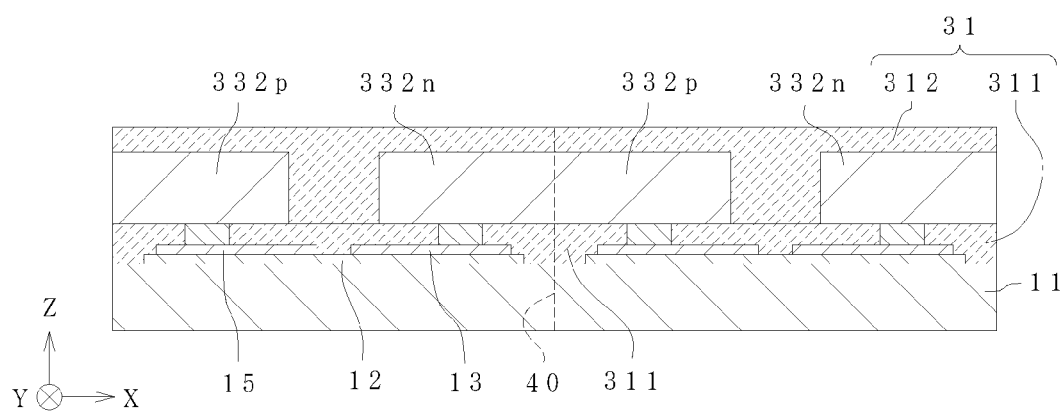
FIG. 19A and FIG. 19B are each a schematic diagram illustrating forming a second resin layer in a manufacturing operations of a light emitting device according to a second embodiment of the present invention, where
Figure 19B:
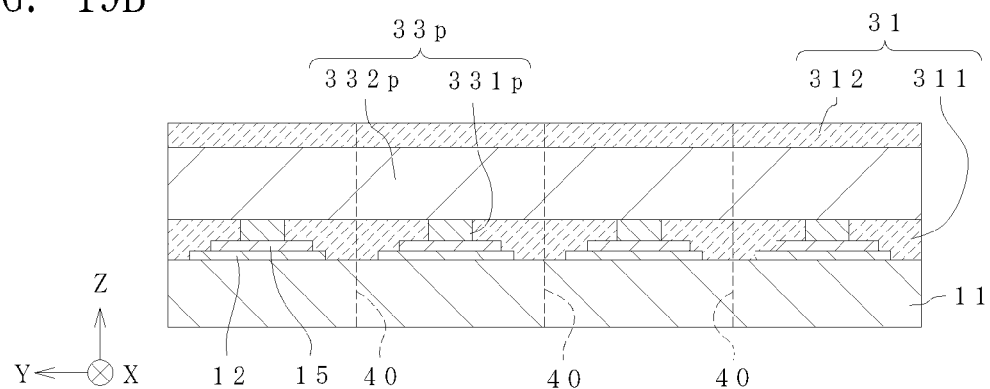
Figure 20A:
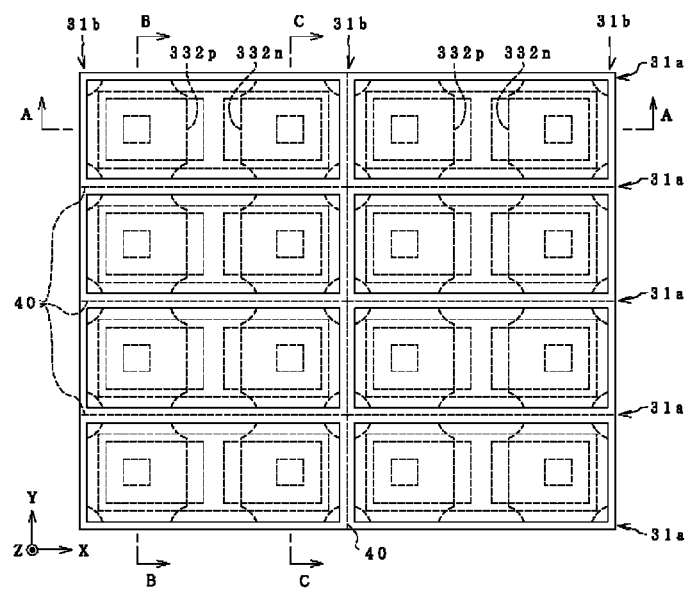
FIG. 20A to FIG. 20C are each a schematic diagram illustrating exposing an internal conductive member in a manufacturing operations of a light emitting device according to a second embodiment of the present invention, where

Next, in the forming second resin layer: S206, in a same manner as in the forming first resin layer: S203, the second resin layer 312 is formed as shown in FIG. 19A and FIG. 19B. Next, in the exposing inner conductive member: S106, as shown in FIG. 10A to FIG. 10C, the grooves 31a and the grooves 31b are formed from the upper surface side along the virtual border lines 40. With this arrangement, the second metal plated layers 332n, 332p, which are the internal conductive members respectively formed continuously between adjacent light emitting elements 1, are cut at the virtual border lines 40, thus, individual elements are separated. With this, the cut surfaces of the second metal plated layers 332n, 332p are exposed at inner surfaces defining the grooves 31a, respectively. The cross-section taken along line C-C in FIG. 20A is omitted for ease of illustration, but the inner conductive structures of the n-side can be formed in a similar manner as in the inner conductive structures of the p-side as shown in FIG. 20C. In addition, the inner side surfaces defining the grooves 31a become upper side surfaces in the longitudinal direction (i.e. longitudinal direction) of the light emitting device 100B, and the inner surfaces defining the grooves 31b become the side surfaces in the lateral direction (i.e. short-side direction) of the light emitting devices 100B.

As described above, in order to expose the cut surfaces of the second metal plated layers 332n, 332p on the corresponding side surfaces of the resin layer 31, at least the grooves 31a are formed with a predetermined depth from the upper surface side of the resin layer 31, removing a portion of the resin layer made of the resin layer 31 and the fluorescent material layer 2 by dicing (half dicing). In this operation, the grooves 31a are formed with a width which allows formation of the electrode for n-side external connection 34n and the electrode for p-side external connection 34p by using a sputtering method or the like, in the disposing electrode for external connection: S208. In the case where the second metal plated layers 332n, 332p are not to be exposed from the side surfaces in the lateral direction, the grooves 31b which do not involve exposing of the second metal plated layers 332n, 332p can be formed by half dicing with a depth different than the depth of the grooves 31a. In the present operations, full-dicing may be performed in the Y-axis direction in the singulating: S211, without forming the grooves 31b.

Figure 20B:
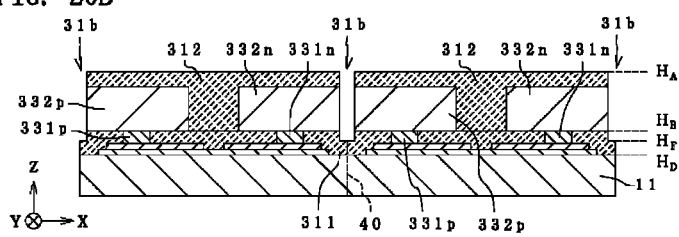
Figure 20C:
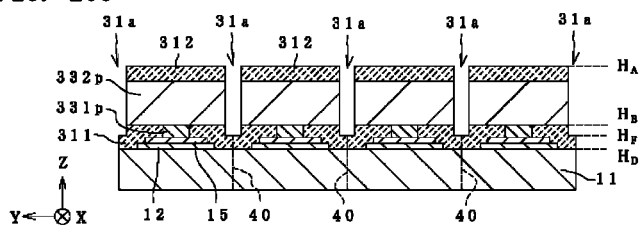

As shown in FIG. 20B and FIG. 20C, in the height direction (Z-axis direction), the position of the upper surface of the second resin layer 312 is denoted by HA, the positions of the lower end of the exposed surfaces of the second metal plated layers 332n, 332p are denoted by HB, the positions of the lower end of the grooves 31b (and the grooves 31a) formed by half-dicing are denoted by HF, the positions of the lower end of the light emitting elements 1 are denoted by HD. The depth of the grooves 31a, that is, the lower limit (the shallow limit) of the position HF corresponds to the position HB. Thus, arranging the position HF lower than the position HB allows for cutting of the second metal plated layers 332n, 332p so that the cut surfaces of the second metal plated layers 332n, 332p can be exposed from the corresponding side surfaces of the second resin layers 312. The upper limit (the deep limit) of the position HF allows for an adequate strength to maintain the wafer state through the later operations. The upper limit of the position HF can be appropriately determined by the rigidity of the resin.

Next, in the disposing electrode for external connection: S208, the electrode for n-side external connection 34n and the electrode for p-side external connection 34p are disposed extending on the exposed side surfaces of the second metal plated layers 332n, 332p, the side surfaces of the resin layer 31 (the inner side surfaces defining the grooves 31a, 31b), and the upper surface of the resin layer 31. In this operation, five sub-processes are included.

Figure 21A:
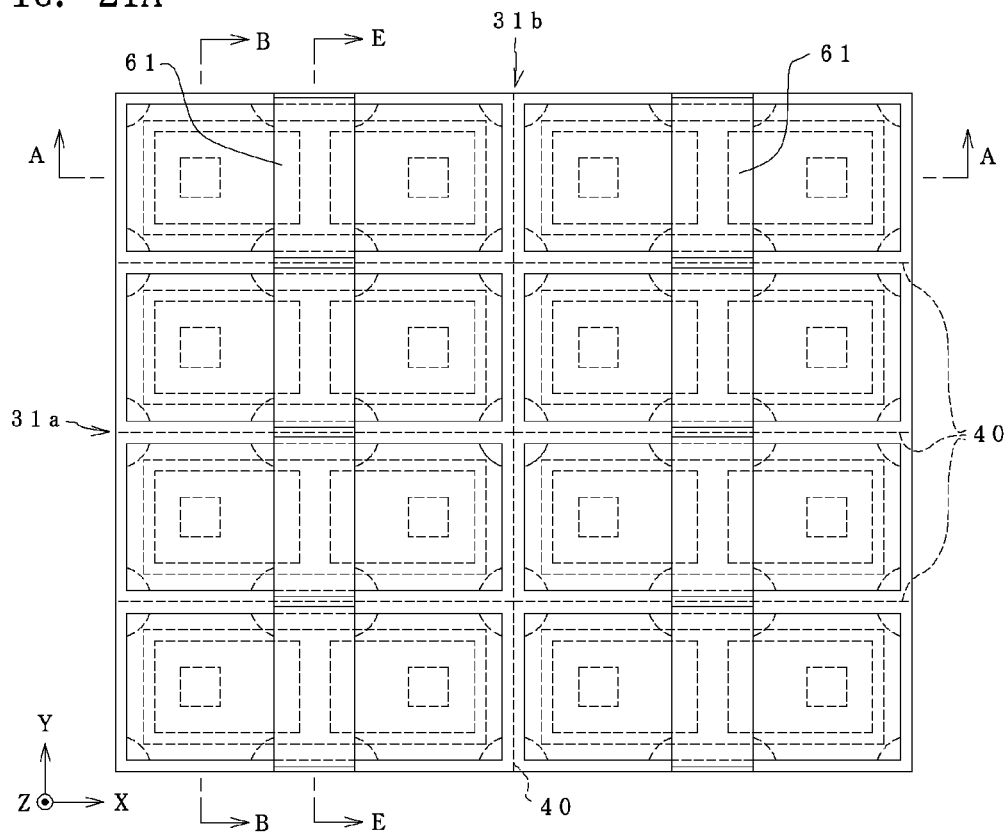
FIG. 21A to FIG. 21C are each a schematic diagram illustrating a first sub-process of forming a resist pattern in forming an electrode for external connection in a manufacturing operations of a light emitting device according to a second embodiment of the present invention, where
Figure 21B:
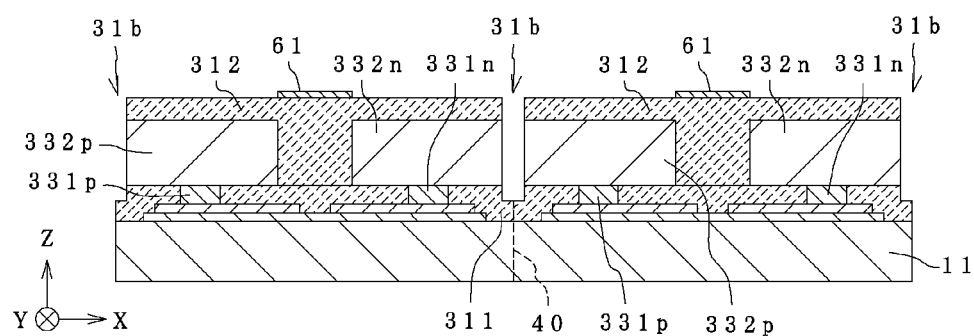
Figure 21C:
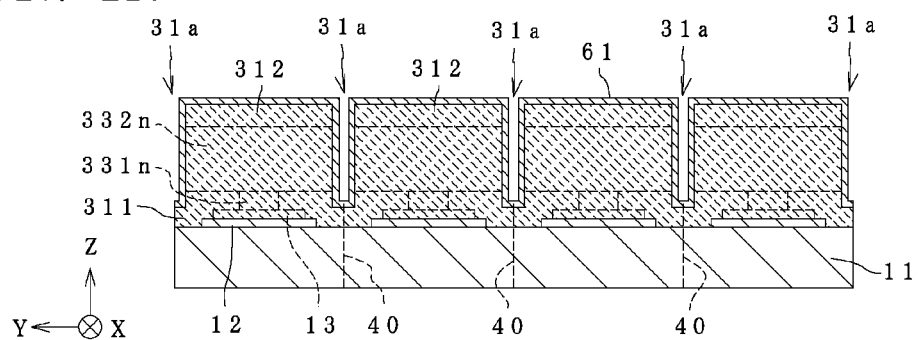

In a first sub-process (disposing resist pattern), as shown in FIG. 21A to FIG. 21C, a resist pattern 61 is disposed on the side surfaces and the upper surface of the resin layer 31, so as to mask the regions where the electrode for n-side external connection 34n and the electrode for p-side external connection 34p are not to be disposed. That is, the resist pattern 61 is disposed on the region between the electrode for n-side external connection 34n and the electrode for p-side external connection 34p of each element so that the metal layers to be serve as electrode for n-side external connection 34n and the electrode for p-side external connection 34p can be disposed spaced apart from each other. For this reason, in the regions provided for separating the electrode for n-side external connection 34n and the electrode for p-side external connection 34p from each other, in other words, the regions for not disposing those electrodes, the resist pattern 61 is disposed also in the inner surfaces defining the grooves 31a, as shown in FIG. 21C. The FIG. 21C is a cross-sectional view taken along line E-E in FIG. 21A, corresponding to the region between the electrode for n-side external connection 34n and the electrode for p-side external connection 34p.

In the disposing resist pattern, a coating machine (for example, Q-jet (registered trademark) system of Engineering System Co., Ltd.), which can apply high-precision coating by discharging a high-viscosity resist material using electrostatic discharging system, can be suitably used. The resist pattern 61 can also be formed by using a photolithography method.

Figure 22A:
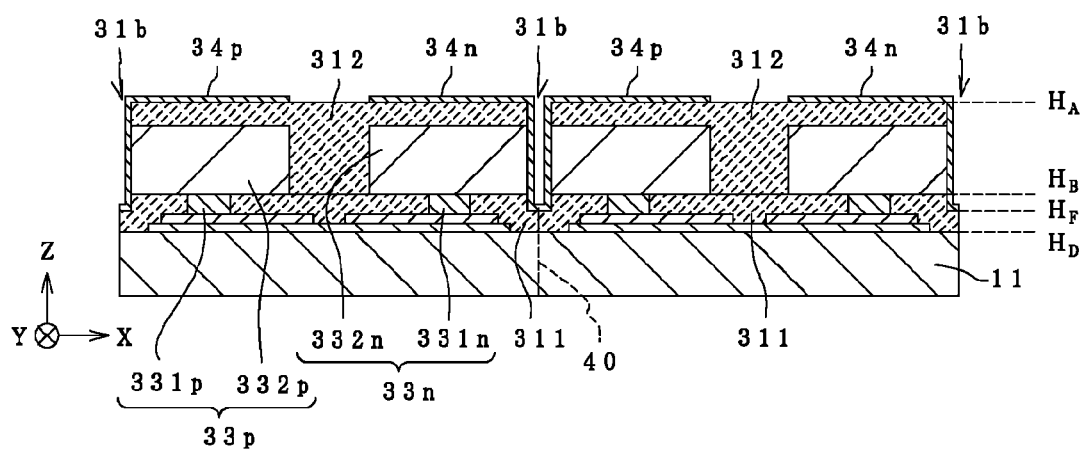
FIG. 22A and FIG. 22B are each a schematic diagram illustrating forming an electrode for external connection in a manufacturing operations of a light emitting device according to a second embodiment of the present invention, where
Figure 22B:
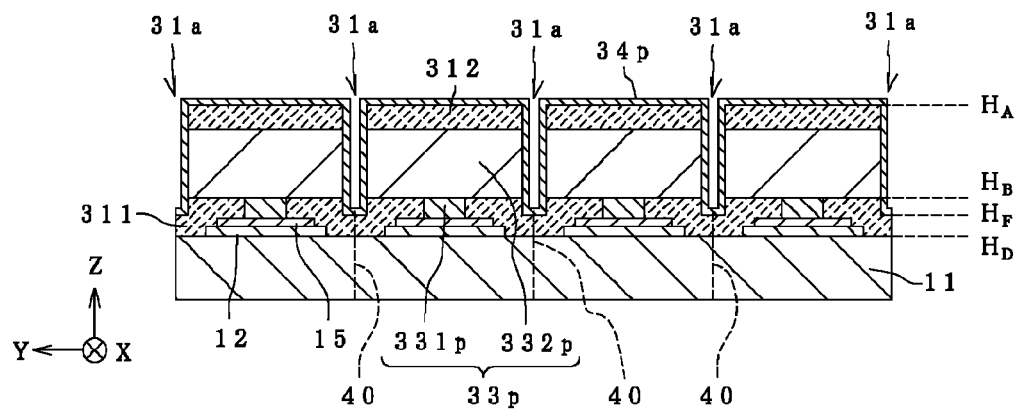

Next, in a second sub-process (forming metal layer), a metal layer is formed on the whole of the upper surface of the wafer by sputtering. In order to improve adhesion with the second metal plated layers 332n, 332p, an Au layer is preferably formed after the Ni layer is formed as the under layer. Then, in a third sub-process (removing resist pattern), the resist pattern 61 is removed (by lift-off). Thus, the metal layer formed in the second sub-process is patterned as shown in FIG. 22A and FIG. 22B, the electrode for n-side external connection 34n and the electrode for p-side external connection 34p are formed.

As described above, forming the electrode for n-side external connection 34n and the electrode for p-side external connection by using a sputtering method with a resist pattern which is a mask, posing tin an example shown in FIGS. 15A, 15B and FIG. 16, the electrode for n-side external connection 34n and the electrode for p-side external connection 34p can be formed respectively in a wide area, not only on the exposed portions of the second metal plated layers 332n, 332p which are the internal conductive members, but also extending to the side surfaces and the upper surface of the resin layer 31.

Figure 23A:
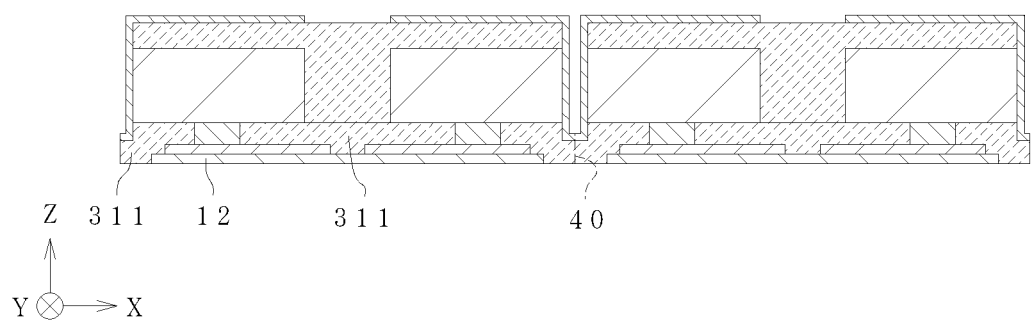
FIG. 23A and FIG. 23B are schematic cross sectional views corresponding to a portion taken along line A-A of FIG. 21A, each illustrating a part of the operations in fabricating light emitting devices according to a second embodiment of the present invention, where
Figure 23B:
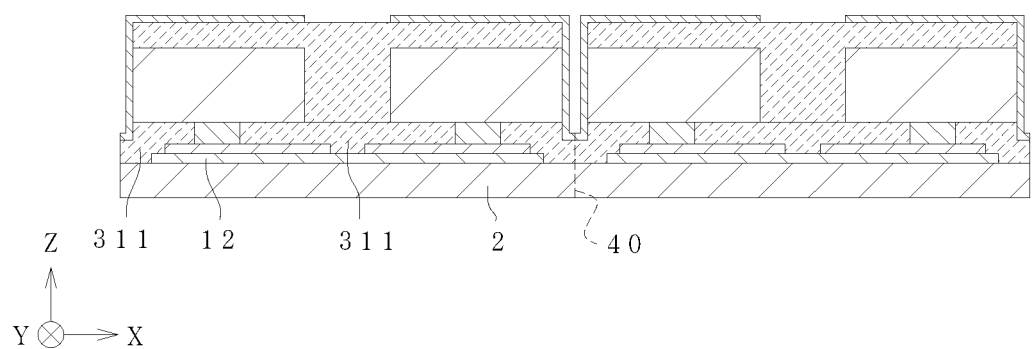
Figure 24A:
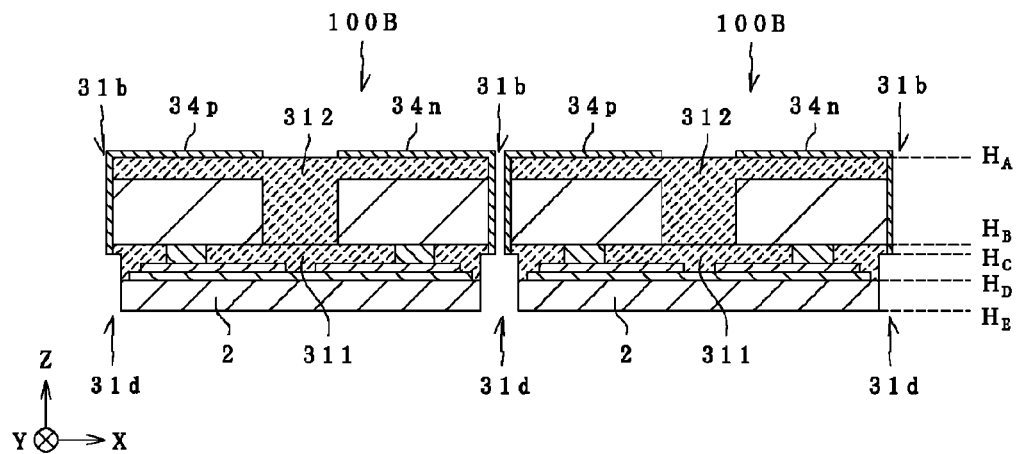
FIG. 24A and FIG. 24B are each a schematic diagram illustrating forming electrode for external connection in a manufacturing operations of a light emitting device according to a second embodiment of the present invention, where
Figure 24B:
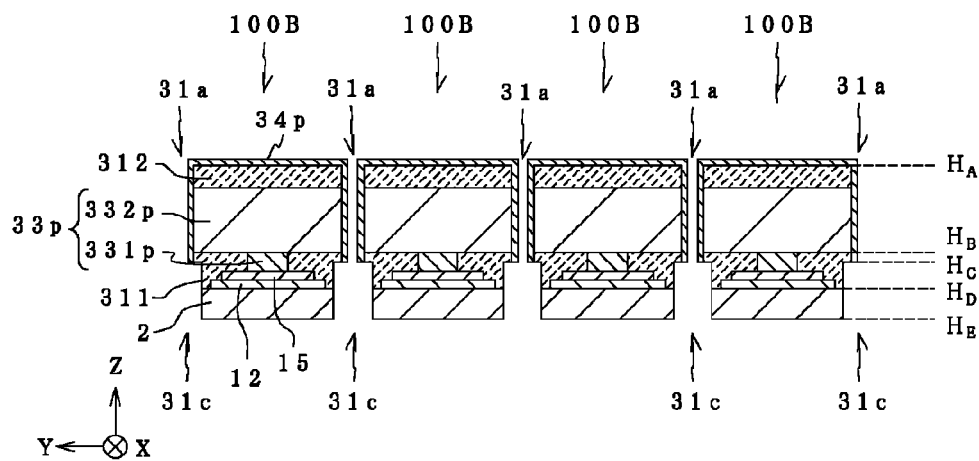

Next, in the step of removing growth substrate: S209, as shown in FIG. 23A, the growth substrate 11 is separated and removed in a similar manner as in the first embodiment: S104. The back surface of the semiconductor stacked layer body 12 may be roughened to form a recess-projection shape 12c (FIG. 3).

Next, in the forming fluorescent material layer (forming wavelength converting layer): S110, a fluorescent material layer 2 is formed on the lower surface side of the semiconductor stacked layer body 12.

At last, in the singulating: S211, dicing is carried out along the virtual border lines 40 shown in FIG. 21A or the like and by thick broken lines, from the lower surface side of the fluorescent material layer 2 to form the grooves 31c, 31d with a depth reaching to the lower end of each of the grooves 31a, 31b. Accordingly, the light emitting devices 100B are singulated.

At this operational stage, the expression "the grooves 31c, 31d with a depth reaching to the lower surfaces of the grooves 31a, 31b" refers that the position HC of the upper surface defining the grooves 31c, 31d are located higher or the same with respect to the position HF (see FIG. 22A and FIG. 22B) of the lower surface defining the grooves 31a and 31b. With this arrangement, the grooves 31a and the corresponding grooves 31c and the grooves 31b and the corresponding grooves 31d are respectively connected and thus the light emitting devices 100B are separated.

The widths of the grooves 31c and 31d is preferably wider than the widths of the corresponding grooves 31a, 31b so that in a plan view, the grooves 31a are included in the corresponding grooves 31c, and the grooves 31b are included corresponding grooves 31d. With this arrangement, in a similar manner as in the singulating: S108 in the first embodiment, reliable singulation can be achieved, and further, a step difference can be formed with which the lower portion of a side surface of the light emitting device 100B which corresponds to the inner surface of the groove 31a is located at an inner side than the upper portion of the side surface of the light emitting device 100B which corresponds to the inner surface of the groove 31a. In the case where the short-side side surface of the light emitting device 100B is not the mounting surface, it is not necessary to form the grooves 31d with a width greater than the width of the grooves 31b to form the step difference portion on the short-side side surface. According to the operations described above, the light emitting device 100B shown in FIG. 10B can be completed.

Variant Example

Next, with reference to FIGS. 25A to 25D, and FIGS. 26A to 26D (also, appropriately referring to FIG. 16), a method of manufacturing the light emitting device 100B according to the second embodiment will be described. As shown in FIG. 16, in the second embodiment, the internal conductive members are formed by performing a two-stage electrolytic plating, so that the first metal plated layers 331n, 331p and the second metal plated layers 332n, 332p are stacked respectively. On the other hand, in the method of manufacturing according to the present variant example, the internal conductive members are formed by a single-stage electrolytic plating. A method of manufacturing a light emitting device according to the present variant example may be performed as described below. The operation performed in a similar manner as that in the second embodiment will be denoted by a similar name and numeral and detailed description will be omitted.

Figure 25A:
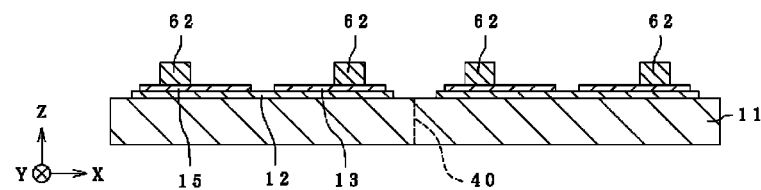
FIG. 25A to FIG. 25D are schematic cross sectional views corresponding to a portion taken along line A-A of FIG. 21A, each illustrating a part of operations in fabricating light emitting devices according to a variant example of asecond embodiment the present invention, where

After the preparing light emitting element: S201, disposing first resist pattern is performed in place of the forming first plated layer: S202. In the disposing first resist pattern, using a photolithography method, as shown in FIG. 25A, a first resist pattern 62 which, in a plan view, has substantially the same shape as the shape of the first metal plated layers 331n, 331p, in the same regions where the first metal plated layers 331n, 331p (FIG. 17A) to be disposed. At this time, the first resist pattern 62 is formed equal or higher than a predetermined height. Here, the term "predetermined height" is referred to a height of the first resin layer 311 at completion, which is a height of a virtual cutting line 41 shown by the broken line in FIG. 25B.

Figure 25B:
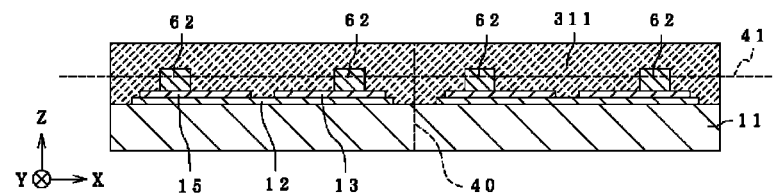

Next, in a similar manner as in the forming first resin layer: S203, as shown in FIG. 25B, the first resin layer: 311 is formed with its upper surface to be higher than the intended cutting lines 41. Accordingly, the first resist pattern 62 is embedded in the first resin layer 311.

Figure 25C:
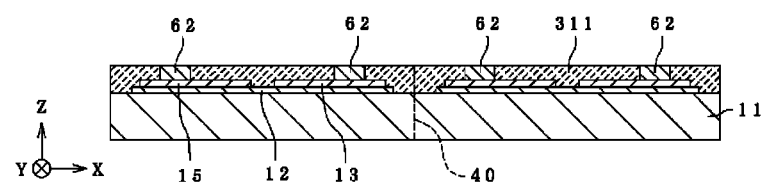
Figure 25D:
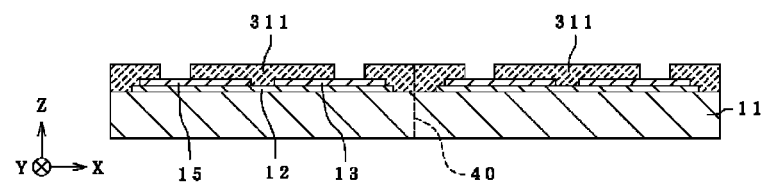

Next, in the cutting first resin layer: S104, using a cutting machine, together with the metal wires 62, the first resin layer 311 is cut from the upper surface side to the thickness indicated by the virtual cutting line 41. Accordingly, as shown in FIG. 25C, the upper surface of the first resist pattern 62 is exposed co-planar to the upper surface of the first resin layer 311. Then, in the next process (removing first resist pattern), the first resist pattern 62 is removed by ashing and a chemical treatment. Accordingly, openings are created in the first rein layer 311 and portions of the upper surfaces of the n-side electrode 13 and the p-side electrode 15 are exposed in the respective openings.

Next, in place of forming second plated layer: S205, forming a variation of the plated layer is performed. In the forming the variation of the plated layer, a metal plated layer 33n (FIG. 26D) which has an integrated shape of the first metal plated layer 331n and the second metal plated layer 332n, and a metal plated layer 33p (FIG. 26D), which has an integrated shape of the first metal plated layer 331p and the second metal plated layer 332p, are formed. The formed variation of plated layer includes five sub-processes, in which, the sub-processes described in the forming plated layer: S202 can be used in combination.

Figure 26A:
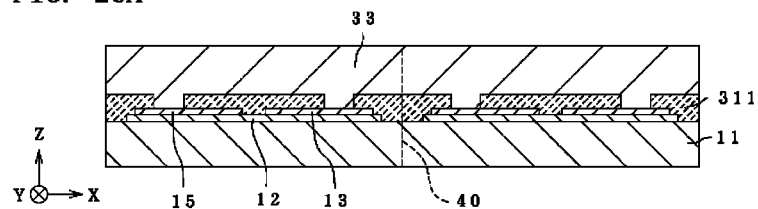
FIG. 26A to FIG. 26D are schematic cross sectional views corresponding to a portion taken along line A-A of FIG. 21A, each illustrating a part of operations in fabricating light emitting devices according to a variant example of a second embodiment of the present invention, where

First, in a first sub-process (forming seed layer), in a similar manner as in the second sub-process in the forming first plated layer: S202, a seed layer is formed on the upper surface of the first resin layer 311 and the exposed portions of the n-side electrode 13 and the p-side electrode 15. Next, in a second sub-process (forming plated layer), in a similar manner as in the third sub-process in the forming first plated layer: S202, a metal plated layer 33 is formed so that the upper surface of the metal plated layer 33 has a predetermined height, as shown in FIG. 26A. The metal plated layer 33 formed in this sub-process is a metal layer formed on the entire surface of the first resin layer 311 inclusive of the inner walls defining the openings.

Figure 26B:
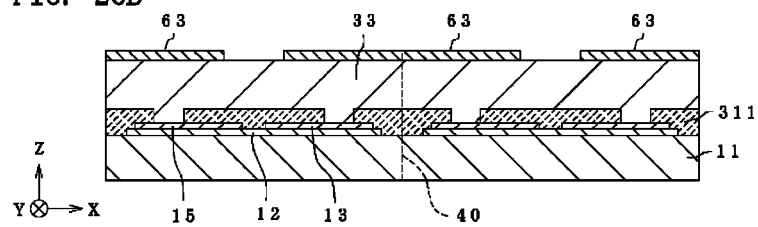
Figure 26C:
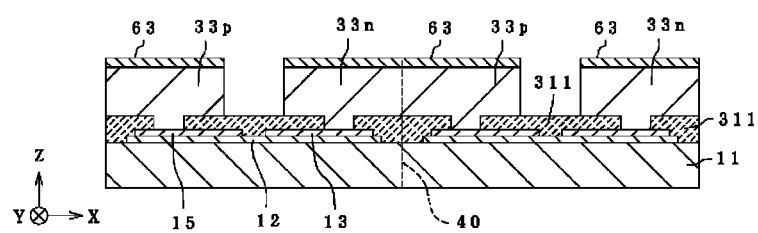

Next, in a third sub-process (forming second resist pattern), in a similar manner as in the fourth sub-process in the forming first plated layer: S202, as shown in FIG. 26B, a second resist pattern 63 is formed on the upper surface of the metal plated layer 33 to cover the regions designated for the metal plated layers 33n, 33p. Next, in a fourth sub-process (etching), in a similar manner as in the fifth sub-process in the forming first plated layer: S202, using the second resist pattern 63 as the mask, a metal plated layer 33 and the seed layer are removed by etching, as shown in FIG. 26C. Thus, the metal plated layers 33n, 33p are patterned.

Figure 26D:
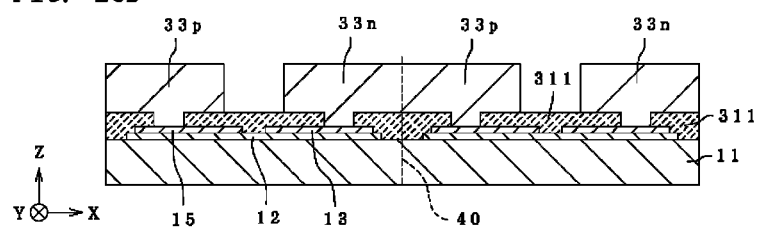

Further, in a fifth sub-process (removing second resist pattern), in a similar manner as in the sixth sub-process in the forming first plated layer: S202, removing the second resist pattern 63, the metal plated layers 33n, 33p are completed, as shown in FIG. 26D. The status illustrated in FIG. 26D is substantially similar to those illustrated in FIG. 18A to FIG. 18C, that is, the status after the forming of second plated layer: S205.

Performing the forming second resin layer: S206 to the singulating: S211 following the above, the light emitting device 100B shown in FIGS. 14A, 14B and FIGS. 15A, 15B can be manufactured.

Third Representative Embodiment

Configuration of Light Emitting Device

Next, with reference to FIGS. 27A, 27B, and FIGS. 28A, 28B, a light emitting device according to a third embodiment will be described. As shown in FIGS. 27A, 27B, and FIGS. 28A, 28B, the light emitting device 100C according to the third embodiment includes a light emitting element 1, a fluorescent material layer 2, and a support member 3C. The light emitting device 100C according to the third embodiment differs from the light emitting device 100B according to the first embodiment shown in FIGS. 14A, 14B, and FIG. 15A, and FIG. 5C, in which the light emitting device 100B has a support member 3B in place of the support member 3B.

The light emitting element 1 and the fluorescent material layer 2 can be similar as that used in the light emitting device 100 according to the first embodiment, or the light emitting device 100B so that detailed description thereof will be omitted.

The support member 3A according to the present embodiment includes, in order from the light emitting element 1 side, a first resin layer 311 which includes the internal conductive members of the metal wires 32n, 32p, and a second resin layer 312 which includes the internal conductive members of metal plated layers 32n, 33p, respectively. On the side surfaces of the support member 3C, a step difference is formed with the position HC in the height direction (the Z-axis direction) as a boundary so that the portion lower than the location HC is at an inner side than the upper portion in a plan view. The fluorescent material layer 2 disposed connecting to the lower surface side of the support member 3C is in a plan view, formed in a similar shape as in the bottom surface of the support member 3C.

Also, the metal plated layers 33n, 33p, which are the internal conductive members included in the second resin layer 312, are formed so that, except for the side surfaces of the metal plated layers 33n, 33p facing each other, other three side surfaces and the upper surface of each of the metal plated layers 33n, 33p are arranged co-planar with the corresponding side surfaces and the upper surface of the second resin layer 312. Then, the electrode for n-side external connection 34n and the electrode for p-side external connection 34p are disposed to cover the three side surfaces and the upper surface of the corresponding metal plated layers 33n, 33p which are not covered with the second resin layer 312. With this configuration, the light emitting device 100C allows for a side-view type mounting with its either longitudinal side surface as the mounting surface, and moreover, also allows for a top-view type mounting with its upper surface as the mounting surface.

That is, the support member 3C according to the present embodiment has configuration different from that of the support member 3B in the second embodiment. That is, as the internal conductive members included in the first resin layer, metal wires are used in place of the metal plated layers, the shape of the metal plated layers which are the internal conductive members included in the second resin layer 312 have different shapes, and the electrodes for external connection are disposed in the different regions, with respect to those in the support member 3.

The resin layer 31 is constituted by stacking a first resin layer 311 and a second resin layer 312. The first resin layer 311 includes metal wires 32n, 32p which are the internal conductive members respectively disposed penetrating in the thickness direction (the Z-axis direction). The position HC which is the border of the step difference at the side surfaces as described above, is arranged between the upper end position HB and the lower end position HD. Also, the metal plated layers 33n, 33p which are the internal conductive members included in the second resin layer 312 are formed so that, except for the side surfaces of the metal plated layers 33n, 33p facing each other, other three side surfaces and the upper surface of each of the metal plated layers 33n, 33p are arranged co-planar with the corresponding side surfaces and the upper surface of the second resin layer 312. The first layer 311 and the second resin layer 312 are well adhered to each other and integrated to form the resin layer 31.

The light emitting element 311 and the fluorescent material layer 312 can be similar as that used in the light emitting device 312 according to the first embodiment, so that detailed description thereof will be omitted.

The metal wires 32n, 33p are arranged to penetrate the first resin layer 311 in the thickness direction, and respectively electrically connected to the upper surfaces of the n-side electrode 13 and the p-side electrode 15. In a plan view, the metal wires 32n, 32p are formed smaller than the metal plated layers 32n, 32p so as to be located inner side of the outline of the second metal plated layer 33n, 33p. The metal wires 32n, 32p are arranged so as not to be exposed at the side surfaces of the first resin layers 311. Also, the upper surface of the metal plated layers 32n 32p are arranged substantially in a same plane with the upper surface of the first resin layer 311, and electrically connected to the lower surfaces of the metal plated layers 33n, 33p, respectively. For the metal wires 32n, 32p, similar to the metal wires 32n, 32p in the first embodiment can be used.

The metal plated layers 33n, 33p are disposed in the second resin layer 312, with their lower surfaces being electrically connected to the metal wires 32n, 32p of corresponding polarity. The metal plated layers 33n, 33p have a columnar structure which has a shape in a plan view an approximately square shape. Also, the upper surface of the metal plated layers 33n 33p are arranged substantially in a same plane with the upper surface of the second resin layer 312.

Also, the configuration may be such that, removing the four corners in a similar manner as in the second metal plated layers 332n, 332p according to the second embodiment, the adhesion between the metal plated layers 33n, 33p and the second resin layer 312 can be improved, and also increase the joining area between the first resin layer 311 and the second resin layer 312. Thus, the resin layer 31 can be firmly integrated.

The metal plated layers 33n, 33p can be formed using a similar material and by electrolytic plating, as in the first metal plated layers 331n, 331p and the second metal plated layers 332n, 332p in the second embodiment.

Figure 27A:
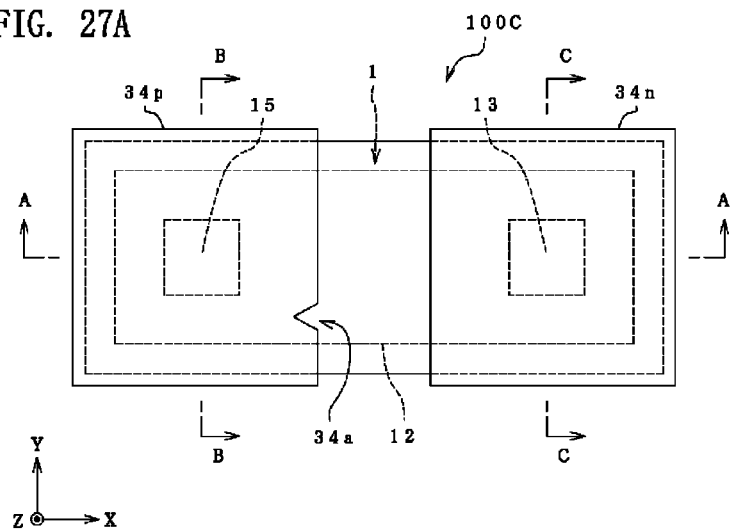
FIG. 27A and FIG. 27B are each a schematic diagram illustrating a configuration of a light emitting device according to a third embodiment of the present invention, where
Figure 27B:
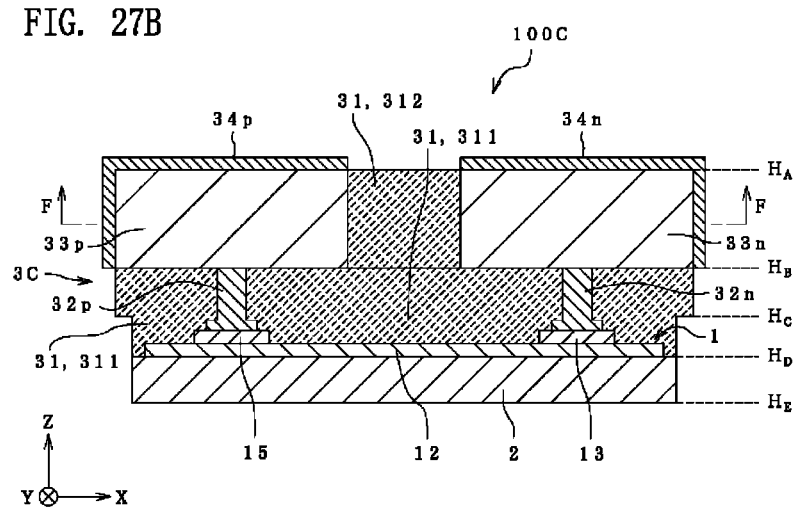
Figure 28A:
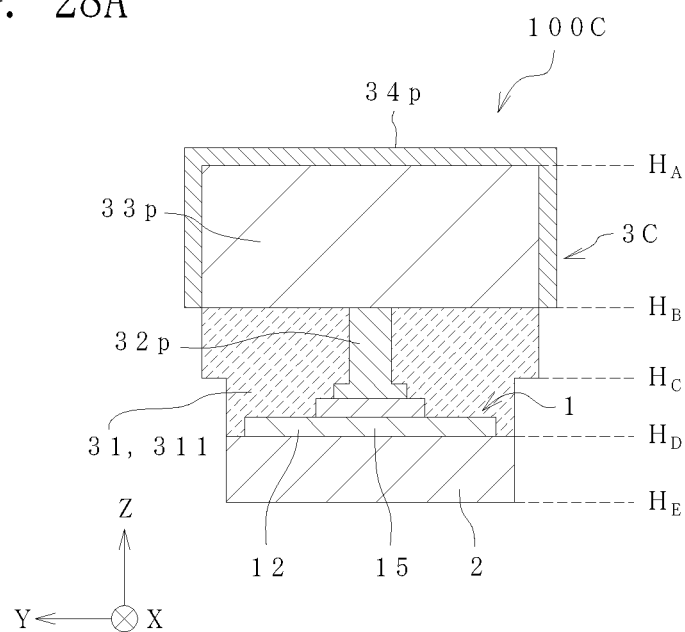
FIG. 28A is a schematic cross sectional view taken along line B-B of FIG. 27A.
Figure 28B:
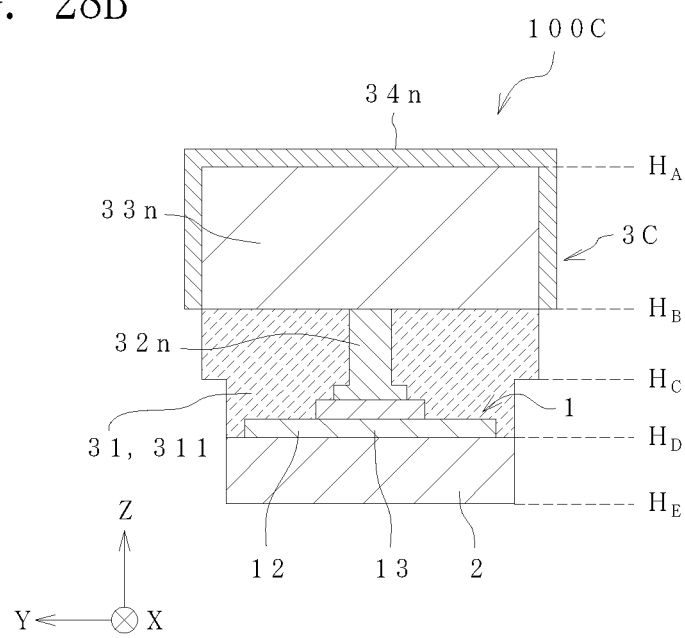
FIG. 28B is a schematic cross sectional view taken along line C-C of FIG. 27A.

The electrode for n-side external connection 34n and the electrode for p-side external connection 34p are disposed to cover the portions of the side surfaces of the second metal plated layers 332n, 332p which are not covered with the second resin layer 312. Further, as shown in FIG. 27A, a notch 34a for indicating a polarity is formed in a portion of the electrode for p-side external connection 34p at the upper surface side.

The electrode for n-side external connection 34n and the electrode for p-side external connection 34p are disposed to cover the side surfaces and the upper surface of the corresponding metal plated layers 33n, 33p which are not covered with the second resin layer 312, so that the electrode for n-side external connection 34n and the electrode for p-side external connection 34p can be formed easily by electroless plating. In the case where a metal different from that in the metal plated layers 33n, 33p is used for the electrode for n-side external connection 34n and the electrode for p-side external connection 34p, a metal multilayer structure may be employed and a metal layer having good adhesion with the metal plated layers 33n, 33p may be formed at respective lower sides. For example, in the case where Au is used for the electrode for n-side external connection 34n and the electrode for p-side external connection 34p, and Cu is used for the metal plated layers 33n, 33p, a Ni layer may be formed as an adhesive layer at the lower layer side and an Au layer is formed thereon, respectively.

Also, as in the second embodiment, the electrode for n-side external connection 34n and the electrode for p-side external connection 34p may be formed extending to the surface of the second resin layer 312. In this case, the electrode for n-side external connection 34n and the electrode for p-side external connection 34p can be formed by sputtering or a method which is a combination of sputtering and electroless plating.

Operation of Light Emitting Device

A light emitting device 100C according to a third embodiment can be mounted on a mounting substrate with either longitudinal side surface or the upper surface as the mounting surface in a similar manner as in the second embodiment. The light emitting device 100C differs from the light emitting device 100B mainly by the arrangement of the internal conductive members, so that detailed description on the operation of the device will be omitted.

Method of Manufacturing Light Emitting Device

Figure 29:
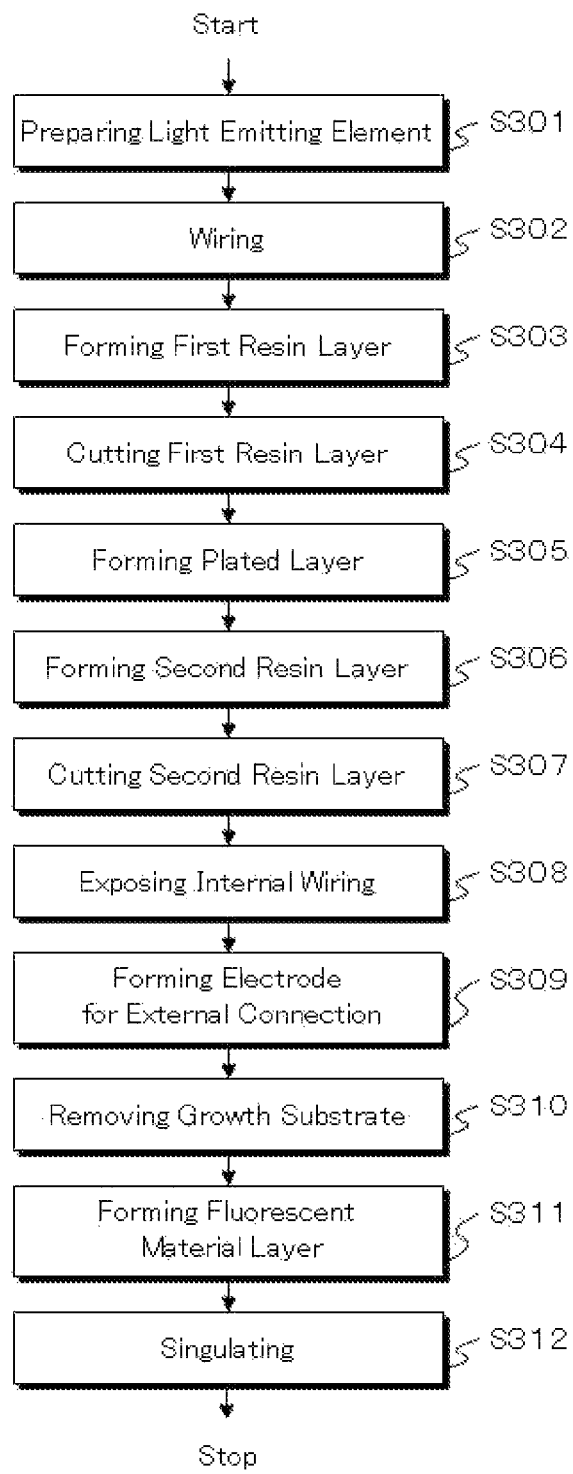
FIG. 29 is a flowchart showing the flow of operations of manufacturing a light emitting device according to a third embodiment of the present invention.

Next, with reference to FIG. 29, a method of manufacturing a light emitting device 100C illustrated in FIGS. 27A, 27B, and FIG. 28A, FIG. 28B will be described. As shown in FIG. 29, a method of manufacturing a light emitting device 100C includes, preparing light emitting element: S301, providing wiring: S302, forming first resin layer: S303, cutting first resin layer: S304, forming plated layer: S305, forming second resin layer: S306, cutting second resin layer: S307, exposing internal conductive member: S308, disposing electrode for external connection: S309, removing growth substrate: S310, forming fluorescent material layer (forming wavelength converting layer): S311, singulating: S312, which are performed in this order.

Now, with reference to FIG. 30A through FIG. 38B, (also, appropriately referring to FIG. 27A to FIG. 29), each operation will be described in detail below. The preparing light emitting element: S301 which may be performed first can be similar to the preparing light emitting element: S101 in the first embodiment, so that description thereof will be omitted.

Figure 30A:
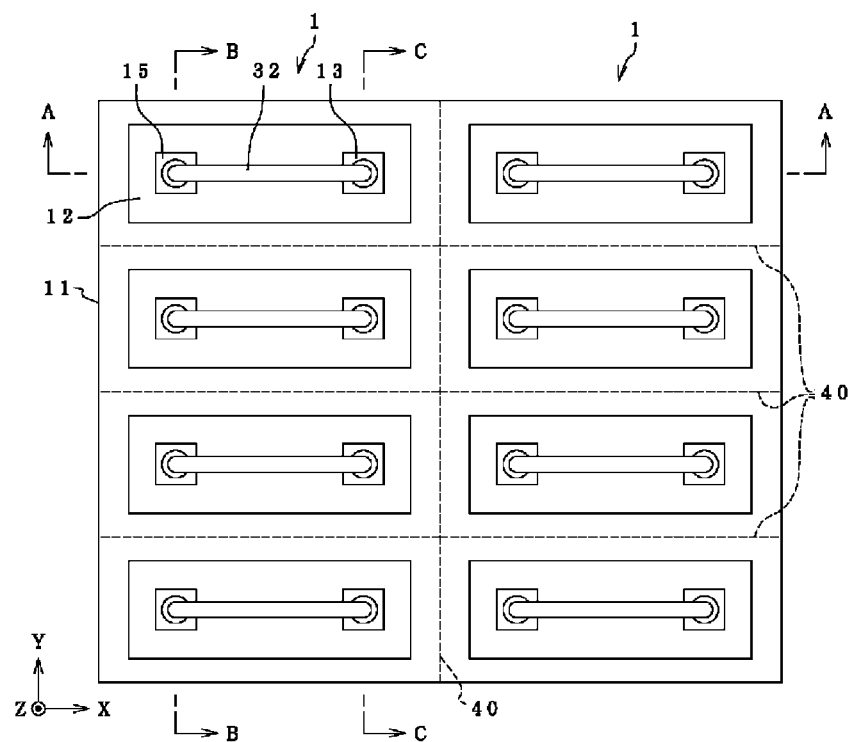
FIG. 30A and FIG. 30B are each a schematic diagram illustrating providing wiring in a manufacturing operations of a light emitting device according to a third embodiment of the present invention, where
Figure 30B:
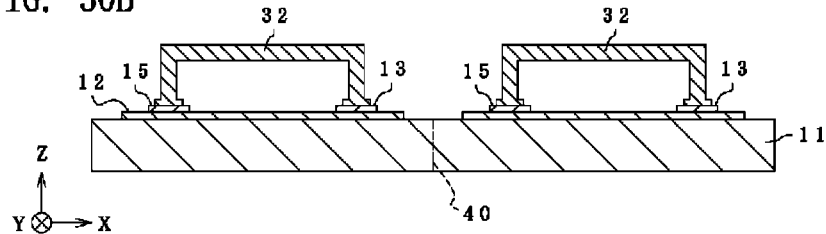

Next, in the providing wiring: S302, as shown in FIG. 30A and FIG. 30B, with respect to each of the light emitting elements 1 on the growth substrate 11, a metal wire 32 is arranged by using a wire bonder to connect the n-side electrode 13 and the p-side electrode 15. As shown in FIG. 8A and FIG. 8B, the metal wires 32 are arranged in a TT-shape (e.g. an approximately rectangular bridge shape) or an inverted U-shape (e.g. an approximately arch bridge shape) in a side view (observed from the X-axis direction). At this time, a portion of the metal wire 32 which is extending from the joining portion with the p-side electrode 15 in a vertical direction or an approximately vertical direction is arranged with a length so that the wiring can be higher than a predetermined height. Here, the term "predetermined height" is referred to a height of the upper surface of the first resin layer 311 shown in FIG. 1C, which is a height of a virtual cutting line 42 shown by the broken line in FIG. 6C. In the present example, the metal wire 32 is arranged between the n-side electrode 13 and the p-side electrode 15 in each of the light emitting elements 1, but it is not limited thereto, for example, the wire 32 can be arranged between the n-side electrodes 13 or between the p-side electrodes 15 of adjacent light emitting elements 1.

Figure 31A:
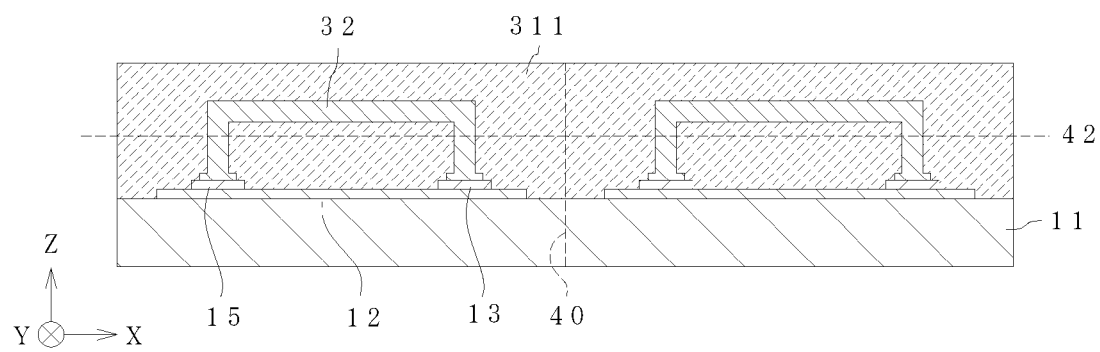

Next, in the forming first resin layer: S303, as shown in FIG. 31A, by way of compression molding using a mold for example, the first resin layer 311 is formed so as to completely enclose the light emitting elements 1 and the metal wires 32. At this time, the first resin layer 311 is formed so that the upper surface of the first resin layer 311 is at least higher than the virtual cutting line 42.

Figure 31B:
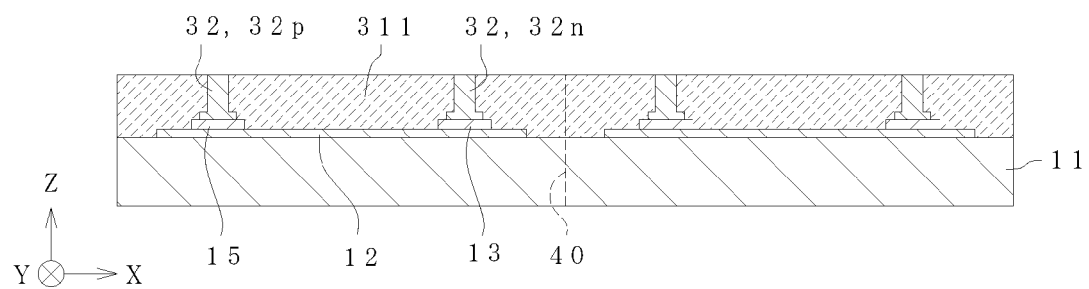
FIG. 31B illustrates cutting the first resin layer.

Next, in the cutting first resin layer: S304, using a cutting machine, together with the metal wires 32, the first resin layer 311 is cut from the upper surface side to the thickness indicated by the virtual cutting line 42. With this, each metal wire 32 is divided in two metal wires 32n, 32p, and as shown in FIG. 31B, the cross section of the metal wires 32 are exposed as the upper surfaces of the metal wires 32n, 32p which are on the same plane with the upper surface of the first resin layer 311.

Figure 32A:
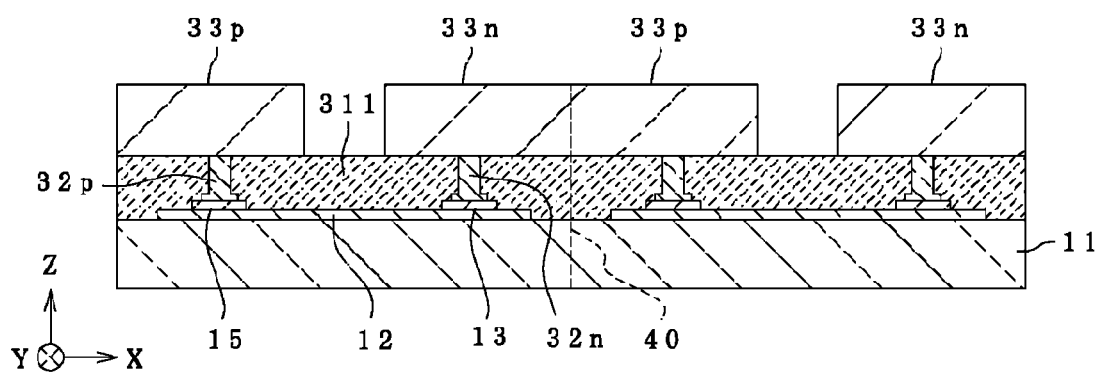
FIG. 32A and FIG. 32B are each a schematic diagram illustrating forming a plated layer in a manufacturing operations of a light emitting device according to a third embodiment of the present invention, where
Figure 32B:
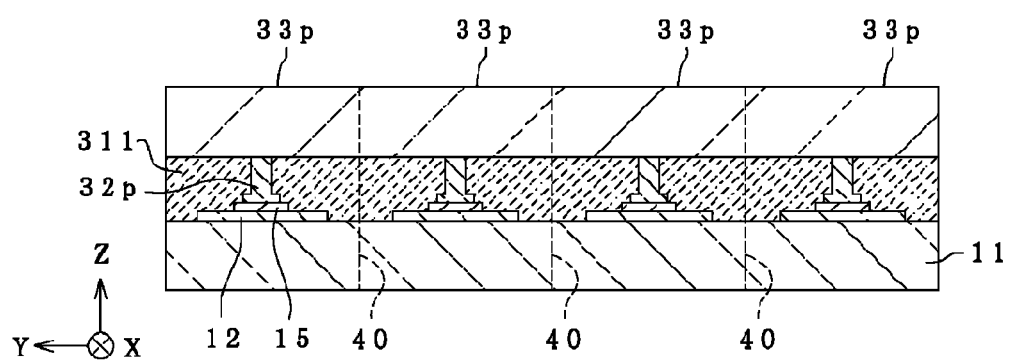

Next, in the forming plated layer: S305, as shown in FIG. 32A and FIG. 32B, metal plated layers 33n, 33p are formed on the upper surfaces of the metal wires 32n, 32p and predetermined regions of the upper surfaces of the first resin layer 311. At this time, the upper surfaces of the metal plated layers 33n, 33p are formed with at least a predetermined height. Here, the term "predetermined height" is referred to a height of the second resin layer 312 shown in FIGS. 27A, 27B and FIGS. 28A, 28B, which is a height of the virtual cutting line 43 shown by the broken line in FIG. 33. The forming plated layer: S305 can be performed in a similar manner as in the forming second plated layer: S205 in the second embodiment, so that the detailed description will be omitted. The cross-section taken along line C-C in FIG. 30A is omitted for ease of illustration, but the inner conductive structures of the n-side can be formed in a similar manner as in the inner conductive structures of the p-side as shown in FIG. 32B. Subsequent operations can also be performed in a similar manner.

Figure 33:
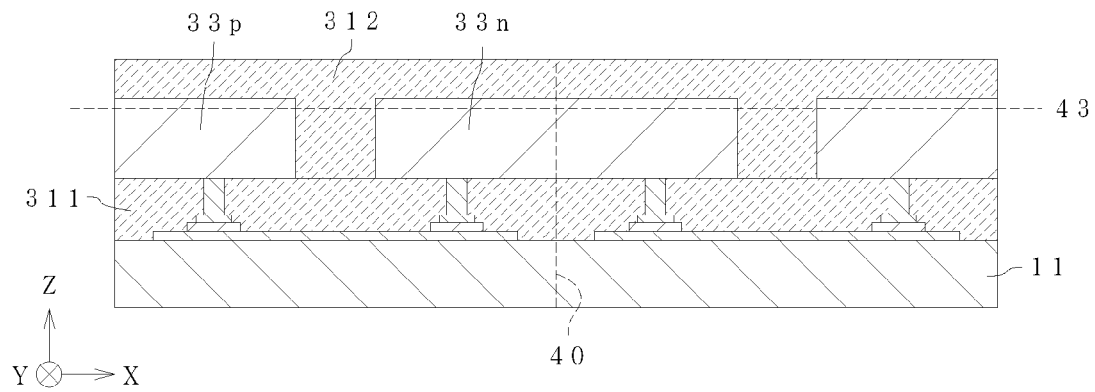
FIG. 33 is a schematic plan view corresponding to a portion taken along line A-A of FIG. 30A, illustrating formation of a second resin layer in a manufacturing operation according to a third embodiment of the present invention.

Next, in the forming second resin layer: S306, as shown in FIG. 33, the second resin layer 312 is formed, for example, by way of compression molding using a mold, so as to enclose the metal plated layers 33n, 33p. At this time, the second resin layer 312 is formed so that the upper surface of the second resin layer 312 is at least higher than the virtual cutting line 43.

Figure 34A:
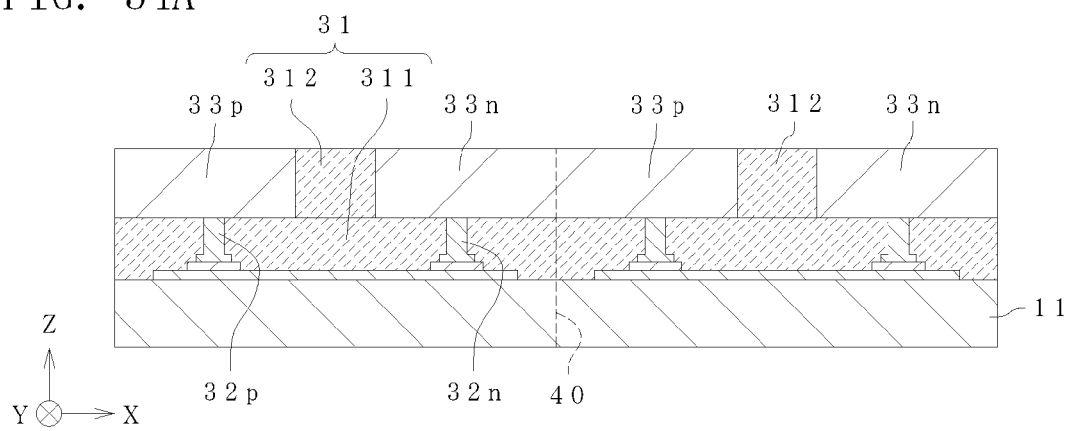
FIG. 34A and FIG. 34B are each a schematic diagram illustrating cutting a second resin layer in a manufacturing operations of a light emitting device according to a third embodiment of the present invention, where
Figure 34B:
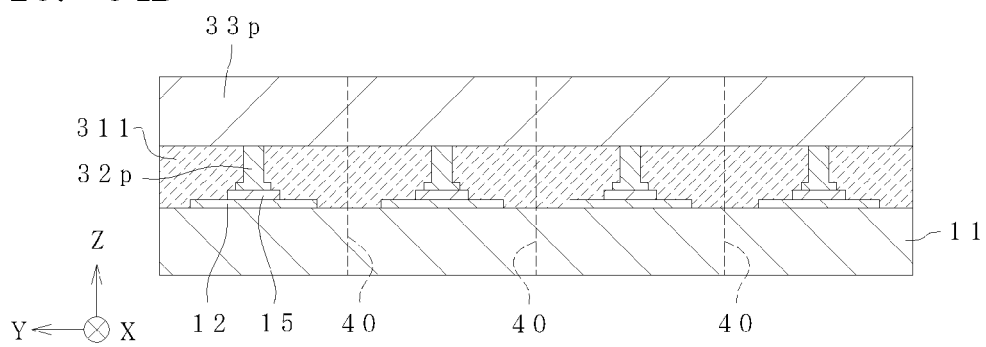

Next, in the cutting second resin layer: S307, using a cutting machine, together with the metal plated layers 33n, 33p which are contained therein, the second resin layer 312 is cut from the upper surface side to the thickness indicated by the virtual cutting line 43. With this, as shown in FIG. 34A and FIG. 34B, the upper surfaces of the metal plated layers 33n, 33p are exposed so as to be in the same plane with the upper surface of the second resin layer 312.

Figure 35A:
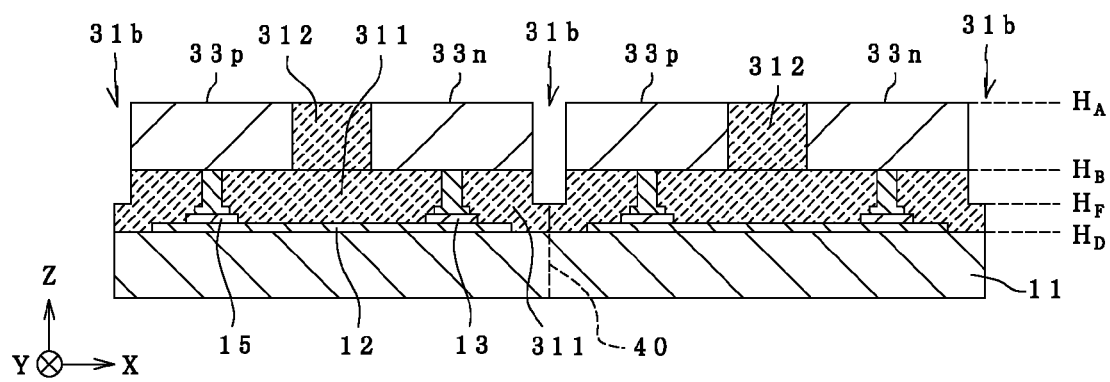
FIG. 35A and FIG. 35B are each a schematic diagram illustrating exposing an internal conductive member in a manufacturing operations of a light emitting device according to a third embodiment of the present invention, where
Figure 35B:
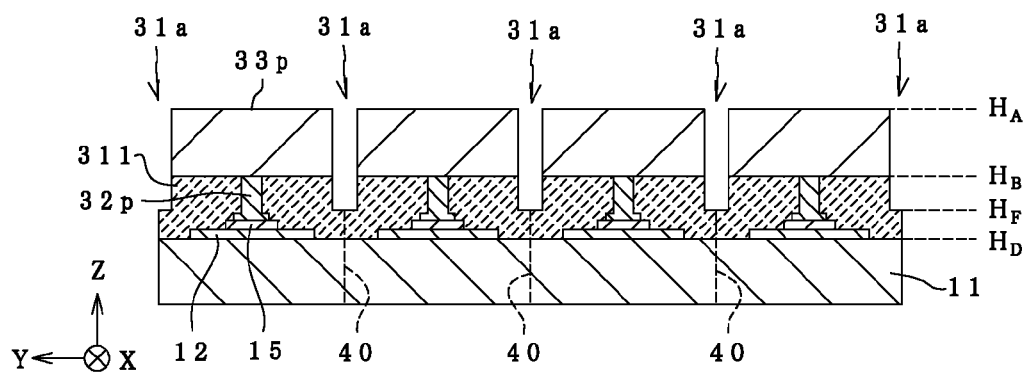

Next, in the exposing inner conductive member: S308, in a similar manner as in the exposing inner conductive member: S207 in the second embodiment, as shown in FIG. 35A and FIG. 35B, the grooves 31a and the grooves 31b are formed from the upper surface side along the virtual border lines 40. With this arrangement, the metal plated layers 33n, 33p, which are the inner conductive members formed continuously between adjacent two light emitting elements 1, are cut at the positions of the virtual border lines 40 into individual elements. With this, the cut surfaces of the metal plated layers 33n, 33p are exposed from the side surface of the second resin layer 312. The inner surface defining the grooves 31a become the upper side surfaces in the longitudinal direction of the light emitting device 100C, and the inner surface defining the grooves 31b become the side surfaces in the short-side direction of the light emitting devices 100.

As described above, in order to expose the cut surfaces of the second metal plated layers 33n, 33p on the corresponding side surfaces of the resin layer 31, at least the grooves 31a are formed with a predetermined depth from the upper surface side of the resin layer 31, removing a portion of the resin layer made of the resin layer 31 and the fluorescent material layer 2 by dicing (half dicing). At this time, the grooves 31a are formed with a width which allows formation of the electrode for n-side external connection 34n and the electrode for p-side external connection 34p in the disposing electrode for external connection: S309 which is a later operation, by using electroless plating or the like. In the case of forming the metal plated layers 33n, 33p not to be exposed at the side surfaces in the short-side direction, the grooves 31b which do not involve exposing the metal plated layers 33n, 33p may be formed by half-dicing with a depth different from the grooves 31a, or it may be such that, without forming the grooves 31b in the present operation, full-dicing may be performed, in which the entire thickness direction is cut along the Y-axis in the singulating: S312.

As shown in FIG. 35A and FIG. 35B, in the height direction (Z-axis direction), the position of the upper surface of the second resin layer 312 is denoted by HA, the positions of the lower end of the exposed surfaces of the metal plated layers 33n, 33p are denoted by HB, the positions of the lower end of the grooves 31a (and the grooves 31b) formed by half-dicing are denoted by HF, the positions of the lower end of the light emitting elements 1 are denoted by HD. The depth of the grooves 31a, that is, the lower limit (the shallow limit) of the position HF corresponds to the position HB. Thus, arranging the position HF lower than the position HB allows for complete cutting of the metal plated layers 33n, 33p so that the cut surfaces of the metal plated layers can be exposed from the corresponding side surface of the resin layer 312. The upper limit (the deep limit) of the position HF allows for an adequate strength to maintain the wafer state through the later operations after removing the growth substrate 11 in the removing growth substrate: S310. The upper limit of the position HF can be appropriately determined by the rigidity of the resin, the joining strength of the resin layer 31 and the fluorescent material layer 2.

Figure 36A:
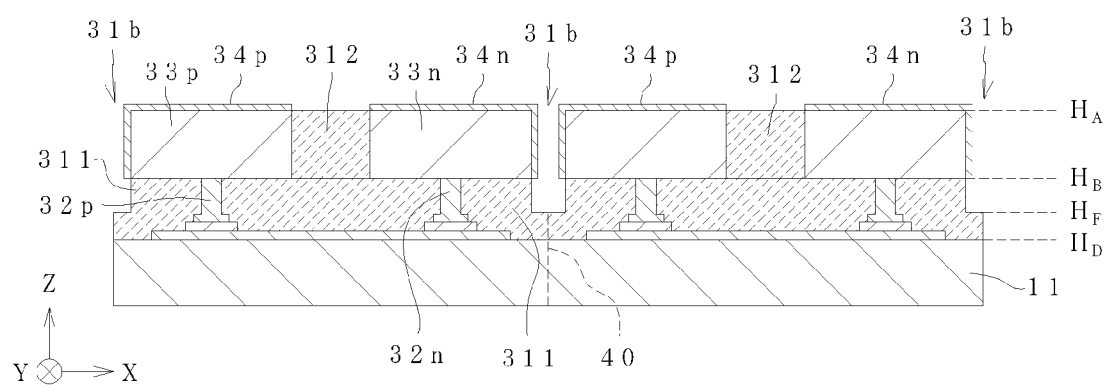
FIG. 36A and FIG. 36B are each a schematic diagram illustrating forming an electrode for external connection in a manufacturing operations of a light emitting device according to a third embodiment of the present invention, where
Figure 36B:
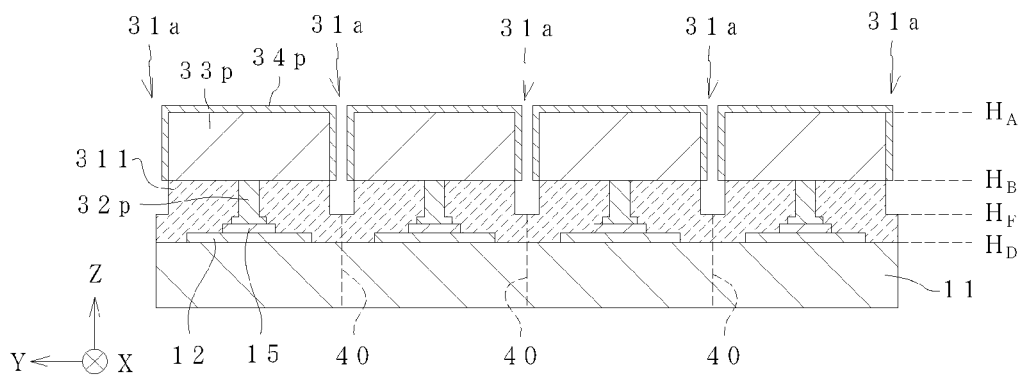

Next, in the disposing electrode for external connection: S309, as shown in FIG. 36A and FIG. 36B, the electrode for n-side external connection 34n and the electrode for p-side external connection 34p are formed on the exposed side surfaces and the upper surfaces of the metal plated layers 33n, 33p. The electrode for n-side external connection 34n and the electrode for p-side external connection 34p can be formed by using an electroless plating method in a similar manner as in the forming electrode for external connection in the first embodiment, so that detailed description will be omitted.

Figure 37A:
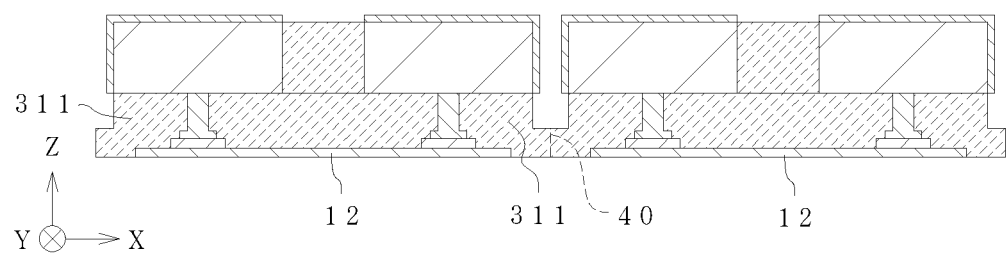
FIG. 37A and FIG. 37B are schematic cross-sectional views corresponding to a portion taken along line A-A of FIG. 30A, each illustrating a part of operations in fabricating light emitting devices according to a third embodiment of the present invention, where
Figure 37B:
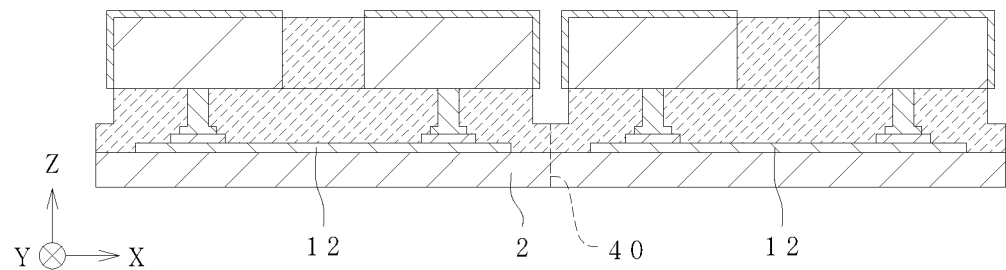

Next, in the removing growth substrate: S310, as shown in FIG. 37A, the growth substrate 11 is removed. Next, in the forming fluorescent material layer (forming wavelength converting layer): S311, a fluorescent material layer 2 is formed on the lower surface side of the semiconductor stacked layer body 12, as shown in FIG. 37B. The removing growth substrate: S310 and the forming fluorescent material layer: S310 can respectively be performed in a similar manner as in the removing growth substrate: S104 and the forming fluorescent material layer: S105 in the first embodiment, do that detailed description will be omitted.

Figure 38A:
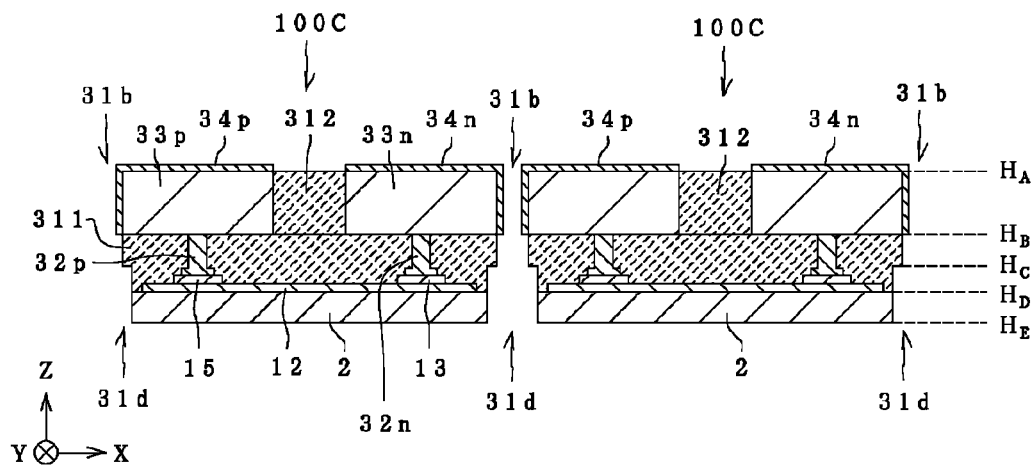
FIG. 38A and FIG. 38B are each a schematic diagram illustrating singulating in a manufacturing operations of a light emitting device according to a third embodiment of the present invention, where
Figure 38B:
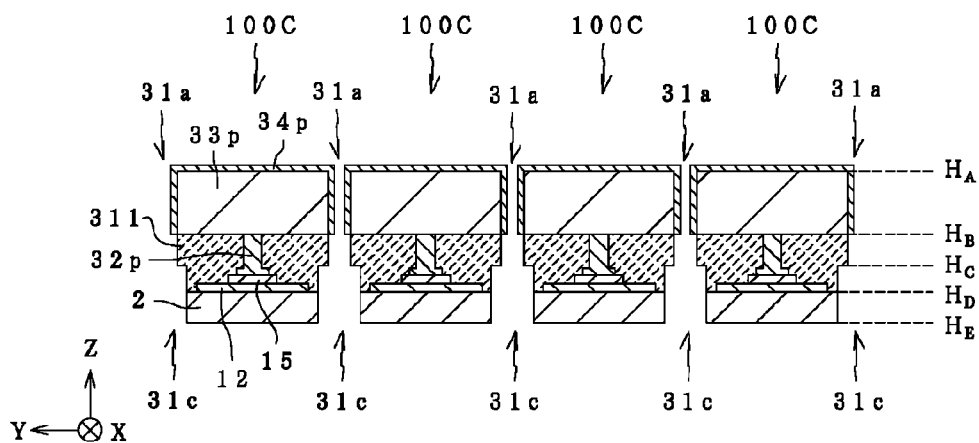

At last, in the singulating: S312, in a similar manner as in the singulating: S211 in the second embodiment, dicing is carried out along the virtual border lines 40 shown by thick broken lines in FIG. 37B etc., the grooves 31c, 31d are formed with a respective depth reaching the lower surface defining the grooves 31a, 31b, as shown in FIG. 38A and FIG. 38B. With this, the light emitting devices 100C are singulated. According to the operations described above, the light emitting device 100C shown in FIGS. 27A, 27B, and FIG. 28A, 28B can be completed.

Variant Example

Next, with reference to FIG. 39, a variant example of providing wiring: S302 will be described.

In the embodiments described above, at the time of providing metal wires 32n, 32p, using a wire bonder 50, the metal wires 32 is arranged between the n-side electrode 13 and the p-side electrode 15. As shown in FIG. 39B, an end portion of the metal wire 32 is fusion bonded to the n-side electrode 39 etc. by ball bonding in which, using the wire bonder 50, an end portion of the metal wire 32 is pressed on the upper surface of the n-side electrode 13 or the like while applying ultrasonic vibrations. At this time, a ball-shaped bump 32a which is larger than the diameter of the metal wire 32 is created at the fusion-bonded portion.

In the present variant example, in place of the metal wire 32, a stacked bump (metal wire bump) 32A which is a stack of bumps 32a as shown in FIG. 39A is used for the internal conductive member. As described above, the stacked bump 32A is formed thicker than the original wire 32. Accordingly, with the use of the stacked bump 32A, the thermal resistance of the internal wiring is reduced compared to the case that employs the metal wire 32, thus, heat dissipation performance of the light emitting device 100 etc., can be improved. In the case where the stacked bump 32A is used for the internal wiring, the stacking number in the stacked bump 32a is not limited to two or more and the stacking number of one can also be employed.

The stacked bump 32A can be made by, using a wire bonder 50, repetitively performing forming a bump 32a and cutting metal wire 32 at upper end of the bump 32a. The stacked bump 32A is formed to have a larger diameter compared to the diameter of the metal wire 32, and to have sufficient rigidity so as not to fall off at the time of forming first resin layer 311 and the like. Thus, wiring in a substantially square shape or a reverse U-shape between two electrodes is not needed. Accordingly, in the present variant example, in the providing wiring, stacked bumps 32A are formed on the upper surface of each n-side electrode 13 etc., with at least a predetermined height (i.e. equal or greater than the thickness of the first resin layer 311 etc., which incorporates the stacked bump 32A at the time of completion of the light emitting device 100C etc.). The subsequent operations of forming the first resin layer S303 and cutting the first resin layer S304 can be performed in a similar manner as in the case where a metal wire 32 is used as the internal wiring.

Further, in the light emitting device 100 of the first embodiment or the light emitting device 100A of a variant example thereof, in place of the metal wires 32, a portion of the internal conductive members arranged in a L-shape or a T-shape may be formed with a stacked bump 32A. For example, the portions of the n-side electrode 13 and the p-side electrode 15 which are the internal conductive members which are extending perpendicularly downward from the respective upper surfaces of the electrodes can be replaced with stacked bumps 32A. Then, with arranging a metal wire 32 between and in an approximately parallel to the upper surfaces of the stacked bumps 32A which are formed in a perpendicular direction, an L-shaped or a T-shaped internal conductive member can be structured.

Other Variant Examples

Three representative embodiments and variant examples of those have been described above as examples of the light emitting device of the invention. Now, other variant examples will be further described below. For example, in the light emitting device 100 and the light emitting device 100A which employ metal wires 32 for the internal conductive members, the electrode for n-side external connection 34n and the electrode for p-side external connection 34p are arranged only on the end surfaces of the metal wires 32 which are exposed at the longitudinal side surface of the resin layer 31, but is not limited thereto. The electrode for n-side external connection 34n and the electrode for p-side external connection 34p may be formed, in addition to the end surfaces of the metal wires 32, extending to a longitudinal surface, a short-side side surface, and the upper surface of the resin layer 31 of the second resin layer 31. Arranging the electrode for n-side external connection 34n and the electrode for p-side external connection 34p respectively in a wider area, extending on the side surfaces and the upper surface of the resin layer 31, even with a small area in the end surfaces of the metal wires, a wide joining area with the mounting substrate can be secured, so that joining reliability and heat dissipation performance can be improved.

The electrode for n-side external connection 34n and the electrode for p-side external connection 34p extending to the side surfaces and the upper surface of the resin layer 31 can be formed in a similar manner as in the forming electrode for external connection: S208 (see FIG. 16) in the second embodiment. In this case, it is not limited to the case of exposing from the longitudinal side surface of the resin layer 31, the end surfaces of the metal wire 32 can be exposed from the side surfaces of the short-side side surfaces and the upper surface of the resin layer 31 to be connected to the electrode for n-side external connection 34n and the electrode for p-side external connection 34p, respectively.

In the light emitting device 100B and the light emitting device 100C, the resin layer 31 which includes the internal conductive members is made with two layers, but it is not limited thereto, the resin layer 31 may be made with three or more layers. Also, the internal conductive members included in each layer can be made by stacking a metal wire, a stacked bump, a metal plated layer, or the like, in an appropriate combination, or with an appropriate order.

Also, in the first embodiment, the removing growth substrate: S104 and the forming fluorescent material layer: S105 may be performed after the disposing electrode for external connection: S107. Also, in the second embodiment, the removing growth substrate: S209 and the forming fluorescent material layer: S210 may be performed before the exposing internal conductive member: S207. Also, in the third embodiment, the removing growth substrate: S310 and the forming fluorescent material layer: S311 may be performed before the exposing internal conductive member: S308.

As described above, the light emitting device 100 according to the embodiments of the present invention can be manufactured in a wafer-level chip-scale package. In the method of manufacturing, the resin layer 31 of the border regions between the light emitting elements 1 are removed by dicing (half-dicing) to create side surfaces which are to be the side surfaces upon being singulated, and also exposing the metals (metal wire, metal plated layer, or the like) which are the internal conductive members on the side surfaces. Then, the electrode for n-side external connection 34n and the electrode for p-side external connection 34p which are the pad electrodes for external connection and are respectively electrically connected to the exposed portions are respectively formed. Accordingly, WCSP which can be used for side-view type mounting can be manufactured in wafer level.

Also, according to the method of manufacturing according to the embodiments of the present invention, the electrode for n-side external connection 34n and the electrode for p-side external connection 34p which are respectively electrically connected to the end surfaces of the internal conductive members can be formed on the side surfaces of the resin layer 31. Accordingly, even in the case of forming the electrode for n-side external connection 34n and the electrode for p-side external connection 34p with using Au, for the internal conductive members, Cu or Al which is less expensive compared to Au can be used for the internal conductive members. Thus, the internal conductive members of a larger volume can be used while suppressing cost. As a result, the light emitting device can achieve good heat dissipation performance.

Mounting of Light Emitting Device

With reference to FIGS. 40A, 40B and FIGS. 41A and 41B, mounting of a light emitting device according to an embodiment of the present invention will be described. The light emitting device 100C according to the third embodiment will be illustrated below, but the light emitting devices of other embodiments can also be used in a similar manner. In the description below, a coordinate system based on the light emitting device 100C will be employed. In the coordinate system, in the light emitting element 1, the opposite surface (surface provide with a fluorescent material layer 2) from the surface disposed with the support member 3C is the light extracting surface and light is mainly emitted in a direction perpendicular to the surface (−Z axis direction in the figure).

Side-View-Type Mounting

Figure 40B:
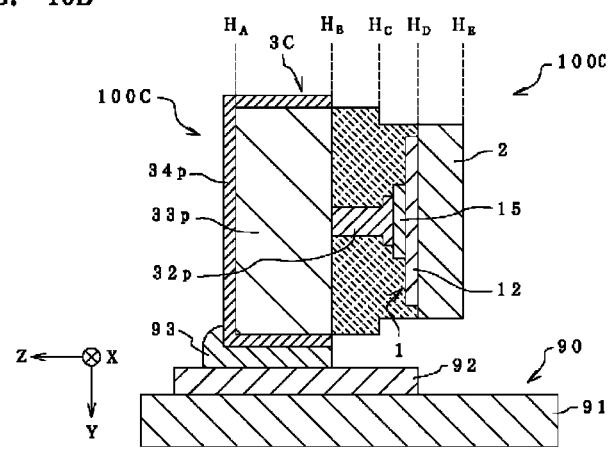

First, with reference to FIGS. 40A, 40B, mounting of the light emitting device 100c on the mounting substrate 90 in a side-view type configuration will be described. As shown in FIG. 40A and FIG. 40B, the mounting substrate 90 includes a substrate 91 and a conductive pattern 92 and the surface provided with the conductive pattern serves as the mounting surface. The light emitting device 100C is mounted with joining the electrode for n-side external connection 34n and the electrode for p-side external connection 34p of the light emitting device 100C with the conductive pattern 92 by using a conductive adhesive material 93 such as a solder.

In the case of mounting the light emitting device 100 in a side-view configuration, the emitting direction of light from the light emitting device 100C is adjusted substantially in parallel to the mounting surface of the mounting substrate. In the example shown in FIGS. 40A, 40B, the light emitting device 100C is mounted using one longitudinal side surface as the mounting surface, in which the electrode for n-side external connection 34n and the electrode for p-side external connection 34p which are disposed on the side surface are joined to respective conductive patterns of corresponding polarities, with the use of an adhesive material 63.

Also, in the light emitting device 100C, the electrode for n-side external connection 34n and the electrode for p-side external connection 34p are formed, in addition to on the longitudinal side surfaces, on the short-side side surfaces (the left-side surface and the right-side surface in FIG. 40A) and the upper surface (the left-side surface in FIG. 40B), so that the adhesive material 93 is creeping onto those surfaces. With this arrangement, the light emitting device 100C can be joined to the mounting substrate 90 with high strength. Improvement in the joining strength obtained by creeping of the adhesive material 93 can also be observed in the light emitting device 100B according to the second embodiment.

Also, in the light emitting device 100C, a step difference is formed so that a lower portion (right side in FIG. 40B) than the position HC in the height direction (the Z-axis direction: in a lateral direction in FIG. 40B) is located at an inner side than the upper portion, so that a reduction in adhesion due to generation of a gap between the electrode for n-side external connection 34n, the electrode for p-side external connection 34p and the wiring pattern 92 caused by the lower portion acting as an obstacle at the time of mounting, can be suppressed. With this arrangement, the light emitting device 100C can be mounted on the mounting substrate 90 with high reliability. The improvement in the reliability in mounting obtained by forming a step difference on the mounting surface of the light emitting device can be achieved as well in the light emitting device 100, the light emitting device 100A, and the light emitting device 100B which are according to other embodiments.

Top-View-Type Mounting

Figure 41A:
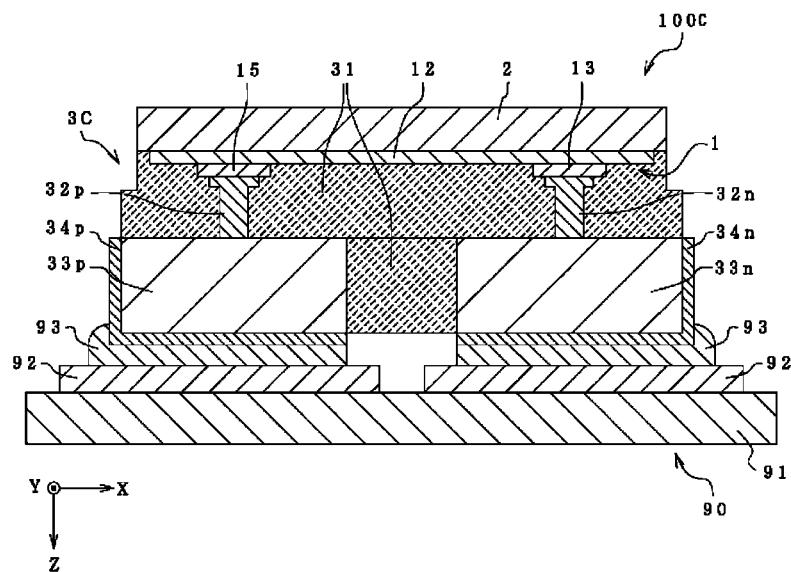
Figure 41B:
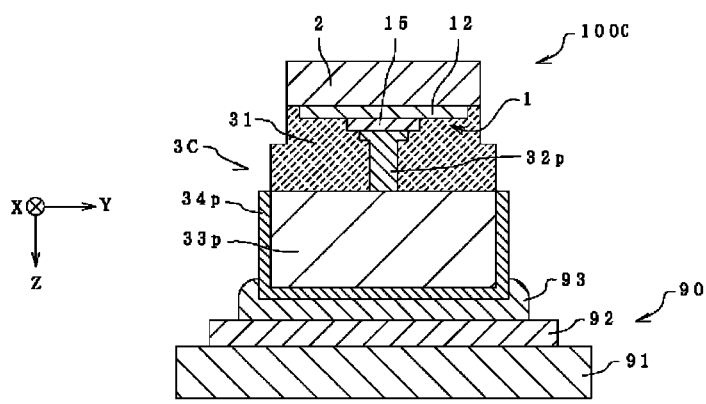

Next, with reference to FIGS. 41A, 41B, mounting of the light emitting device 100C on the mounting substrate 90 in top-view type configuration will be described. In the case of mounting the light emitting device 100 in a top-view configuration, the emitting direction of light from the light emitting device 100C is adjusted substantially perpendicular to the mounting surface of the mounting substrate. In the example shown in FIGS. 41A, 41B, the light emitting device 100C is mounted using the upper surface as the mounting surface, connecting the electrode for n-side external connection 34n and the electrode for p-side external connection 34p which are disposed extended on the upper surface with the conductive patterns 92 of corresponding polarities with the use of an adhesive material 93.

As described above, as in the light emitting device 100C and the light emitting device 100B according to the second embodiment, providing the electrode for n-side external connection 34n and the electrode for p-side external connection 34p in addition to on the longitudinal side surface, also extending onto the upper surface enables not only in a side-view type mounting but also in a top-view mounting.

The light emitting device 100 according to the first embodiment and the light emitting device 100A according to a variant example thereof also can be configured to allow a top-view type mounting, by disposing the electrode for n-side external connection 34n and the electrode for p-side external connection 34p extending onto the upper surface of the resin layer 31.

As shown in the above descriptions, a light emitting device and a method of manufacturing the semiconductor light emitting device in accordance with the representative embodiments has been described herein, but the scope of the invention is not limited to the above description, and should be widely understood based on the scope of claim for patent. Further, based on the above description, it will be obvious that various changes and modifications can be made therein without departing from the scope of the invention.

What is claimed is:

1. A method of manufacturing a light emitting device having a semiconductor light emitting element comprising a semiconductor stacked layer body including a stack of a p-type semiconductor layer, and an n-type semiconductor layer; a p-side electrode electrically connected to the p-type semiconductor layer; and an n-side electrode electrically connected to the n-type semiconductor layer, the p-side electrode and the n-side electrode being disposed on a first side of the semiconductor stacked layer body, the method comprising:
    preparing a wafer having a plurality of semiconductor light emitting elements disposed on a growth substrate in at least one array;
    forming a resin layer embedding a p-side internal conductive member connected to the p-side electrode and an n-side internal conductive member connected to the n-side electrode on a surface of the first side of the semiconductor stacked layer body;
    exposing an internal conductive member, in a boundary region between the plurality of semiconductor light emitting elements, and removing at least a part of the resin layer with the p-side internal conductive member and the n-side internal conductive member respectively present in a range of the resin layer to be removed, in a thickness direction from an upper surface of the resin layer, to expose the p-side internal conductive member and the n-side internal conductive member;
    forming an electrode for p-side external connection electrically connected to the exposed portion of the p-side internal conductive member, and forming an electrode for n-side external connection electrically connected to the exposed portion of the n-side internal conductive member; and
    singulating the wafer into a plurality of singulated semiconductor light emitting elements.

2. The method of manufacturing a light emitting device according to claim 1, further comprising removing the growth substrate after forming the resin layer.

3. The method of manufacturing a light emitting device according to claim 1, wherein the p-side internal conductive member and the n-side internal conductive member are metal wires.

4. The method of manufacturing a light emitting device according to claim 1, further comprising, after preparing the wafer, forming a wavelength converting layer on a surface of a second side of the semiconductor stacked layer body, the wavelength converting layer being configured to convert a wavelength of light emitted from the light emitting element into a different wavelength of light.

5. The method of manufacturing a light emitting device according to claim 2, further comprising, after removing the growth substrate, forming a wavelength converting layer on a surface of a second side of the semiconductor stacked layer body, the wavelength converting layer being configured to convert a wavelength of light emitted from the light emitting element into a different wavelength of light.

6. The method of manufacturing a light emitting device according to claim 1, wherein in the step of singulating, in each of the boundary regions between the plurality of semiconductor light emitting elements, at least a portion of at least one of the semiconductor stacked layer body and the resin layer is removed from a second side of the semiconductor stacked layer body in a depth direction to reach the region removed in the step of exposing the internal conductive member, and
    a width of the region removed in the step of singulating is greater than a width removed in the step of exposing the internal conductive member.

7. The method of manufacturing a light emitting device according to claim 3, wherein in the step of singulating, in each of the boundary regions between the plurality of semiconductor light emitting elements, at least a portion of at least one of the semiconductor stacked layer body and the resin layer is removed from a second side of the semiconductor stacked layer body in a depth direction to reach the region removed in the step of exposing the internal conductive member, and
    a width of the region removed in the step of singulating is greater than a width removed in the step of exposing internal conductive member.

8. The method of manufacturing a light emitting device according to claim 1, wherein in the step of singulating, in each of the boundary regions between the plurality of semiconductor light emitting elements, at least a portion of at least one of the semiconductor stacked layer body and the resin layer is removed from a second side of the semiconductor stacked layer body in a depth direction to reach the region removed in the step of exposing internal conductive member, and
    a width of the region removed in the step of singulating is smaller than a width removed in the step of exposing internal conductive member.

9. The method of manufacturing a light emitting device according to claim 3, wherein in the step of singulating, in each of the boundary regions between the plurality of semiconductor light emitting elements, at least a portion of at least one of the semiconductor stacked layer body and the resin layer is removed from a second side of the semiconductor stacked layer body in a depth direction to reach the region removed in the step of exposing internal conductive member, and
    a width of the region removed in the step of singulating is smaller than a width removed in the step of exposing internal conductive member.

10. The method of manufacturing a light emitting device according to claim 1, wherein, in the step of forming the electrodes for external connection, the electrode for p-side external connection and the electrode for n-side external connection are formed by using an electroless plating technique in which at least one metal layer is disposed on an exposed surface of the p-side internal conductive member and the n-side internal conductive member.

11. The method of manufacturing a light emitting device according to claim 1, wherein the step of forming the electrodes for external connection comprises:
forming a mask covering a surface of the resin layer except for an exposed portion of the p-side internal conductive member and an exposed portion of the n-side internal conductive member of each of the semiconductor light emitting elements;
forming a metal layer by sputtering on a surface including the exposed surfaces of the internal conductive members; and
patterning the metal layer formed by the sputtering by removing the mask to form the p-side electrode for external connection and the n-side electrode for external connection.

12. The method of manufacturing a light emitting device according to claim 11, wherein, in the forming of the electrode for external connection, after removing the mask, using an electroless plating, further stacking a metal layer on the metal layer formed by the sputtering to form the electrode for p-side external connection and the electrode for n-side external connection.

13. The method of manufacturing a light emitting device according to claim 1, wherein the internal conductive members are made of Cu, Al, or an alloy whose main component is one or more of those metals, and wherein at least outermost layers of the electrode for p-side external connection and the electrode for n-side external connection are made of Au or an alloy whose main component is Au.

14. A light emitting device comprising:
a semiconductor light emitting element comprising:
a semiconductor stacked layer body having a first side and an opposing second side, the semiconductor stacked layer body including a stack of a p-type semiconductor layer, and an n-type semiconductor layer,
a p-side electrode electrically connected to the p-type semiconductor layer, and
an n-side electrode electrically connected to the n-type semiconductor layer,
wherein the p-side electrode and the n-side electrode are disposed on the first side of the semiconductor stacked layer body; and
a support member having a resin layer disposed on the first side of the semiconductor stacked layer body, wherein the resin layer does not extend past the second side of the semiconductor stacked layer body in a direction from the first side of the semiconductor stacked layer body toward the second side of the semiconductor stacked layer body;
wherein the support member has an electrode for p-side external connection and an electrode for n-side external connection disposed on one of its side surfaces, and a p-side internal conductive member electrically connecting the p-side electrode and the electrode for p-side external connection and an n-side internal conductive member electrically connecting the n-side electrode and the electrode for n-side external connection in the resin layer,
wherein, at the side surface on which the electrode for p-side external connection and the electrode for n-side external connection are disposed, (i) a surface which includes an end portion of a side where the semiconductor light emitting element is disposed, and (ii) a surface formed with the electrode for p-side external connection or the electrode for n-side external connection, are not co-planar with each other, and
wherein a surface that includes an end portion of a side where the semiconductor light emitting element is located is positioned inward of a surface formed with the electrode for p-side external connection or the electrode for n-side external connection.

15. The light emitting device according to claim 14, wherein the p-side internal conductive member and the n-side internal conductive member are metal wires.

16. The light emitting device according to claim 15, wherein a surface which includes an end portion of a side where the semiconductor light emitting element is located is positioned inward of a surface formed with the electrode for p-side external connection or the electrode for n-side external connection.

17. The light emitting device according to claim 14, wherein a surface which includes an end portion of a side where the semiconductor light emitting element is located is positioned outward of a surface formed with the electrode for p-side external connection or the electrode for n-side external connection.

18. The light emitting device according to claim 15, wherein a surface which includes an end portion of a side where the semiconductor light emitting element is located is positioned outward of a surface formed with the electrode for p-side external connection or the electrode for n-side external connection.

19. The light emitting device according to claim 14 further comprising a wavelength converting layer disposed on a surface of the second side of the semiconductor stacked layer body, the wavelength converting layer being configured to convert light of a wavelength emitted from the semiconductor light emitting element to light of a different wavelength.

20. The light emitting device according to claim 14, wherein the internal conductive members are made of Cu, Al, or an alloy whose main component is one or more of those metals, and at least outermost surfaces of the electrode for p-side external connection and the electrode for n-side external connection are made of Au or an alloy whose main component is Au.

* * * * *